US008057869B2

(12) United States Patent  
Hokazono et al.

(10) Patent No.: US 8,057,869 B2
(45) Date of Patent: Nov. 15, 2011

(54) PLASTIC FILM, GAS BARRIER FILM, AND IMAGE DISPLAY DEVICE USING THE SAME

(75) Inventors: Hirohisa Hokazono, Minami-ashigara (JP); Yasuo Mukunoki, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 808 days.

(21) Appl. No.: 11/385,898

(22) Filed: Mar. 22, 2006

(65) Prior Publication Data

US 2006/0232735 A1 Oct. 19, 2006

(30) Foreign Application Priority Data

Mar. 24, 2005 (JP) ................................ 2005-085902

(51) Int. Cl.
*C09K 19/00* (2006.01)

(52) U.S. Cl. ......... 428/1.26; 428/1.1; 428/1.6; 428/421; 428/480; 349/56; 349/158; 525/437

(58) Field of Classification Search .................. None
See application file for complete search history.

(56) References Cited

U.S. PATENT DOCUMENTS

| 3,096,879 | A | * | 7/1963 | Schumacher | 206/523 |
|---|---|---|---|---|---|
| 3,344,973 | A | * | 10/1967 | Studen | 206/523 |
| 5,770,301 | A | * | 6/1998 | Murai et al. | 428/213 |
| 5,853,862 | A | * | 12/1998 | Murai et al. | 428/215 |
| 6,136,444 | A | * | 10/2000 | Kon et al. | 428/423.1 |
| 6,322,860 | B1 | * | 11/2001 | Stein et al. | 428/1.26 |
| 6,432,516 | B1 | * | 8/2002 | Terasaki et al. | 428/195.1 |
| 6,905,769 | B2 | * | 6/2005 | Komada | 428/421 |
| 2005/0203257 | A1 | * | 9/2005 | Uchida et al. | 525/437 |
| 2006/0093758 | A1 | * | 5/2006 | Sakakura et al. | 428/1.6 |

FOREIGN PATENT DOCUMENTS

| EP | 1205772 A2 | * | 5/2002 |
|---|---|---|---|
| JP | 58-162817 A | | 12/1981 |
| JP | 10-58514 A | | 3/1998 |
| JP | 2000-317960 A | | 11/2000 |
| JP | 2002-145998 A | | 5/2002 |
| JP | 2002-303853 A | | 10/2002 |
| JP | 2002-363119 A | | 12/2002 |
| JP | 2003-103540 A | | 4/2003 |
| JP | 2003-154596 A | | 6/2003 |
| JP | 2003-200444 A | | 7/2003 |
| WO | WO 2004/090585 A1 | | 10/2004 |

OTHER PUBLICATIONS

Japanese Office Action dated May 18, 2010 issued in corresponding Japanese Patent Application No. 2005-085902 (English translation attached).

* cited by examiner

*Primary Examiner* — Bruce H Hess
*Assistant Examiner* — Tamra L Amakwe
(74) *Attorney, Agent, or Firm* — Birch, Stewart, Kolasch & Birch, LLP

(57) ABSTRACT

A plastic film comprising a multi-layer structure obtained by co-casting film formation or sequential-casting film formation of two or more layers of polyarylate having a glass transition temperature of 250° C. or higher and having a chemical structure represented by the following formula:

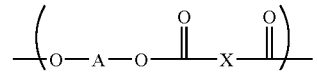

wherein X represents a linking group having a naphthalene or biphenyl structure and A is represented by the following formula:

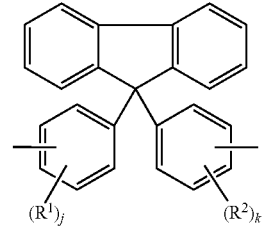

wherein $R^1$ and $R^2$ represent an alkyl group or aryl group, j and k are an integer of from 0 to 4.

16 Claims, 2 Drawing Sheets

PLASTIC FILM, GAS BARRIER FILM, AND IMAGE DISPLAY DEVICE USING THE SAME

BACKGROUND OF THE INVENTION

1. Field of the Invention

The present invention relates to a heat resistant plastic film and a gas barrier film having super high gas barrier property using the heat resistant plastic film as a substrate. More specifically, it relates to a gas barrier film suitable to substrates for various kinds of devices and coating of the substrate and having super gas barrier property. Further, the invention also relates to an image display device excellent in durability and flexibility obtained by using the gas barrier film, particularly, an organic electroluminescence device (referred to hereinafter as organic EL device).

2. Description of the Related Art

Gas barrier films in which thin films of metal oxides such as aluminum oxides, magnesium oxides, and silicon oxides are formed on the surfaces of plastic substrates or films have been generally used so far for packaging of articles requiring shielding from steams or various gases such as oxygen, or packaging application for preventing denaturation of foodstuffs, industrial products, and medicines. Further, the gas barrier films have also been started for use in substrates of liquid crystal display devices, solar cells or EL devices in addition to the packaging use. Particularly, in transparent substrates which have been applied progressively to liquid crystal display devices, EL devices, etc., high level of demands such as long time reliability, high degree of freedom in view of shape, and capability of display on a curved surface have been required in addition to the demand for reduction in the weight and increase in the size in recent years, and film substrates such as made of transparent plastics have been started for use instead of glass substrates, which are heavy, tend to be cracked and are difficult in increasing the area. Further, since the plastic substrates not only can cope with the requirements described above but also can be applied to the roll-to-roll system, they are advantageous over glass materials in view of the productivity and the reduction of cost.

However, film substrates such as of transparent plastics involve a problem of poor gas barrier property in comparison with glass. Since steam or air permeates in a case of using a substrate of poor gas barrier property, when it is used, for example, to a liquid crystal display device, liquid crystals in a liquid crystal cell are deteriorated and deteriorated portions result in display defects to deteriorate the display quality. For solving such problems, it has been known to form a thin film of a metal oxide on the film substrate to obtain a gas barrier film substrate. As gas barrier films used for packaging materials and liquid crystal display devices, those formed by vapor depositing silicon oxide on a plastic film (for example, in JP-B No. 53-12953 and those formed by vapor depositing aluminum oxide (for example, in JP-A No. 58-217344) are known and they have a steam barrier property of about 1 $g/m^2/day$.

However, highly barrier performance has been demanded recently for the film substrate along with increase in the size of liquid crystal displays or development for highly fine displays. Further, most recently, development has been progressed, for example, in organic EL displays or highly fine color liquid crystal displays requiring further higher barrier property and it has been demanded for a substrate having a performance of higher barrier property, particularly, a steam barrier property of less than 0.1 $g/m^2/day$ while maintaining transparency usable therein. For coping with such a demand, film formation by way of a sputtering method or a CVD method of forming a thin film using plasmas generated by glow discharge under low pressure conditions has been studied as means capable of expecting highly barrier performance. Further, it has been also proposed a technique of preparing a barrier film having an alternate laminate structure of organic layer/inorganic layer by a vacuum vapor deposition method (for example, refer to U.S. Pat. No. 6,413,645 and "Thin Solid films" written by Affinito, et al., (1996), p. 290 to p 291.

However, in the thin film forming methods described above, since organic materials jetted out as vapors at high temperature are condensed to form thin membranes on the film, the film is temporarily heated to partially cause deformation thereby mating the subsequent lamination step not uniform to result in a problem that no sufficient barrier performance can be obtained. In addition, since a thin layer structure is necessary in order to obtain a compatibility with the flexibility, this also gives rise to a problem that the barrier performance is impaired even when obstacles are present even in a small amount.

It has also been proposed a technique of improving the surface shape of the film substrate thereby obtaining high barrier performance. However, in a case of actually using the thus barrier film described above applying a treatment at high temperature at least of 250° C. or higher such as for forming TFT, the barrier performance of the film is deteriorated by the deformation of the substrate (JP-A Nos. 2002-225169 and 2003-154596).

SUMMARY OF THE INVENTION

In a case where an image display device such as an organic EL device can be designed using a plastic substrate, the weight can be reduced remarkably than existent products using glass substrate. However, this results in a problem that the device is degraded inevitably due to the permeation of gases as described above. Accordingly, it has been demanded for the development of a technique capable of making the durability and the weight reduction of the device compatible.

In view of the above, the object of the present invention is to provide a flexible gas barrier film having sufficient barrier performance and heat resistance. Further, another object of the invention is to efficiently provide a plastic film excellent in heat resistance and surface smoothness which is useful as a substrate for the gas barrier film. Still another object of the invention is to provide an image display device capable of making the durability and the weight reduction compatible.

The present inventor has made various studies on the cause of deteriorating the barrier performance of existent gas barrier films and, as a result, has found that this is mainly attributable to defects of a barrier layer caused by insufficiency of the surface smoothness of a plastic substrate upon forming a thin film and that deformation of the plastic substrate due to the insufficiency of the heat resistance is also one of major factors in a case of applying a high temperature treatment of at least 250° C. to the gas barrier film such as in the case of forming TFT. However, as the smoothness on both surfaces of the plastic substrate is improved, this results in another problem that the handlability in the form of a roll is worsened due to creaking and when it is handled forcively, scratches are caused to worsen the barrier property. In view of the above, the problem has been overcome in the invention by making one of the surfaces of a plastic substrate used for manufacture of the gas barrier film as a smooth layer and making the other surface as a sliding layer and/or matt layer. Further, the present inventor has found that the plastic substrate can be prepared efficiently by co-casting of plural layers or sequential casting of plural layers. Based on the result of such study, the present inventor has found that the gas barrier film of the invention having the following constitution can suppress occurrence of defects of a thin film formed on the plastic substrate and prevent impairment of the barrier property.

(1) A plastic film comprising a multi-layer structure consisting of two or more layers, wherein the structure is obtained by co-casting film formation or sequential-casting film formation of two or more layers of polyarylate having a glass transition temperature of 250° C. or higher and having a chemical structure represented by the formula (1):

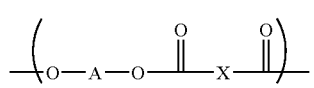

Formula (1)

wherein X represents a linking group having a naphthalene or biphenyl structure represented by the following chemical structure and A represents a linking group represented by the formula (2):

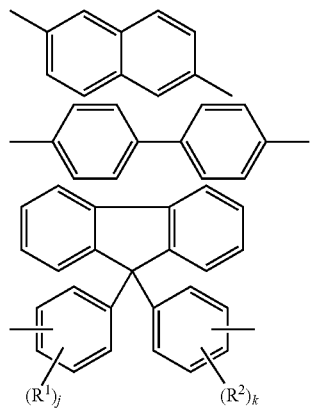

Formula (2)

wherein $R^1$ and $R^2$ each represents independently an alkyl group or aryl group, j and k each represents independently an integer of from 0 to 4, $R^1$ may be identical or different with each other when j is 2 or greater and $R^2$ may be identical or different with each other when k is 2 or greater.

(2) A plastic film as described in (1) above, wherein the layer constituting at least one of the surfaces of the plastic film is a surface smoothed layer at a thickness of from 1 to 50 μm in which a protrusion with a height of 0.2 μm or more is not present on the surface of the layer.

(3) A plastic film as described in (1) or (2) above, wherein the layer constituting at least one of the surfaces of the plastic film is a sliding layer at a thickness of from 1 to 50 μm.

(4) A plastic film as described in (1) above, wherein plastic film has a multi-layer structure consisting of three or more layers, a layer constituting at least one of the surfaces of the plastic film is a surface smoothed layer at a thickness of from 1 to 50 μm and the layer constituting the other of the surfaces of the plastic film is a sliding layer at a thickness of from 1 to 50 μm.

(5) A gas barrier film having at least one barrier layer comprising an inorganic material on a substrate comprising a plastic film described in any one of (1) to (4).

(6) A gas barrier film having at least one barrier layer comprising an inorganic material and at least one organic layer alternately on a substrate comprising a plastic film described in any one of (1) to (4).

(7) An organic electroluminescence device using a gas barrier film described in (5) or (6) as a substrate.

(8) An image display device using a gas barrier film described in (5) or (6).

Since the plastic film of the invention has favorable surface smoothness, gas barrier property is not deteriorated by the occurrence of defects in a case where a barrier thin film is formed using the plastic film as a substrate. Further, since the plastic film of the invention is excellent in the heat resistance, it does not impair the gas barrier property by occurrence of deformation even in a case of forming the barrier thin film by vacuum vapor deposition. Further, the plastic film of the invention can be manufactured efficiently by co-casting of plural layers or sequential casting of plural layers.

The gas barrier film of the invention has sufficient barrier performance and heat resistance and also has flexibility and can be used as a gas barrier substrate for various kinds of image display devices.

The image display device of the invention has high fineness and high durability. Particularly, this is useful as a liquid crystal display device, an organic EL device, etc.

BEST MODE FOR CARRYING OUT THE INVENTION

Figure 1:
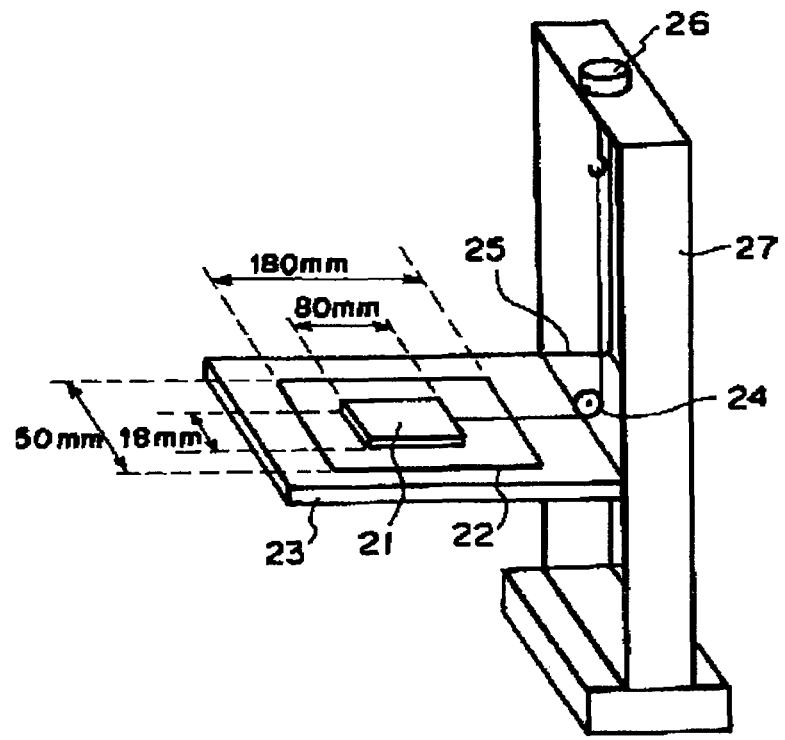
FIG. 1 is a schematic view of a creak measuring apparatus.
Figure 1:
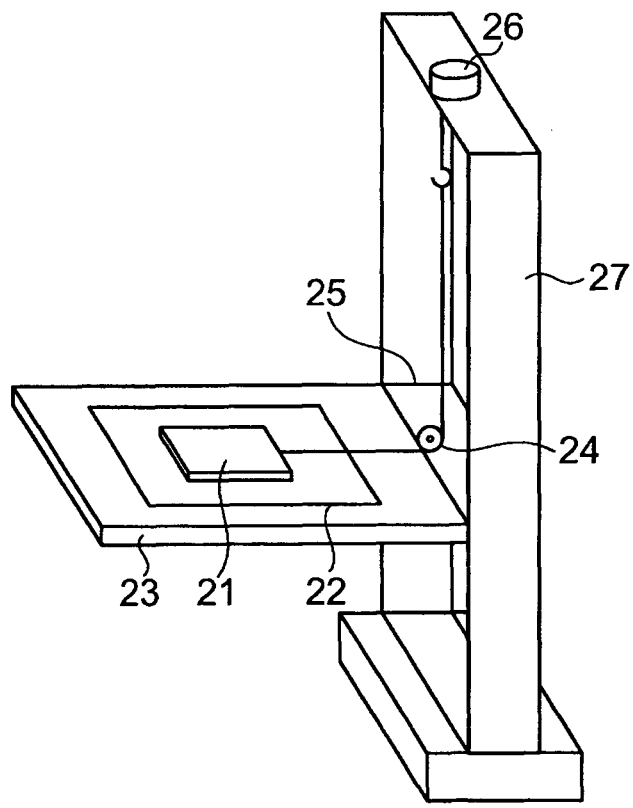
Figure 2:
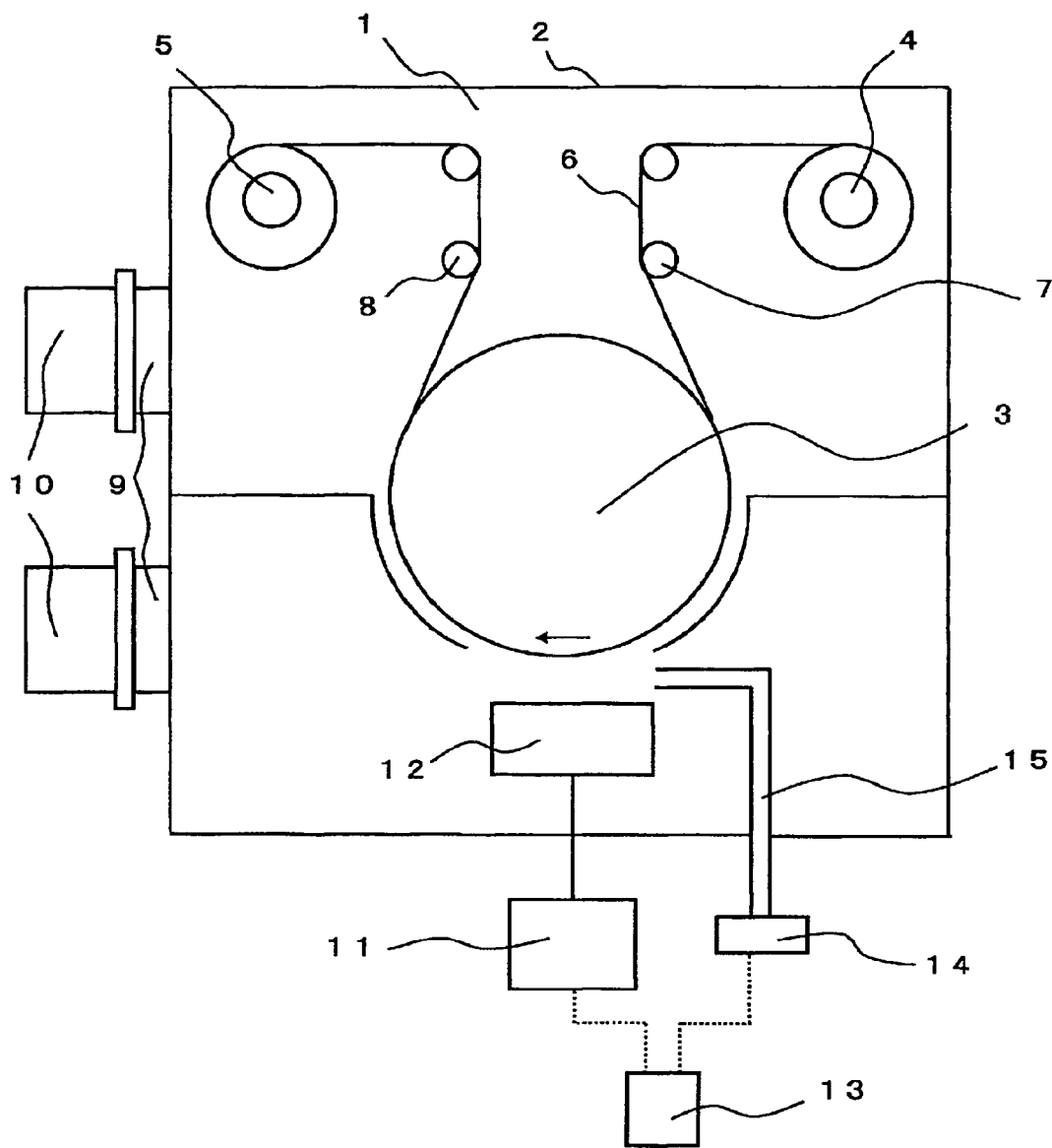
FIG. 2 is an explanatory view showing a sputtering apparatus used in examples.

A plastic film, a gas barrier film and an image display device of the invention are to be described specifically. Explanation for the constituent factors to be described later are sometimes based on typical embodiments of the invention but the invention is not restricted to such embodiments. In the specification, ranges for numeral values represented by "to" means ranges including numeral values described before and after "to" as the lower limit value and the upper limit value respectively.

According to the invention, for providing functional layers on the surface and/or back surface of a plastic film used as a substrate, the plastic film is formed by co-casting of plural layers or sequential casting of plural layers. Then, descriptions are to be made for the solution and the method used for film formation. In the following description, a solution used upon forming a plastic film is referred to as a dope.

(Solvent)

The plastic film of the invention is formed by casting a solution in which a plastic as a material is dissolved in an organic solvent. The organic solvent used for forming the plastic film of the invention by casting may be a halogenated organic solvent or a non-halogenated organic solvent. The halogenated organic solvent used preferably is to be described at first. The halogenated organic solvent used as a main solvent in the invention is preferably a halogenated hydrocarbon of 1 to 7 carbon atoms, preferably, dichloromethane and chloroform. Dichloromethane is particularly preferred. Further, mixing of other organic solvents than the chloro-organic solvent causes no particular problem.

In this case, it is necessary to use dichloromethane by at least 50 mass % or more and, preferably, from 70 mass % to 100 mass %. Further, the solvent used in combination with the chloro-organic solvent is, preferably, alcohol or ketone organic solvent or ester organic solvent. The alcohol may be linear, branched and cyclic alcohol and, among them, a saturated aliphatic hydrocarbon alcohol is preferred. The hydroxyl group of the alcohol may be any of primary to tertiary groups and example of the alcohol include methanol, ethanol, 1-propanol, 2-propanol, 1-butanol, 2-butanol, tert-butanol, 1-pentanol, 2-methyl-2-butanol, and cyclohexanol.

As the alcohol, a fluoro alcohol may also be used which includes, for example, 2-fluoro-ethanol, 2,2,2-trifluoro-ethanol, and 2,2,3,3-tetrafluoro-1-propanol. Further, the hydrocarbon may be linear, branched, or cyclic. In this case, either the aromatic hydrocarbon or the aliphatic hydrocarbon may be used. The aliphatic hydrocarbon may be saturated or not saturated. Examples of the hydrocarbon include cyclohexane, hexane, benzene, toluene, and xylene. Further, methyl acetate, ethyl acetate, methyl formate, ethyl formate, acetone, dioxolane, dioxane, ketones of 4 to 7 carbon atoms or aceto acetate ester are also preferred. The preferred non-chloro organic solvent used together is methyl acetate, acetone, methyl formate, ethyl formate, methyl ethyl ketone, cyclopentanone, cyclohexanone, methyl acetyl acetate, methanol, ethanol, 1-propanol, 2-propanol, 1-butanol, 2-butanol, and cyclohexanol, cyclohexane, and hexane. Other organic solvent used together than the halogenated organic solvent described above is used in an amount of 50 mass % or less, preferably, from 40 to 0 mass % and, more preferably, from 30 to 5 mass %.

Preferred solvent composition comprising the chloro-organic solvent as a main solvent can include the following specific examples but the solvent composition usable in the invention is not restricted to them (numericals in the parenthesis means mass parts in the following description).
(MC-1) dichloromethane (100)
(MC-2) dichloromethane/methanol (95/5)
(MC-3) dichloromethane/acetone (95/5)
(MC-4) dichloromethane/butanol (98/2)
(MC-5) dichloromethane/methyl ethyl ketone/butanol (90/8/2)
(MC-6) dichloromethane/cyclopentanone (90/10)
(MC-7) dichloromethane/methyl acetate (95/5)
(MC-8) dichloromethane/acetone/ethyl acetate (85/10/5)

Then, the non-halogenated organic solvent used for the casting film formation in the invention is to be described. A preferred non-halogenated organic solvent is preferably selected from the group consisting of esters, ketones, ethers, and amides of 3 to 12 carbon atoms. The ester, ketone, ether, and amide may have a cyclic structure. Compounds having two or more of functional groups of ester, ketone, ether and amide (that is —O—, —CO— and —COO—) may also be used as the main solvent and they may have other functional group, for example, an alcoholic hydroxyl group. In a case of a main solvent having two or more kinds of functional groups, the number of carbon atoms thereof may be within the range defined for the compound having one of the functional groups.

Examples of the esters of 3 to 12 carbon atoms include ethyl formate, propyl formate, pentyl formate, methyl acetate, ethyl acetate, and pentyl acetate. Examples of the ketones of 3 to 12 carbon atoms include acetone, methyl ethyl ketone, diethyl ketone, diisobutyl ketone, cyclopehtanone, cyclohexanone, and methyl cyclohexanone. Examples of the ethers of 3 to 12 carbon atoms include diisopropyl ether, dimethoxy methane, dimethoxy ethane, 1,4-dioxane, 1,3-dioxolane, tetrahydrofuran, anisole, and penetole. Examples of the organic solvent having two or more kinds of functional groups include 2-ethoxyethyl acetate, 2-methoxy ethanol, and 2-butoxy ethanol. Examples of the amides of 3 to 12 carbon atoms include N-methyl acetoamide, N-methyl pyrrolidone, acetoamide, dimethyl acetoamide, and dimethyl sulfone amide.

Preferred non-halogen solvent in the invention is at least one member selected from the group consisting of dichloro methane, methyl acetate, ethyl acetate, methyl formate, ethyl formate, acetone, dioxolane, and dioxane or a liquid mixture thereof and, more preferably, methyl acetate, acetone, methyl formate, ethyl formate and a mixture thereof.

Specific examples of preferred combination of the solvents in the invention include the followings. Numerical value in each parenthesis shows the mass ratio for each ingredient.
(SL-1) methyl acetate (100)
(SL-2) methyl acetate/acetone (95/5)
(SL-3) methyl acetate/cyclopentanone/butanol (90/5/5)
(SL-4) acetone/methyl acetoacetate (95/5)
(SL-5) acetone/butanol (95/5)

Among them, a mixed solvent of methyl acetate/acetone is particularly preferred.

In addition to the organic solvents described above, dichloro methane may also be used in the dope used for the invention by the content of 10 mass % or less based on the entire amount of the organic solvent of the invention for improving the transparency of the film or promoting the dissolution property.

(Additive)

In the solution for casting film formation in the invention, various additives (for example, plasticizer, UV-ray inhibitor, anti-aging agent, fine particles, and optical characteristic controller) may be added in each of the preparation steps depending on the use. Referring to the timing for addition, the additives may be added at any of the dope preparation steps, or a step in which additives are added and preparatin is conducted may be combined to the final preparation step of the dope preparation step.

For the plasticizer added preferably, phosphate esters or carboxylate esters are used. Examples of the phosphate esters include triphenyl phosphate (TPP) and tricresyl phosphate (TCP), cresyl phenyl phosphate, octyl diphenyl phosphate, diphenyl biphenyl phosphate, trioctyl phosphate, and tributyl phosphate.

Typical carboxylate esters are phthalate esters and citrate esters. Examples of the phthalate esters include dimethyl phthalate (DMP), diethyl phthalate (DEP), dibutyl phthalate (DBP), dioctyl phthalate (DOP), diphenyl phthalate (DPP), and diethyl hexyl phthalate (DEHP). Examples of the citrate esters include triethyl O-acetyl citrate (OACTE), tributyl O-acetyl citrate (OACTB), acetyl triethyl citrate, and acetyl tributyl citrate.

Examples of other carboxylate esters include butyl oleate, methyl acetyl ricinolate, dibutyl sebacate, and various trimellitate esters. Examples of the glycolate esters include triacetin, tributyrin, tributyl phthalyl butyl glycolate, ethyl phthalyl ethyl glycolate, methyl phthalyl ethyl glycolate, and butyl phthalyl butyl glycol. Further, trimethylol propane tribenzoate, pentaerythritol tetrabenzoate, ditrimethylol propane tetraacetate, ditrimethylol propane tetrapropionate, pentaerythritol tetraacetate, sorbitol hexaacetate, sorbitol hexaprpionate, sorbitol tripropionate, inositol pentaacetate, sorbitan tetrabutyrate, etc. can also be used preferably.

Among all, triphenyl phosphate, tricresyl phosphate, cresyl diphenyl phosphate, tributyl phosphate, dimethyl phthalate, diethyl phthalate, dibutyl phthalate, dioctyl phthalate, diethylhexyl phthalate, triacetin, ethyl phthalyl ethyl glycolate, trimethylol propane tribenzoate, pentaerythritol tetrabenzoate, ditrimethylol propane tetraacetate, pentaerythritol tetraacetate, sorbitol hexaacetate, sorbitol hexapropionate, sorbitol triacetate tripripionate, etc. are preferred. Particularly, triphenyl phosphate, diethyl phthalate, ethyl phthalyl ethyl glycolate, trimethylolpropane tribenzoate, pentaerythritol tetrabenzoate, ditrimethylolpropane tetracetate, sorbitol hexaacetate, sorbitol hexapropionate, and sorbitol triacetate tripropionate are preferred. The plasticizers may be used each alone or two or more of them may be used in combination. The addition amount of the plasticizer is from 5 to 30 mass % or less and, particularly, preferably, from 5 to 16 mass % based on the plastic film.

The plastizers include (di)pentaerythritol esters described in JP-A No. 11-124445, glycerol esters described in JP-A No. 11-246704, diglycerol esters in JP-A No. 2000-63560, citrate esters described in JP-A No. 11-92574, and substituted phenyl phosphate esters described in JP-A No. 11-90946.

Aging inhibitors (for example, antioxidant, peroxide decomposing agent, radical inhibitor, metal inactivator, acid capturing agent, and amine) or UV-ray inhibitors may also be added to the plastic film of the invention. The aging inhibitors and UV-ray inhibitors are described in each of JP-A Nos. 60-235852, 3-199201, 5-1907037, 5-194789, 5-271471, 6-107854, 6-118233, 6-148430, 7-11056, 7-11055, 7-11056, 8-29619, 8-239509, and 2000-204173. The addition amount of them is preferably from 0.01 to 1 mass % and, more preferably, from 0.01 to 0.2 mass % based on the solution (dope) to be prepared. In a case where the addition amount is less than 0.01 mass %, the effect of the aging inhibitor is scarcely observed. In a case where the addition amount exceeds 1 mass %, bleeding out of the aging inhibitor to the film surface is sometimes recognized. Examples of particularly preferred aging inhibitor include butyrated hydroxy toluene (BHT).

Particularly preferably, one or more of UV-ray absorbents may be incorporated. Preferred UV-ray absorbents for use in liquid crystals are those excellent in the absorbancy of UV-rays at a wavelength of 380 nm or less with a view point of inhibiting degradation of liquid crystals and showing less absorption of visible lights at a wavelength of 400 nm or more with a view point of liquid crystal display property. They include, for example, oxybenzophenone compounds, benzotriazole compounds, salicylate ester compounds, benzophenone compounds, cyanoacrylate compounds, and nickel complex compounds. Particularly preferred UV-ray absorbance are benzotriazole compounds, and benzophenone compounds. Among them, benzotriazole compounds are preferred, since they give less unnecessary coloration to the plastic film.

Preferred UV-ray inhibitors include, for example, 2,6-di-tert-butyl-p-cresole, pentaerythrityl-tetrakis-[3-(3,5-di-tert-butyl-4-hydroxyphenyl)propionate], triethylene glycol bis[3-(3,-tert-butyl-5-methyl-4-hydroxyphenyl)propionate], 1,6-hexanediol-bis[3-(3,5-di-tert-butyl-4-hydroxyphenyl) propionate], 2,4-bis-(n-octylthio)-6-(4-hydroxy-3,5-di-tert-butylanilino)-1,3,5-triazine, 2,2-thio-diethylenebis[3-(3,5-di-tert-butyl-4-hydroxyphenyl) propionate], octadecyl-3-(3,5-di-tert-butyl-4-hydroxyphenyl)propionate, N,N-hexamethylenebis(3,5-di-tert-butyl-4-hydroxy-hydrocynnamide), 1,3,5-trimethyl-2,4,6-tris(3,5-di-tert-butyl-4-hydroxybenzyl)benzene, and tris-(3,5-di-tert-butyl-4-hydroxybenzyl)-isocyanurate.

Particularly, 2,6-di-tert-butyl-p-cresole, pentaerythrityl-tetrakis[3-(3,5-di-tert-butyl-4-hydroxyphenyl)propionate], triethylene glycol bis[3-(3-tert-butyl-5-methyl-4-hydroxyphenyl) propionate] are most preferred. Further, hydrazine type metal inactivators such as N,N'-bis(3-(3,5-di-tert-butyl-4-hydroxyphenyl)propionate]hydrazine and phosphoric type processing stabilizer such as tris(2,4-di-tert-butylphenyl) phosphite may also be used in combination. The addition amount of the compounds is, preferably, from 1 ppm to 3.0% and, more preferably, from 10 ppm to 2% on the mass basis to the plastic film.

Further, for controlling the retardation of the plastic film of the invention, an aromatic compound having at least two aromatic rings may be used as a retardation improver. The aromatic compound is used within a range from 0.01 to 20 mass parts based on 100 mass parts of the resin constituting the plastic film. The aromatic compound is used preferably within a range from 0.05 to 15 mass parts based on 100 mass parts of cellulose acetate and it is more preferably used within a range from 0.1 to 10 mass parts. Two or more kinds of aromatic compounds may also be used in combination. The aromatic ring of the aromatic compound include, aromatic hydrocarbon ring, as well as aromatic hetero ring.

The aromatic hydrocarbon ring is particularly preferably a 6-membered ring (that is, benzene ring). The aromatic heterocyclic ring is generally an unsaturated heterocyclic ring. The aromatic heterocyclic ring is, preferably, a 5-membered ring, 6-membered ring, or 7-membered ring and, more preferably, 5-membered ring or 6-membered ring. The aromatic heterocyclic ring generally has the double bonds to the utmost degree. As the hetero atom, a nitrogen atom, oxygen atom, and sulfur atom are preferred, with the nitrogen atom being particularly preferred. Examples of the aromatic heterocyclic rings include furan ring, thiophene ring, pyrrole ring, oxazole ring, isooxazole ring, thiazole ring, isothiazole ring, imidazole ring, pyrazole ring, furazane ring, triazole ring, pyran ring, pyridine ring, pyridazine ring, pyrimidine ring, pyrazine ring, and 1,3,5-triazine ring.

The additives used preferably for the plastic film of the invention are fine inorganic particles such as of silica, kaoline, talc, diatomaceous earth, quartz, calcium carbonate, barium sulfate, titanium oxide and aluminum, and heat stabilizers and flame retardants such as salts of group II metals, for example, calcium and magnesium.

(Preparation Method of Dope)

The preparation method, particularly, the dissolving method of the dope for preparing the plastic film of the invention is not restricted. Dissolution may be conducted at a room temperature, and a cooling dissolution method, a high temperature dissolving method, a supercritical dissolving method, or a combination thereof may be conducted.

In the case of dissolution at room temperature, the resin for use in plastic film is mixed with a solvent and additives at a temperature of 0 to 55° C., and dissolved by stirring and mixing, for example, in a dissolution vessel. For the dissolution, it is important to uniformly dip the resin powder for use in plastic film sufficiently and it is essential not to cause an dissolved powder, so-called MAMAKO (powdery portion of the resin for use in plastic film in which solvent does not soak at all). For this purpose, it is sometimes preferred to previously add a solvent in a stirring vessel and then add a resin for use in plastic film while reducing the pressure in the dissolution vessel. On the contrary, it may sometimes be preferred to previously add a resin for use in plastic film in a stirring vessel and then add a solvent while reducing the pressure in the dissolution vessel. Further, it is also a preferred method of preparing the solution by previously wetting the resin for use in plastic film with a poor solvent such as an alcohol and then adding the halogenated organic solvent of the invention.

In a case of using plural solvents, the order of adding them is not particularly restricted. For example, a resin for use in plastic film may be added into a main solvent and then other solvent (for example, gelling solvent such as alcohol) may be added or, on the contrary, the main solvent may also be added after wetting the resin for use in plastic film previously with a gelling solvent, which is effective for preventing not uniform dissolution. In the stirring, it may adopt a procedure of mixing a resin for use in plastic film with a solvent, then standing the same as it is to swell the resin for use in plastic film sufficiently with the solvent and, successively, stirring them to form a uniform solution. The amount of the resin for use in plastic film is preferably controlled such that the resin is contained by from 5 to 40 mass % in the mixture. The amount of the resin for use in plastic film is, more preferably, from 10 to 30 mass %.

Then, the cooling dissolution method is to be described. At first, a resin for use in plastic film is added gradually under stirring to an organic solvent at a temperature of about room temperature (−10 to 40° C.). In a case of using plural solvents, the order of adding them is not particularly restricted. For example, the resin for use in plastic film may be added into the main solvent and then other solvent (for example, poor gelling solvent such as alcohol) may be added or, on the contrary, a main solvent may be added after wetting the resin for use in plastic film previously with the poor gelling solvent, which is effective for preventing of not uniform dissolution (prevention of so-called MAMAKO, undissolved powder). The amount of the resin for use in plastic film is controlled preferably such that the resin is contained by from 5 to 40 mass % in the mixture. The amount of the resin for use in plastic film is, more preferably, from 10 to 30 mass %, and optional additives to be described later may also be added in the mixture.

Then, the mixture is cooled to from −100 to −10° C. (preferably, from −80 to −10° C., more preferably, from −50 to −20° C. and, most preferably, from −50 to −30° C.). Cooling can be conducted, for example, in a dry ice-methanol bath (−75° C.) or a cooled diethylene solution (−30° C. to −20° C.). With such cooling, the mixture of the resin for use in plastic film and the organic solvent is solidified. While the cooling rate is not particularly restricted, since the viscosity of the solution for use in plastic film increases along with cooling to deteriorate the cooling efficiency in a case of batchwise cooling, it is necessary to use a dissolution vessel of high efficiency for reaching a predetermined cooled temperature. In a case where dissolution is insufficient, procedure of cooling and warming may be repeated. Whether dissolution is sufficient or not can be judged by merely observing the appearance of the solution with naked eyes. In the cooling dissolution method, use of a tightly closed vessel is desired for avoiding intrusion of moisture due to dew condensation during cooling. Further, in the cooling and warming operation, the dissolution time can be shortened by increasing the pressure during cooling and decreasing the pressure during warming. For conducting pressurization and depressurization, use of pressure-proof vessel is preferred.

Further, the high temperature dissolution method is also used preferably in the invention. At first, a resin for use in plastic film is added gradually under stirring to an organic solvent at about a room temperature (−10 to 40° C.). In a case of using plural solvents, the order of adding them is not particularly restricted. For example, the resin for use in plastic film may be added into the main solvent and then other solvent (for example, gelling solvent such as alcohol) may be added or, on the contrary, a main solvent may be added after wetting the resin for use in plastic film previously with the gelling solvent, which is effective for preventing of not uniform dissolution. For the solution of the resin for use in plastic film of the invention, it is preferred to add the resin for use in plastic film in a mixed organic solvent containing various kinds of solvents to previously swell the resin. In this case, the resin for use in plastic film may be added gradually under stirring in any of the solvents at −10 to 40° C., or the resin may be swollen previously by a predetermined solvent, then, other solvent to be used together may be added and mixed to form a uniform swollen solution depending on the case and, further, the resin may be swollen with two or more kinds of solvents and then remaining solvents may be added.

The mixed solution of the organic solvents is heated to 70 to 240° C. under a pressure of from 0.2 MPa to 30 MPa (preferably, 80 to 220° C., more preferably, 100 to 200° C., most preferably, 100 to 190° C.). Heating may be conducted, for example, by using high pressure steams or an electric heat source. Since the pressure is high while, a pressure proof vessel or pressure proof line is necessary, for which a pressure proof vessel or line made of iron, stainless steel or other metal may be used with no particular restriction. Then, since the heated solution can not be coated as it is, it is necessary to cool the solution to lower than the lowest boiling point of the solvents used. In this case, it is general to return the pressure to a normal pressure by cooling to −10 to 50° C. Cooling may be conducted by merely leaving the high pressure and high temperature vessel or line incorporated with the resin solution for use in plastic film as it is at room temperature or, further, the device may also be cooled by using, preferably, a coolant such as cooling water. For promoting dissolution, operation of heating and cooling may be repeated. Whether the dissolution is sufficient or not can be judged by merely observing the appearance of the solution with naked eyes. In the high pressure and high temperature dissolution method, a tightly closed vessel is used in order to avoid evaporation of the solvent. Further, in the swelling step, the dissolution time can be shortened further by applying pressurization or depressurization. For conducting pressurization or depressurization, a pressure-proof vessel or line is essential.

According to the method described above, a resin solution (dope) for use in plastic film at high concentration can be obtained and a resin solution for use in plastic film at high concentration and excellent in stability can be obtained without relying on the means of concentration. However, for attaining the dissolution in a short time, a method of dissolving the resin at a low concentration and then concentrating the same by using concentration means may also be adopted. The concentration method is not particularly restricted and can be conducted, for example, by a method of introducing a solution at a low concentration between a cylindrical member and a rotational trace drawn by the outer periphery of a rotary vane that rotates in the circumferential direction at the inside thereof and obtaining a solution at high concentration while evaporating the solving by providing a temperature difference with respect to the solution (for example, refer to JP-A No. 4-259511), or a method of blowing a heated solution at low concentration from a nozzle into a vessel, and subjecting the solution to flash evaporation till the solution from the nozzle hits against the inner wall of the vessel, extracting solvent vapors from the solution and extracting the solution at high concentration from the bottom of the vessel (for example, methods described in U.S. Pat. Nos. 2,541,012, 2,858,229, 4,414,341, and 4,504,355). The viscosity of the resin solution just before film formation may be within a range that the solution can be cast upon film formation and usually it is preferred to be prepared within a range from 10 Pa·s to 2,000 Pa·s, and particularly, from 30 Pa·s to 400 Pa·s. The temperature is not particularly restricted so long as this is at the temperature upon casting and it is, preferably, from −5 to 70° C. and, more preferably, from −5 to 55° C.

Then, filtration of the resin solution for use in plastic film is to be described. It is preferred that obstacles such as not-dissolved matters, dusts, impurities, etc. are removed by filtration by using an appropriate filter material such as metal mesh or flannel prior to the casting of the resin solution for use in plastic film. For the filtration of the resin solution for use in plastic film, a filter having an absolute filtration accuracy of 0.005 mm or more and 0.1 mm or less is used and, more preferably, a filter with an absolute filtration accuracy of less than 0.005 mm and more than 0.0005 mm is used. In this case, it is preferred to conduct film formation after filtration at a filtration pressure of 16 kg/cm$^2$ or less (preferably, 12 kg/cm$^2$ or less, more preferably, 10 kg/cm$^2$ or less and, particularly preferably, 2 kg/cm$^2$ or less). By the filtration, it can attain such a state that the number of obstacles exceeding 50 μm size per 250 mm$^2$ of area is substantially 0 and, further, and a state that the number of the obstacles sized from 5 to 50 μm per 250 mm$^2$ of area is 200 or less which can be observed under a cross nicol state, by which the commercial worth of the protective film for use in polarization plates can be enhanced remarkably. In this case, the film obtained in the invention is put between two polarization plates arranged in a cross nicol state, a light is applied from the outside of one of the polarization plates, which is observed at the outside of the other polarization plates by a microscope (30X: using transmission light source). The number of the obstacles is measured for 10 places and it is defined as the number of obstacles after repeating the evaluation by five times.

(Film Formation)

A manufacturing method by solution casting of a film using a resin solution for use in plastic film according to the invention is to be described. For the method and the facility for manufacturing a resin film for use in plastic film according to the invention, solution casting film formation methods and solution casting film forming apparatus usually served for the manufacture of cellulose triacetate films are adopted. A dope (resin solution for use in plastic film) prepared from a dissolving equipment (vessel) is once stored in a storing vessel, and finally prepared, for example, by a step of removing foams contained in the dope. The dope is sent from a dope discharge port through a pressure type constant volume gear pump capable of feeding liquid at constant volume at a high accuracy for example depending on the number of rotation to a pressure die, the dope is uniformly cast on a support in a casting portion running from a spinneret (slit) of a pressurizing die in an endless manner and a damp-dried dope film (also referred to as web) is peeled from the support at a peeling point after about one turn of the support. Both ends of the obtained web are pinched between clips, and drying is conducted under conveyance by a tenter while keeping the width and, successively, the film is conveyed by a group of rolls in the drying apparatus to complete drying and then taken up to a predetermined length by a winding equipment. The combination of the tenter and the drying apparatus of the roll group differs depending on the purpose.

At first, the prepared resin solution (dope) for use in plastic film is cast on a drum or band and the solvent is evaporated to form a film upon manufacturing a resin film for use in plastic film by a solvent casting method. The dope before casting is preferably controlled for the concentration that the solid content is from 10 to 40%. The surface of the drum or the band is preferably mirror finished. The casting and drying method in the solvent casting method is described, for example, in U.S. Pat. Nos. 2,336,310, 2,367,603, 2,492,078, 2,492,977, 2,492978, 2,607,704, 2,739,069, and 2,739,070, BP Nos. 640731 and 736892, JP-B Nos. 45-4554, and 49-5614, JP-A Nos. 60-176834, 60-203430, and 62-115035. The dope is cast preferably on a drum or band at a surface temperature of 10° C. or lower.

In the invention, the resin solution for use in plastic film is cast as at least two layers on a smooth band or drum as a support. In a case of casting plural resin solutions for use in plastic film, a film may be manufactured while casting and laminating solutions containing resins for use in plastic film respectively from plural casting ports which are spaced each at a distance in the advancing direction of the support. For example, methods as described in JP-A Nos. 61-158414, 1-122419, and 11-198285 can be applied. Alternatively, a film may also be manufactured by casting resin solutions for use in plastic film from two or more casting ports and, this can be practiced by the methods described, for example, in JP-B No. 60-27562, JP-A Nos. 61-94724, 61-947245, 61-104813, 61-158413, and 6-134933. Further, it may be conducted by a casting method of enveloping a flow of a resin solution at high viscosity for use in plastic by a resin solution at a low viscosity for use in plastic film and simultaneously extruding the resin solutions at high and low viscosity for use in plastic film as described in JP-A No. 56-162617.

Alternatively, a film may also be prepared by using two casting ports, peeling a film formed by a first casting port on a support and conducting second casting to the side in contact with the support surface, and a method described, for example, in JP-B No. 44-20235 can be applied. The resin solutions to be cast for use in plastic film may be identical resin solution or different resin solutions for use in plastic film, with no particular restriction. For providing functions to plural resin layers, resin solutions corresponding to the functions may be extruded from respective casting ports. Further, the resin solution for use in plastic film of the invention can also be cast together with a solutions for forming other functional layers (for example, adhesion layer, dye layer, antistatic layer, anti-halation layer, UV-absorption layer, polarization film, etc.).

Referring more specifically to a casting method useful for the invention, it includes a method of uniformly extruding a prepared dope from a press die onto a support, a method of using a doctor blade of controlling the film thickness of a dope once cast on a support by a blade, a method of using a reverse roll coater of controlling by a reversely rotating roll, etc. and the method of using the press die is preferred. The press die includes a coat hunger type, a T-die, etc. and any of them can be used preferably. Further, in addition to the methods mentioned above, various methods of casting and forming films from cellulose triacetate solutions known so far (methods as described, for example, in JP-A Nos. 61-94724, 61-148013, 4-85011, 4-286611, 5-185443, 5-185445, 6-278149, 8-207210, etc.) can be used preferably and the same effects as those described in respective patent publications can be obtained by setting respective conditions while considering the difference of boiling points of the solvents, etc. to be used.

The support that runs in an endless manner used for the preparation of the plastic film of the invention, includes a drum mirror-finished at the surface with chromium plating or stainless steel belt (may also be referred to as band) mirror-finished by surface polishing. One or more press die used for the preparation of the plastic film of the invention may be provided above the support. The number of the die is preferably one or two. In a case of providing two or more dies, the amount of dope to be cast may be distributed at various ratios to the respective dies and the dope is delivered to the dies from plural precision constant volume gear pumps at respective ratios.

The drying of the dope on the support conducted during preparation of the plastic film of the invention can be conducted generally by a method of applying a hot blow from the surface of a support (drum or belt), that is, from the surface of a web on the support, a method of applying a hot blow from the rear face of the drum or belt, or by a liquid heat conduction method of bringing a temperature-controlled liquid into contact with to the rear face of the belt or drum on the side opposite to the casting surface, and heating the drum or belt by heat conduction to control the surface temperature, etc. The rear face liquid heat conduction method is preferred. The surface temperature of the support before casting may be optional so long as the temperature is at a boiling point or lower of a solvent used for the dope. However, for promoting drying or eliminating the fluidity on the support, it is preferred to set a temperature lower by 1 to 10° C. than the boiling point of the solvent that has the lowest boiling point in the solvents to be used.

The drying temperature in the drying step for the plastic film of the invention is usually from 40 to 250° C. and, particularly, from 70 to 220° C. Further, for removing the residual solvent, it is usually dried at a temperature of from 50 to 200° C. and, in this case, a method of drying by a high temperature blow while changing the temperature successively thereby evaporating the residual solvent is used preferably. The method mentioned above is described in JP-B No. 5-17844. According to the method, the time from casting to peeling can be shortened. The drying temperature, the flow rate of the drying blow and the drying time are different depending on the solvent to be used and may be selected properly in accordance with the kind and the combination of the solvents to be used. The residual amount of the solvent in the finally finished film is, preferably, from 2 mass % or less and, more preferably, 0.4 mass % or less for obtaining a film of good dimensional stability.

The plastic film formed on the support is peeled from the support. The maximum value of the peeling load (maximum peeling load) in this case is, preferably, from 1 to 30 g/cm, more preferably, from 1 to 28 g/cm and, further preferably, from 3 to 25 g/cm. Further, the time from the instance of casting the dope as the resin solution for use in plastic film on the support to the instance of starting the peeling is, preferably, from 30 to 600 sec, more preferably, from 30 to 400 sec and, further preferably, from 30 to 240 sec.

In the drying step after peeling from the support, the film tends to shrink in the lateral direction by the evaporation of the solvent. Shrinkage increases as the drying temperature is higher. It is preferred to conduct drying while suppressing the shrinkage as much as possible with a view point of making the planarity of the finished film satisfactory. With this view point, a method of drying while laterally retaining both lateral ends of a web with clips in the lateral direction in the entire or partial step of drying (tenter method) as described, for example, in JP-A No. 62-46625 is preferred.

In the invention, there is also adopted a method of positively stretching the web in the lateral direction in order to improve the physical characteristic and the methods as described, for example, in JP-A Nos. 62-115035, 4-152125, 4-284211, 4-298310, and 11-48271 are applicable in the invention. The film stretching is practiced at a normal temperature or under heating condition. While the heating temperature is not particularly restricted, it is preferably about at the glass transition temperature of the film and it is generally practiced at 80 to 400° C., particularly, at 100 to 300° C. Particularly, a temperature higher by 10 to 20° C. than Tg (glass transition temperature) is particularly preferred. Stretching of the film in the invention may be monoaxial stretching or biaxial stretching. The film can be stretched by the treatment during drying and it is effective particularly in a case where the solvent remains. For example, by controlling the speed of the film transportation rollers such that the take-up speed for the film is higher than the peeling speed of the film, the film is stretched. The film can be stretched also by transporting the film while retaining the film width by a tenter and gradually enlarging the width of the tenter.

The film can also be stretched by using a stretcher after the drying of the film (preferably, monoaxial stretching by using a long stretching machine). The stretching factor of the film (factor for the increment by stretching relative to the original length) is, preferably, from 1.03 to 3 times, more preferably, from 1.05 to 2.5 times and, further preferably, from 1.05 to 1.8 times. In this case, the stretching direction may be in the casting direction, or it may be stretched in the direction perpendicular to the casting direction. Further, the film may also be stretching in both directions depending on the case. In this case, stretching may be conducted simultaneously, or stretching may be conducted in one direction and then, conducted in another direction. The steps from the casting to drying may be conducted in an air atmosphere or in an inert gas atmosphere such as of a nitrogen gas. The take-up machine relating to the preparation of the plastic film of the invention may be those used generally and the film can be taken-up by a take-up method such as a constant tension method, constant torque method, tapered tension method, programmed tension control method with the constant internal stress. While the thickness of the finished plastic film (after drying) of the invention differs depending on the purpose of use, it is usually within a range from 20 to 500 µm, preferably, within a range from 30 to 250 µm and, particularly most preferably, within a range from 30 to 150 µm. The thickness of the film can be controlled by controlling the concentration of the solids contained in the dope, a slit distance of a spinneret of the die, the extruding pressure from the die, the support speed, etc. so as to attain a desired thickness.

The stretching speed is, preferably, from 5%/min to 1000%/min and, more preferably, 10%/min to 500%/min. The stretching is preferably conducted by a heat roll and/or radiation heat source (IR heater, etc.), or hot blow. Further, a thermostable bath may be formed in order to enhance the uniformness of the temperature. In a case of conducting monoaxial stretching by roll stretching, it is preferred that L/W as a ratio between the inter-roll distance (L) and the film width (W) of the phase difference plate is from 2.0 to 5.0. Further, for preventing foaming in the web, improving the releasability, and preventing dusting in the tenter drying, it is preferred to form the drier such that the width thereof is shorter than the width of the web so that the hot blow of the drier does not hit against both edges of the web in the drying apparatus. Further, a window-shield plate may be provided at the inside of both ends of the web such that a drying blow does not hit on the retained portion of the tenter.

(Functional Layer)

Functional layers formed by co-casting plural layers or sequentially casting plural layers in the invention are to be described below. Various layers may be considered for the functional layer with no particular restriction. In a case of using the plastic film of the invention as a substrate and forming a gas barrier layer thereon, the surface layer (the surface on which the gas barrier layer is formed) is preferably "surface smoothed layer" and the rear face is preferably "sliding layer". In the invention, a layer formed from a main stream is referred to as an intermediate layer, the layer on the side of the support is referred to as a support surface and the layer on the opposite side is referred to as an air surface in the following descriptions for the invention. In the invention, it is preferred that the support surface is a surface layer and the air surface is a rear face layer, and such a combination is used in the invention.

[Surface Smoothed Layer]

In the invention, excellent barrier property can be obtained by forming an inorganic layer (barrier layer) comprising at least one layer of inorganic material on a substrate comprising a plastic film of the invention. In this case, the barrier property is further improved when the surface for forming the barrier layer (surface layer) of the plastic film substrate of the invention is smooth.

The surface smoothness of the plastic substrate of the invention was evaluated by using a micromap machine "Micromap SX520-SD200" manufactured by RYOKA SYSTEM Co. with "maximum height: St (nm)" or "average surface roughness: Sa(nm)" as the index. The range for measurement was from 500 μm×500 μm to 1000 μm×1000 μm. As the method of measuring the surface roughness, it may be measured by using other commercially available 2-dimensional surface roughness measuring instrument.

In the gas barrier film of the invention, defects less occur when the thin film of the barrier layer is formed as the maximum height: St(nm) is smaller and favorable gas property can be obtained stably. In the gas barrier film of the invention, the maximum height: St(nm) is, preferably, from 300 nm or less, more preferably, 200 nm or less and, further preferably, 100 nm or less.

Further, in the gas barrier film of the invention, defects when the thin film of the barrier layer is formed as the average surface roughness: Sa(nm) is smaller and favorable gas barrier property can be obtained stably. In the gas barrier film of the invention, the average surface roughness: Sa(nm) is, preferably, 5 nm or less, more preferably, 2 nm or less, and, further preferably, 1 nm or less.

In the invention, "surface smoothed layer" is a layer capable of covering the unevenness on the surface of the substrate and means a layer in which the average surface roughness: Sa (nm) on the surface is 5 nm or less.

The method of improving the smoothness of the plastic substrate is not particularly restricted in the invention and a method of forming the surface smoothed layer by a co-casting method or sequential casting method is preferred. The surface smoothed layer has no particular restriction so long as a liquid coating solution is coated and the surface unevenness can be covered by the leveling effect of the liquid. A solution of a polymer identical with that of the plastic substrate and a solution of polymer different therefrom, or a monomer having polymerization curability, etc. can be used preferably. The thickness of the surface smoothed layer is, preferably, from 1 to 50 μm, more preferably, from 1 to 20 μm and, further preferably, from 1 to 10 μm. In a case where the thickness of the surface smoothed layer is excessively thin, is not preferred since protrusions caused by obstacles of the base layer can not be covered completely. On the other hand, in a case where it is excessively thick, since the concentration of the coating solution for casting the surface smoothed layer increases, this results in disadvantages that the leveling effect is insufficient or the mesh of the filter for the filtration can not be made fine. It is preferred that the coating solution for casting the surface smoothed layer has a viscosity lower than that of the coating solution for the base layer and the accuracy of the filter for use in filtration is 0.5 μm or less.

Other preferred method for improving the smoothness is a method of using a sufficiently smooth drum or band upon film formation from a solution, peeling the film in an appropriate drying state such that the peeling surface does not suffer from additional unevenness in the drying step, drying and then taking up the film. Further, it is important to filter the polymer solution used for film formation from solution sufficiently by a filter of fine mesh thereby removing obstacles and impurities which cause surface unevenness. The accuracy of the filter is, preferably, 10 μm or less, more preferably, 5 μm or less and, further preferably, 1 μm or less. It is preferred to use a filter of a mesh as fine as possible within an allowable range in view of the filtration pressure.

[Sliding Layer]

In a case where the smoothness at the surface layer of the plastic film is good, creaking tends to occur due to the insufficiency of the slidability upon taking-up the film. With an aim of preventing this, it is preferred to provide the back layer with a slidability. The sliding layer is preferably formed by a co-casting method or sequential casting method of a coating solution containing a sliding agent and/or matting agent. The sliding layer is formed preferably on the side opposite to the surface of forming the gas barrier layer and it is preferably formed to the rear face (on the side of the air surface) of the plastic film of the invention.

The slidability can be evaluated by measuring "creaking value". The creaking value between the surface and the rear face of the gas barrier film is preferably from 10 g to 500 g. The "creaking value" represents the degree of "creak" of the film, and this is a value showing the degree of friction when the film surface and the film rear face are brought into face-to-face contact. That is, in a case of bonding a film on a horizontal smooth table with the film surface being upwarded, bonding the same kind of a film to a smooth surface of a load having a predetermined mass with the rear face being exposed, stacking them such that the rear face is in contact with the surface of the film bonded to the horizontal smooth table, a force required for pulling the load stacked on the table at a predetermined speed is defined as "creaking value".

"Creaking value" in the invention is measured by the following method using a tensile tester shown in FIG. 1.

(1) A film sample is cut out into a rectangular shape of 180 mm in TD direction (transversal direction)×50 mm in MD direction (film forming direction), which is bonded as a first film sample 22 on a smooth plate with the surface (surface for forming the gas barrier layer) being upwarded. This is attached to a sample table 23 which is attached horizontally to a transfer stage 25 of a tensile tester.

(2) The film sample as in (1) is cut out into a rectangular shape of 80 mm in TD direction×18 mm in MD direction and it is bonded as a second film sample on a smooth plate of the identical size and of 500 g weight with the rear face (surface not formed with the gas barrier layer) being exposed. Further, a thread is attached at the center for the 18 mm side of the plate 21 of 500 g weight to which the second sample film is bonded.

(3) After stacking such that the rear face of the second sample film is in contact with the surface of the first sample film, the thread attached to the plate 21 of 500 g weight bonded with the second sample film is fixed to a load cell 26 by way of a tackle 24 on a transfer stage 25 of the tensile tester.

(4) The transfer stage 25 is lowered at a speed of 200 mm/min. The maximum load detected by the load cell 26 is defined as "creaking value".

As "creaking value" thus measured is larger, it shows that creaking is more liable to occur between the surface and the rear face of the films. The present inventor has found that as "creaking value" is smaller, scratches less occurs to the film in the form of a roll and favorable gas barrier property can be obtained stably. The gas barrier film of the invention has "creaking value" from 10 g to 500 g. In a case where the value exceeds 500 g, scratches occur due to "creaking" in the form of the roll to deteriorate the gas barrier property. On the other hand, in a case where "creaking value" is less than 10 g, excessive sliding is resulted between the bases and the film can not be taken up neatly. "Creaking value" for the gas barrier film of the invention is, more preferably, from 15 g to 400 g and, further preferably, 20 g to 200 g.

In the gas barrier film of the invention, it is preferred that creaking between the surface and the rear face is decreased also in a state before forming the barrier layer. Specifically, the creaking value between the surface and the rear face of a plastic substrate used for the gas barrier film of the invention is, preferably, from 10 g to 500 g, more preferably, from 15 g to 400 g and, further preferably, from 20 g to 200 g. In case where the value exceeds 500 g, scratches occur due to "creaking" in the form of the roll to deteriorate the surface smoothness. When a barrier film is formed on such a plastic substrate lacking in the surface smoothness, the barrier performance tends to be deteriorated sometimes.

The method of decreasing "creaking value" of the gas barrier film in the invention is not particularly restricted. A preferred method includes a method of applying unevenness to the surface. In a case where surfaces are in just contact to each other with no unevenness, "creaking value" tends to be increased. On the other hand, in a case where unevenness is present on the surfaces, since the surfaces are less in close contact with each other, "creaking value" can be decreased easily. However, since the surface is required to have a smoothness for forming the gas barrier layer, it is preferred to provide the unevenness only for the rear face. The method of applying the unevenness includes a method of forming a layer containing fine particles (matting agent) thereby providing the unevenness or a method of providing the unevenness by applying embossing (die press) to the surface.

For the method of decreasing "creaking value" of the gas barrier film, a method of applying a surface sliding agent can also be used as a preferred method. Further, similar effect can be obtained also by a method of providing an antistatic layer (conductive layer) on at least one surface of the gas barrier film. In a case where the gas barrier film is adsorbed by generated static electricity, this increases the creaking tending to cause troubles due to scratches. In a case of releasing the static electricity through the antistatic layer, creaking can be decreased.

(a) Sliding Agent

The sliding agent used in the invention includes, for example, polyorganosiloxanes as disclosed in JP-B No. 53-292, higher fatty acid amides as disclosed in U.S. Pat. No. 4,275,146, higher fatty acid esters (esters of fatty acid of 10 to 24 carbon atoms and alcohols of 10 to 24 carbon atoms) as disclosed in JP-B No. 58-38541, BP No. 927446, JP-A Nos. 55-126238, and 58-90633, and higher fatty acid metal salts as disclosed in U.S. Pat. No. 3,933,516, esters of linear higher fatty acids and linear higher alcohols as disclosed in JP-A No. 58-50534, and higher fatty acid-higher alcohol esters containing branched alkyl groups as disclosed in WO No. 901081158.

Among them, as the polyorganosiloxanes, polyalkyl siloxane such as polydimethyl siloxane, and polydiethyl siloxane, polyaryl siloxane such as polydiphenyl siloxane, and polymethylphenyl siloxane generally known so far, as well as modified polysiloxanes, for example, organopolysiloxanes having $C_5$ or higher alkyl groups, alkyl polysiloxanes having polyoxyalkylene groups on the side chains, organopolysiloxanes having alkoxy, hydroxy, hydrogen, carboxyl, amino, and mercapto groups on the side chain as described in JP-B Nos. 53-292, 55-49294, and JP-A No. 60-140341 can also be used and block copolymers having siloxane units or compounds described in JP-A No. 60-19124 can also be used.

Specific examples of the compounds are shown below but the sliding agent usable in the invention is not restricted to them.

 (S-1)

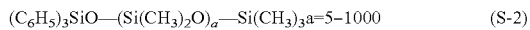 (S-2)

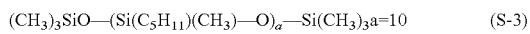 (S-3)

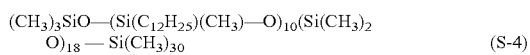 (S-4)

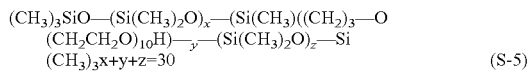 (S-5)

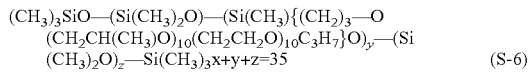 (S-6)

Further, as the higher fatty acid and derivatives thereof and higher alcohols and derivatives thereof, higher fatty acids, metal salts of higher fatty acids, higher fatty acid esters, higher fatty acid amides, higher fatty acid polyhydric alcohol esters, etc., higher aliphatic alcohols, monoalkyl phosphites, dialkyl phosphite, and trialkyl phosphite, monoalkyl phosphate, dialkyl phosphate, trialkyl phosphate of higher aliphatic alcohols, alkyl sulfonic acids of higher aliphatic groups, amide compounds thereof or salts thereof can be used. Specific examples of the compounds are shown below but the sliding agent usable in the invention are not restricted to them.

(S-7) 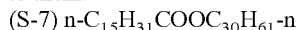
(S-8) 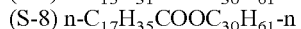
(S-9) 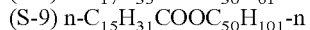
(S-10) 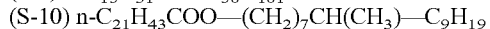
(S-11) 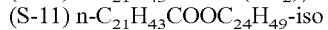
(S-12) 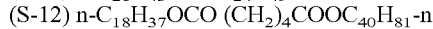
(S-13) 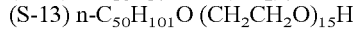
(S-14) 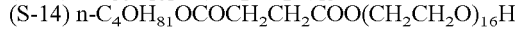
(S-15) 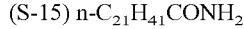
(S-14) 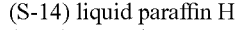
(S-15) 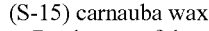

By the use of the sliding agent described above, an excellent film having excellent scratch resistance and with no occurrence of repellency at the under coat surface, etc. can be obtained. The amount of the sliding agent to be used is not particularly restricted and the content is, preferably, from 0.0005 to 2 g/m$^2$, more preferably, from 0.001 to 1 g/m$^2$ and, particularly preferably, from 0.002 to 0.5 g/m$^2$. The layer containing the sliding agent can be formed by coating and drying a coating solution in which a sliding agent is properly dissolved in an organic solvent. Further, the sliding agent can be added in the form of a dispersion in the coating solution. The solvent used is, preferably, water, alcohols (methanol, ethanol, isopropanol, etc.), ketones (acetone, methyl ethyl ketone, cyclohexanone, etc.), esters (methyl, ethyl, propyl, butyl esters of acetic acid, formic acid, oxalic acid, maleic acid, succinic acid, etc.), aromatic hydrocarbons (benzene, toluene, xylene, etc.), amides (dimethyl formamide, dimethyl acetoamide, n-methyl pyrrolidone, etc.).

For the coating solution used for coating the sliding agent, a binder having a film forming property can also be used. Such a polymer includes known thermoplastic resins, thermosetting resins, radiation-curable resins, reactive resins, mixtures of them, and hydrophilic binders such as gelatin.

As the sliding performance of the layer containing the sliding agent, the static friction coefficient is, preferably, 0.30 or less, more preferably, 0.25 or less and, particularly preferably, 0.13 or less. In a case where the static friction coefficient relative to the mating material in contact therewith is smaller, it is useful for preventing scratches, etc. The static friction coefficient relative to the mating material is also, preferably, 0.30 or less, more preferably, 0.25 or less and, particularly preferably, 0.13 or less. Further, the dynamic friction coefficient of the layer containing the sliding agent is, preferably, 0.30 or less, more preferably, 0.25 or less and, particularly preferably, 0.15 or less. Further, also the dynamic friction coefficient relative to the mating material in contact therewith is, preferably, 0.3 or less, more preferably, 0.25 or less and, particularly preferably, 0.15 or less.

(b) Matting Agent

In a case of using a matting agent with an aim of providing the sliding property, the average height of the protrusions on the surface is, preferably, from 0.005 to 10 µm and, more preferably, 0.01 to 5 µm. Further, it is more preferred that the number of the protrusions on the surface is larger but in a case where the number is unnecessarily larger, this results in haze to cause a problem. For example, in a case of forming the protrusions with a matting agent of spherical or indefinite shape, the content is, preferably, from 0.5 to 600 mg/m$^2$ and, more preferably, from 1 to 400 mg/m$^2$. As the matting agent used herein, fine particles added to the film may also be utilized. The composition is not particularly restricted, which may be an organic or inorganic material or may be a mixture of two or more kinds of them.

The inorganic compound constituting the matting agent includes, for example, fine powder of inorganic materials, for example, barium sulfate, manganese colloid, titanium dioxide, strontium barium sulfate, silicon dioxide, aluminum oxide, tin oxide, zinc oxide, calcium carbonate, barium sulfate, talc, kaoline, and calcium sulfate, and further includes, for example, silicon dioxide such as synthesis silica obtained by a wet process or gelling of silicic acid and titanium dioxide formed from titanium slag and sulfuric acid (rutile type or anatase type). Further, those obtained from inorganic materials of a relatively large grain size, for example, of 20 µm or more by pulverization and subsequent classification (vibratory filtration, wind classification) may also be used. In addition, they also include pulverization and classification products of organic polymeric compounds such as polytetrafluoroethylene, cellulose acetate, polystyrene, polymethyl methacrylate, polypropyl methacrylate, polymethyl acrylate, polyethylene carbonate, acryl styrene resins, silicone resins, polycarbonate resins, benzoquanamine resins, melamine resins, polyolefin powders, polyester resins, polyamide resins, polyimide resins or polyfluoroethylene resins or starches. Further, polymeric compounds synthesized by suspension polymerization, spray drying, or dispersion method, etc. formed into spherical form, or inorganic compounds may also be used. Further, particles of larger grain size of 0.1 to 10 µm formed of the same material as described above and/or fine particles described above may be added to form an antidazzling layer. It is preferred to add fine particles of from 0.5 to 20 mass %. The fine particles include, for example, silicon dioxide such as silica, for example, SYLYSIA, manufactured by Fuji Silysia Chemical Ltd. or Nipsil E manufactured by Nippon Silica Co.

As the fine particles, use of fine particles having an alkyl group or aryl group of 2 to 20 carbon atoms on the surface is also preferred. Alkyl groups of 4 to 12 carbon atoms are more preferred and those of 6 to 10 carbon atoms are further preferred. As the number of carbon atoms is smaller, the dispersion is more excellent and as the number of carbon atoms is larger, less agglomeration occurs when mixed with the dope.

Among the materials having the alkyl group of 2 to 20 carbon atoms and the aryl group on the surface to be used herein, examples of the inorganic compounds include silicon dioxide, titanium dioxide, aluminum oxide, zirconium oxide, calcium carbonate, calcium carbonate, talc, clay, baked kaolinite, baked calcium silicate, calcium silicate hydrate, aluminum silicate, magnesium silicate, and calcium phosphate. Silicon dioxide, titanium dioxide and zirconium oxide are preferred and, among all, compounds containing silicon atoms, particularly, silicon dioxide is preferred. Fine particles of silicon dioxide are marketed under the trade names, for example, of Aerosil 130, Aerosil 200 and Aerosil 300 (all manufactured by Nippon Aerosil Co.). Further, fine particles of silicon dioxide modified at the surface with a silicone oil and fine particles of spherical mono-dispersed silicon dioxide may also be used preferably.

Fine particles of the inorganic compound having the alkyl group of 2 to 20 carbon atoms at the surface can be obtained, for example, by treating the fine particles of silicon dioxide with octyl silane. Further, those having the octyl group on the surface is marketed under the trade name of Aerosil R 805 (manufactured by Nippon Aerosil Co.) and can be used.

The fine particles of the inorganic compound having the phenyl group on the surface can be obtained, for example, by treating the fine particles of silicon dioxide with trichlorophenyl silane.

In the materials of the fine particles having the alkyl group of 2 to 20 carbon atoms and the fine particles having the phenyl groups on the surface, examples of the polymer include silicone resins, fluoro resins and acryl resins, polymethyl methacrylate being particularly preferred. As described above, compounds containing silicon are preferred, and silicon dioxide or silicone resins having a three dimensional network structure are particularly preferred, with silicon dioxide being most preferred.

The fine particles described above are generally used in an amount of from 0.005 to 0.3 mass % and, more preferably, from 0.01 to 0.1 mass % based on the mass of the layer to which they are added. By the use of the fine particles described above, a film extremely excellent in the dispersibility of fine particles with the number of contained agglomerated particles having a grain size of 10 µm or more of 10 N/m$^2$ or more can be obtained. Details for them are described in JP-A No. 2001-2788.

Now, the plastic substrate, the barrier layer, and the organic layer as the essential constituents of the gas barrier film of the invention are to be described at first and then other layers and the materials are to be described.

(Plastic Substrate)

The plastic substrate of the invention comprises a polyarylate with a glass transition temperature of 250° C. or higher having the structure of the following formula (1) (also referred to as a polyarylate of the invention). The polyarylate of the invention can be obtained by polycondensing a not-substituted bisphenol fluorene or a bisphenol fluorene substituted with an alkyl group or aryl group and 2,6-naphthalene dicarboxylic acid or 4,4'-biphenyl dicarboxylic acid.

The polyarylate of the invention is to be described below.

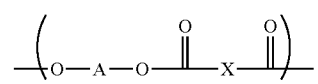

Formula (1)

In the formula (1), X represents a linking group having a naphthalene or biphenyl structure represented by the following chemical structure and, A represents a linking group represented by the formula (2):

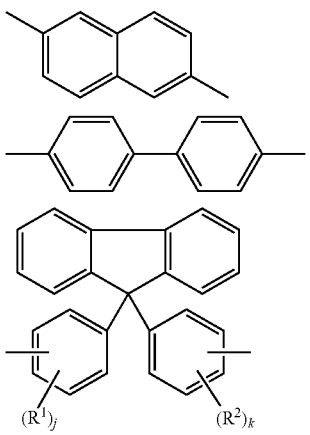
Formula (2)

In the formula (2), $R^1$ and $R^2$ each represents independently an alkyl group or aryl group, j and k each represents independently an integer of 0 to 4, $R^1$ may be identical or different from each other when j is 2 or more, and $R^2$ may be identical or different with each other when k is 2 or greater.

Preferred examples for $R^1$ and $R^2$ include methyl group, ethyl group, n-propyl group, iso-propyl group, n-butyl group, isobutyl group, sec-butyl group, tert-butyl group, cyclohexyl group, and phenyl group, methyl group being particularly preferred.

The polyarylate having the repetitive units represented by the formula (1) can be obtained by polycondensating a not-substituted bisphenol fluorene or bisphenol fluorene substituted with an alkyl or aryl group with 2,6-naphthalene dicarboxylic acid or 4,4'-biphenyl dicarboxylic acid. While preferred examples of the linking group represented by the formula (2) are to be shown below in the form of bisphenol but the invention is not restricted to the same.

A-1
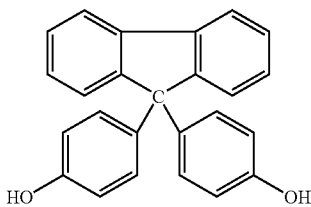

A-2
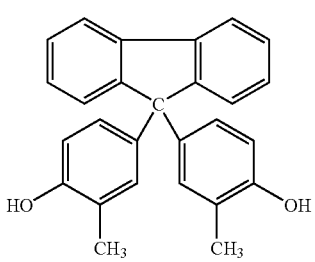

A-3
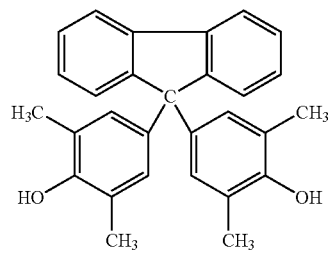

A-4
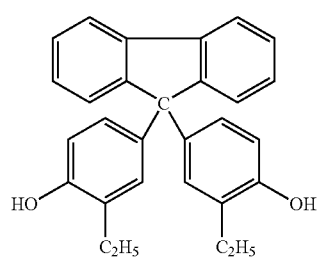

A-5
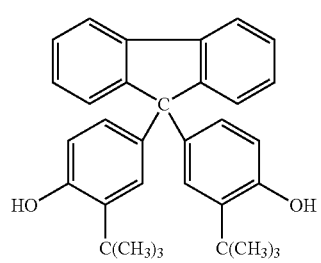

A-6
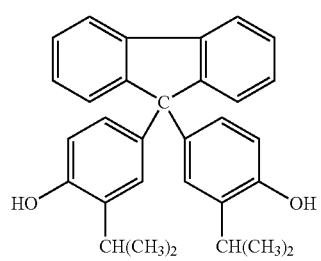

A-7
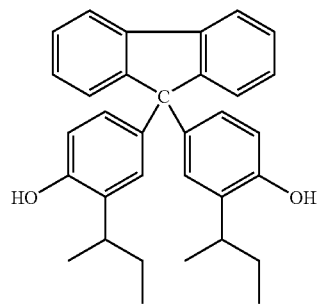

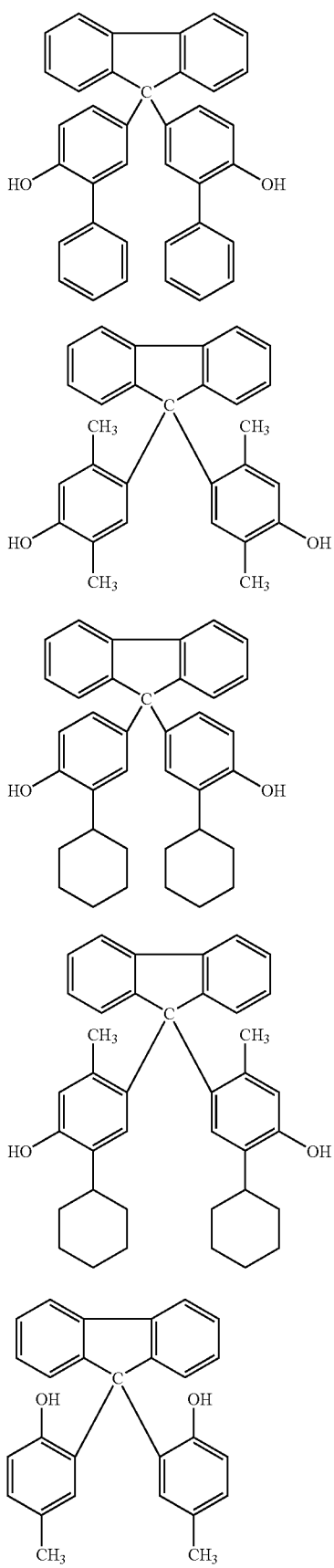

A-8
A-9
A-10
A-11
A-12

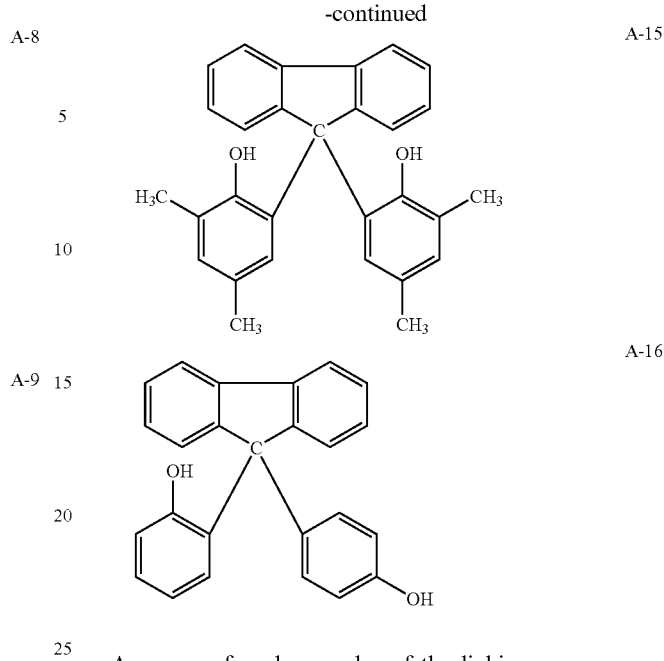

A-15
A-16

Among preferred examples of the linking group represented by the formula (2) described above shown in the form of bisphenol A, A-1, A-2, and A-3 are particularly preferred with a view point of heat resistance.

While the polyarylate having the repetitive units represented by the formula (1) can be obtained by polycondensing the not-substituted bisphenol fluorene or bisphenol fluorene substituted with the alkyl group or the aryl group mentioned in the examples above and 2,6-naphthalene dicarboxylic acid or 4,4'-bipyenyl carboxylic acid, it is preferred to contain several kinds of the repetitive units represented by the formula (1) with a view point of heat resistance and transparency. Further, it is also preferred to copolymerize dicarboxylic acids other than 2,6-naphthalene dicarboxylic acid or 4,4'-biphenyl dicarboxylic acid within the range not deteriorating the heat resistance and preferred examples of the copolymerizable dicarboxylic acids include, terephthalic acid, isophthalic acid, 2,7-naphthalene dicarboxylic acid, diphenic acid, etc. Further, various known bisphenol compounds may be copolymerized within a range not deteriorating the heat resistance and the transparency.

While preferred examples of the polyarylate having the repetitive units represented by the formula (1) are to be shown by bisphenol and dicarboxylic acid units, those usable in the invention are not restricted to them. The bisphenol compounds exemplified above are represented by numbers thereof, 2,6-naphthalene carboxylic acid is represented as X-1, and 4,4'-biphenyl carboxylic acid is represented as X-2. Further, in a case of using plural bisphenol compounds and dicarboxylic acid compounds, molar ratio for each of them is also appended.

TABLE 1

| Polyarylate | Monomer species | Compositional ratio |
|---|---|---|
| P-1 | A-1/X-1 | 100/100 |
| P-2 | A-2/X-1 | 100/100 |
| P-3 | A-3/X-1 | 100/100 |
| P-4 | A-1/X-2 | 100/100 |
| P-5 | A-2/X-2 | 100/100 |
| P-6 | A-3/X-2 | 100/100 |
| P-7 | A-1/A-2/X-1 | 50/50/100 |

TABLE 1-continued

| Polyarylate | Monomer species | Compositional ratio |
|---|---|---|
| P-8 | A-1/A-2/X-1 | 75/25/100 |
| P-9 | A-1/A-3/X-1 | 50/50/100 |
| P-10 | A-2/A-3/X-1 | 50/50/100 |
| P-11 | A-1/X-1/X-2 | 100/50/50 |
| P-12 | A-1/X-1/X-2 | 100/75/25 |
| P-13 | A-1/A-6/X-1 | 90/10/100 |
| P-14 | A-1/A-8/X-1 | 90/10/100 |
| P-15 | A-1/A-12/X-1 | 95/5/100 |
| P-16 | A-1/A-16/X-1 | 96.7/3.3/100 |
| P-17 | A-1/X-1/2,7-naphthalene dicarboxylic acid | 100/50/50 |
| P-18 | A-1/X-1/2,7-naphthalene dicarboxylic acid | 100/75/25 |

The polyarylate having the repetitive units represented by the formula (1) can be obtained by polycondensing corresponding bisphenol compound and dicarboxylic acid. As the polycondensing method, any known method can be adopted including, for example, a melt polycondensing method by de-acetic acid, melt polycondensing method by de-phenol, homogeneous de-hydrogen chloride polymerization method conducted in an organic solvent system in which a polymer is soluble using an acid chloride as the dicarboxylic acid compound and using an organic base, and an interface polycondensing method conducted in a 2-phase system of an aqueous alkali solution and a water-immiscible organic solvent using an acid chloride as the dicarboxylic acid compound. While the melt polycondensation becomes difficult in a case where the Tg of the polyarylate of the invention is 300° C. or higher, polymerization may be conducted at a reaction temperature of about 300° C. by using a high boiling plasticizer in combination as described in JP-A No. 7-188405. In a case of synthesizing the polyarylate of the invention, the interface polycondensing method is preferred since the method is simple and convenient. However, in a typical known interface polycondensation method, a method of solubilizing a bisphenol compound in an aqueous alkali solution and solubirizing a dicarboxylic acid chloride in a water-immiscible organic solvent (typically, dichloromethane, etc.) and mixing them in a short time as typically represented by the method of using bisphenol A, terephthalic acid, and isophthalic acid. On the other hand, in the invention, the solubility of the bisphenol compound to the aqueous alkali solution is sometimes low. Further, since the 2,6-naphthalene dicarboxylic acid chloride has low solubility to the water-immiscible organic solvent, the polyacrylate of high molecular weight having the repetitive unit represented by the formula (1) can not sometimes be synthesized by the known method. In this case, a method of previously mixing and stirring water, water-immiscible organic solvent, bisphenol compound and dicarboxylic acid chloride into a slurry, and gradually adding an aqueous alkali solution at high concentration is effective for increasing the molecular weight. Details of the method is to be described below referring to synthesis examples.

The method of controlling the molecular weight of the polyarylate of the invention can be conducted by adding a monofunctional material during polymerization not relying on the production process described above. The mono-functional material used as the molecular weight controller referred to herein includes monohydric phenols such as phenol, cresol, and p-tert-butyl phenol, mono-basic acid chlorides such as benzoic acid chloride, methane sulfonyl chloride, and phenyl chloro formate, monohydric alcohols such as methanol, ethanol, n-propanol, isopropanol, n-butanol, pentanol, hexanol, dodecyl alcohol, stearyl alcohol, benzyl alcohol, and phenetyl alcohol, and mono-basic carboxylic acids such as acetic acids, propionic acids, octanic acids, cyclohexane carboxylic acid, benzoic acid, toluic acid, phenylic acid, p-tert-ethyl benzoic acid, and p-methoxyphenyl acetic acid.

The molecular weight of the polyarylate of the invention is, preferably, from 10,000 to 500,000, more preferably, from 20,000 to 300,000 and particularly preferably, from 30,000 to 200,000 as the mass average molecular weight. In a case where the molecular weight is excessively low, the film formation is sometimes difficult or dynamic characteristics are deteriorated. In a case where the molecular weight is excessively high, control for the molecular weight is sometimes difficult in view of synthesis, or the viscosity of the solution is excessively high making the handling difficult. Corresponding viscosity can be measured for the molecular weight.

The carboxylic value for the polyarylate of the invention, is, preferably, 300 μmol/g or less, more preferably, 30 μmol/g or less and, particularly preferably, 10 μmol/g or less. In a case where the carboxyl value is excessively high, it sometimes gives undesired effects on electric characteristics such as arc discharge resistance and dielectric constant, or also gives undesired effects on the store stability of the prepared polymer solution formed by dissolution into a solvent, as well as gives undesired effects on the surface characteristic of the cast film obtained by the solution casting method. The carboxylic value of the resin can be measured by a known method such as neutralization titration utilizing the potentiometric titrator.

The residual amount of the alkali metal and of the halogen in the polyarylate of the invention are preferably 50 ppm or less and, particularly preferably, 10 ppm or less. In a case where the residual amount of the alkali metal and the halogen is excessively high, the electric characteristics described above tend to be lowered and, further, this gives undesired effects also on the surface characteristics of the film and this may sometimes result in lowering of the performance of the functional film provided with a conduction film, semiconductor film, etc. and it is not preferred. The residual amount of alkali metal amount and halogen in the polyarylate of the invention can be measured quantitatively by utilizing the known method such as ion chromatography, atomic absorption photometry, plasma emission spectroscopy.

Further, the residual amount of the catalyst such as the quaternary ammonium salt and the quaternary phosphonium salt in the polyarylate of the invention is, preferably, less than 200 ppm and, more preferably, less than 100 ppm. In a case where the residual amount of the catalyst is excessive, the electric characteristics described above tend to be deteriorated and this further gives undesired effects also on the surface characteristics of the film to sometimes bring about deterioration of the performance of the functional film provided with the conductive film, semiconductor film, etc. and this is not preferred. The catalyst such as the quaternary ammonium salt and the quaternary phosphonium salt remaining in the polyarylate of the invention can be determined quantitative by utilizing, for example, HPCL, gas chromatography, etc.

Further, the residual amount of the phenyl monomer and the dicarboxylic acid in the polyarylate of the invention is, preferably, 3,000 ppm or less, more preferably, 500 ppm or less and, further preferably, 100 ppm. In a case where the residual amount of the phenol monomer and the carboxylic acid is excessively large, this tends to deteriorate the electric characteristics described above, further, gives undesired effects also on the surface characteristics of the film and sometimes results in deterioration of the performance of the functional film provided with the conduction film, etc. and the semiconductor film, this is not preferred. For example, in a case of forming a transparent conductive film on the film, the effects of heating and plasmas during film formation cause evolution of gases from of residual phenol monomer or carboxylic acid ingredients, or thermal decomposition thereof to form crystal grain lumps or not coated portion referred to as "blank" in the transparent conductive film, thereby giving undesired effects such as hindrance for the reduction of the resistance of the transparent conductive film and this is not preferred. The residual amount of the phenol monomer and the carboxylic acid in the polyarylate and the film thereof can be analyzed by known methods such as HPLC or nuclear magnetic resonance method.

The polyarylates of the invention can be used each alone or two or more of them may be used as a mixture in the invention. Further, other polymers than the polyarylate of the invention may also be contained within a range not deteriorating the effect of the invention. Further, with view points of solvent resistance, heat resistance and dynamic strength, crosslinkable resins may also be added. For the kinds of the crosslinkable resins, various known resins such as thermosetting resins and radiation curable resins can be used with no particular restriction. Examples of the thermosetting resins include phenol resins, urea resin, melamine resin, unsaturated polyester resin, epoxy resin, silicone resin, diallyl phthalate resin, furan resin, bismaleimide resin, cyanate resin, etc. For the crosslinking method, any method utilizing reaction that forms covalent bonds can be used with no particular restriction. A system capable of forming urethane bond by using a polyalcohol compound and polyisocyanate compound in which reaction proceeds at a room temperature can be used with no particular restriction. However, since such a system often involves a problem of pot life before film formation, it is usually used as a two component mixture type in which a polyisocyanate compound is added just before film formation. On the other hand, in a case of using as a one-component type, it is effective to protect functional groups concerning the crosslinking reaction and this is also marketed as a block type curing agent. As the commercial block type curing agent, B-882N manufactured by Mitsui Takeda Chemicals Co., Ltd. Collonate 2513 manufactured by Nippon Polyurethane Industry Co., Ltd. (block polyisocyanates), and CYMEL 303 manufactured by Mitsui Cytec Co. (methylated melamine resin), etc. have been known. Further, a blocked carboxylic acid as in the following formula (B-1) in which polycarboxylic acid is protected that can be used as a curing agent for the epoxy resin has also been known.

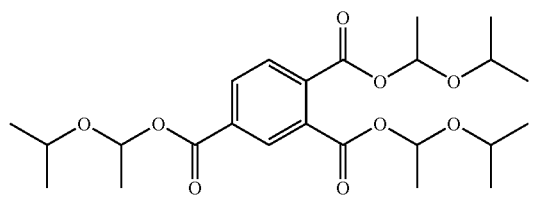

B-1

The radiation curable resins are generally classified into radical curable resins and cation curable resins. As the curing ingredients of the radical curable resin, compounds having several radical polymerizable groups in the molecule are used and, as typical examples, those compounds having 2 to 6 acrylic esters in the molecule referred to as polyfunctional acrylate monomer and, compounds having plural acrylate ester groups in the molecule referred to as urethane acrylate, polyester acrylate and epoxy acrylate are used. A typical curing method of the radical curable resin includes a method of irradiating electron beams and a method of irradiating UV-rays. Usually, in the method of irradiating the UV-rays, a polymerization initiator that generates radicals by UV-ray irradiation is added. In a case of adding a polymerization initiator that generates radicals by heating, the resin can be used as the thermosetting resin. As the curing ingredient of the cation curable resin, compounds having several cation polymerizable groups in the molecule are used and the typical curing method includes a method of adding photo-acid generator that generates an acid by the irradiation of UV-rays and curing the resin under the irradiation of the UV-rays. Examples of the cation polymerizable compound include, compounds containing ring-opening polymerizable groups such as epoxy group or compounds containing vinyl ether groups.

In the invention, the thermosetting resin and the radiation-curable resin may be used each by plurality of kinds in admixture, or the thermosetting resin and the radiation-curable resin may be used in combination. Further, a crosslinkable resin and a polymer not having crosslinkable groups may be used in admixture.

Further, crosslinkable groups can be introduced into the polyarylate used in the invention and the crosslinkable group may be present in any of the portions, that is, at the end of the polymer main chain, on the polymer side chain, or in the polymer main chain. In this case, crosslinking can be conducted without using the general-purpose crosslinkable resin described above in combination.

The plastic film of the invention can contain metal oxides and/or metal composite oxides, and metal oxides obtained by sol-gel reaction. In this case, heat resistance and solvent resistance can be provided in the same manner as in the crosslinkable resin described above. Further, resin modifiers such as plasticizer, die and pigment, antistatic agent, UV-ray absorbent, antioxidant, fine organic particles, peeling promotor, leveling agent, lubricant, etc. may be added optionally within a range not deteriorating the effect of the invention.

In a case of using the gas barrier film of the invention, for example, to the application use of liquid crystal display, it is preferred that the plastic substrate comprises an amorphous polymer so as to attain an optical uniformness. Further, with an aim of controlling the retardation (Re) and the wavelength dispersion thereof, resins having inherent birefringence of different signs may be combined or resins of large (or small) wavelength dispersion may be combined.

Film properties of the plastic substrate used in the gas barrier film of the invention are to be described lager.

The degree of curl at 23° C. and 60% relative humidity of the plastic substrate of the invention is preferably from −10 to 10. Further, the thickness of the plastic substrate is, preferably, from 5 to 300 μm, more preferably, from 40 μm to 200 μm and, further preferably, from 50 μm to 150 μm. Further, the scattering of the thickness of the plastic substrate is preferably within ±3%.

The transparency of the plastic substrate is, preferably, from 80 to 99.5% and, more preferably, from 90 to 99.5%. Further, haze of the plastic substrate is, preferably, from 0.005 to 5%, more preferably, from 0.005 to 3% and, further preferably, from 0.005 to 1%.

Further, Re of the plastic substrate is, preferably, from 0 to 70 nm. Rth of the plastic substrate is preferably, from 0 to 700 nm. Further, the scattering of Re and Rth is, preferably, within ±3%.

Evaluation for optical characteristics was conducted after controlling the humidity of the plastic film substrate at 25° C.

and 60% relative humidity for 24 hours, by using an automatic birefringence meter (KOBRA-21ADH: manufactured by Oji Scientific Instrument Co.), at 25° C. and 60% relative humidity, and calculating the retardation value (Re) within a phase difference plane at a wavelength of 590 nm in the direction perpendicular to the film surface and in the direction inclined from +50° to −50° at each 10° step from the normal line to the film surface with the phase retardation axis as an axis of rotation, and the retardation value (Rth) in the direction of the film thickness.

The residual amount of the solvent in the plastic substrate is, preferably, 1 mass % or less.

The water content in the plastic substrate is, preferably, 1 mass % or less. Further, the modulus of elasticity of the plastic substrate is, preferably, from 1 to 7 GPa. Further, the elongation rate of the plastic substrate is, preferably, from 10 to 70%.

The tensile strength of the plastic substrate is, preferably, from 5 to 500 MPa. Further, Tg of the plastic substrate is, preferably, 250° C. or higher. Further, the heat shrinkage of the plastic substrate is, preferably, from −2 to 2%.

Further, the angle of contact to water of the surface of the plastic substrate is, preferably, from 5 to 90°. Further, the number of brilliance points with a diameter of 0.01 mm or more is, preferably, 200 N/cm$^2$ or less for the plastic substrate in a case of placing an optical film between two polarization plates arranged in a cross-nicol state and applying a light to the side of one of the polarization plates and observing the light on the side of the other polarization plate.

(Constitution of Gas Barrier Film)

The gas barrier film of the invention has a structure having a barrier layer comprising at least one layer of inorganic material and at least one organic layer alternately on a plastic substrate. So long as such a structure is present, it may also has other layers unless the effect of the invention is not impaired.

For example, another layer may be present between a laminate comprising the barrier layer and the organic layer and a plastic substrate or on the surface of the laminate. Specifically, a known primer layer or inorganic thin film layer may be formed between a laminate comprising the barrier layer and the organic layer, and a substrate film. Further, various function layers may also be formed, for example, above or the uppermost of the laminate comprising the barrier layer and the organic layer. Examples of the function layer include, an optical function layer such as anti-reflection layer, anti-dazzling layer, optical compensation layer, polarization film, liquid crystal layer, color filter, UV-absorbing layer, and light-take out efficiency improving layer, physical function layer such as hard coat layer (curable resin layer), stress relaxation layer, etc., electric function layer such as antistatic layer (conductive layer), etc., anti-clouding layer, anti-contamination layer, printed layer, and easy adhesion layer. Particularly, the antistatic layer is formed preferably with a view point of providing high barrier performance stably. Further, the materials used for the layers include various materials such as surfactant, sliding agent, matting agent, antistatic agent, etc.

The bas barrier film of the invention has extremely high barrier performance since the surface of the substrate plastic is smooth. The oxygen permeability of the gas barrier film of the invention at 38° C. and 90% relative humidity is 0.05 ml/m$^2$/day/atm or less, preferably, 0.02 or less, more preferably, 0.01 or less and, particularly preferably, 0.005 or less. The steam permeability of the gas barrier film of the invention at 38° C. and 90% relative humidity is 0.05 g/m$^2$/day or less, preferably, 0.02 or less, more preferably, 0.01 or less and, particularly preferably, 0.005 or less.

(Barrier Layer Comprising Inorganic Material)

The barrier layer constituting the gas barrier film of the invention is a layer containing an inorganic material and improving the barrier performance. The ingredient of inorganic materials contained in the barrier layer is not particularly restricted and, for example, oxides, nitrides, or oxynitrides containing one or more of Si, Al, In, Sn, Zn, Ti, Cu, Ce, Ta, etc. can be used.

For making the steam barrier property and the high transparency compatible, it is preferred to use a silicon oxide or silicon oxynitride for the barrier layer. The silicon oxide is represented as $SiO_x$ and, for example, in a case of using $SiO_x$ for the inorganic material layer, it is preferably: $1.6<x<1.9$ in order to make the good steam barrier property and high light transmittance compatible. The silicon oxynitride is represented as $SiO_xN_y$, and the ratio for x and y is preferably: $1<x<2, 0<y<1$ as an oxygen rich film in a case of attaching an importance to the improvement of the adhesion and preferably: $0<x$ N $0.8$, and $0.8<y<1.3$ as a nitrogen rich film in a case of attaching an importance to the improvement of the steam barrier property.

The barrier layer of the invention may be formed by any method so long as the method can form an aimed thin film and, for example, sputtering method, vacuum vapor deposition method, ion plating method, plasma CVD method, etc. are suitable and the film can be formed by the methods as described in JP No. 3,400,324, and JP-A Nos. 2002-322561, and 2002-361774.

The thickness of the barrier layer is not particularly limited. In a case where it is excessively thick, cracks may possibly be caused due to bending stress and, in a case where the layer is excessively thin, since the film is distributed in an island shape, and the steam barrier property tends to be worsened in both of the cases. Accordingly, the thickness of each of the barrier layers is, preferably, from 5 nm to 1,000 nm, more preferably, from 10 nm to 1,000 nm, and, most preferably, from 10 nm to 200 nm.

In the gas barrier film of the invention, two or more barrier layers may be formed and each of the barrier layers may have a composition identical with each other or may have different compositions, with no particular restriction.

(Organic Layer)

The gas barrier film of the invention also preferably had an organic layer. The organic layer is formed for improving the fragility and the barrier property of the barrier layer comprising the inorganic material, by one or more layer in adjacent therewith. The barrier layer and the organic layer are laminated alternately.

The organic layer can be formed by using, for example, (1) a method of utilizing an inorganic oxide layer prepared by using a sol-gel method, or (2) a method of laminating an organic material by coating or vapor depositing and then curing the same with UV-rays or electron beams. Alternatively, the methods (1) and (2) may be used in combination and, for example, an inorganic oxide layer is prepared after forming a thin film by the method (1) on the resin film, and then a thin film may be formed by the method in (2) above. The methods are to be described successively.

(1) Sol-Gel Method

In the sol-gel method, a metal alkoxide is hydrolyzed or polycondensated, preferably, in a solution or in a coating film to obtain a dense thin film. In this case, a resin may be used in combination to provide an organic-inorganic hybrid material.

The metal alkoxide used in the sol-gel method includes, alkoxy silanes and/or metal alkoxides other than the alkoxy silanes. As the metal alkoxides other than the alkoxy silanes, zirconium alkoxide, titanium alkoxide, and aluminum alkoxide are preferred.

The polymer used in combination in the sol-gel reaction preferably has hydrogen bond forming groups. Examples of the resin having the hydrogen bond forming groups include polymers having hydroxyl groups and derivatives thereof (polyvinyl alcohol, polyvinyl acetal, ethylene-vinyl alcohol copolymer, phenol resin, methylol melamine etc. and derivatives thereof); polymer having carboxyl groups and derivatives thereof (homopolymer or copolymers containing units of polymerizable unsaturated acids such as poly(meth) acrylic acid, maleic acid anhydride, and itaconic acid, esterifying products of the polymers (homopolymers or copolymers containing units, for example, of vinyl esters such as vinyl acetate, and (meth)acrylic acid esters such as methyl methacrylate); polymers having etheric bonds (polyalkylene oxide, polyoxyalkylene glycol, polyvinyl ether, silicon resin, etc.); polymers having amide bonds (N-acylation products of polyoxazoline or polyalkylene imine having >N(COR)— bonds (in which R represents a hydrogen atom, an alkyl group which may have a substituent, and an aryl group which may have a substituent)); polyvinyl pyrrolidone having >NC(O)— bonds and derivatives thereof; polyurethane having urethane bonds; and polymers containing urethane bonds.

Further, an organic/inorganic hybrid material can also be prepared by using a monomer together in the sol-gel reaction and polymerizing the monomer during or after the sol-gel reaction.

In the sol-gel reaction, the metal alkoxide is hydrolyzed and polycondensated in water and an organic solvent and a catalyst is used preferably in this case. As the catalyst for the hydrolysis, acid (organic or inorganic acid) is generally used.

The amount of the acid used is from 0.0001 to 0.05 mol and, preferably, from 0.001 to 0.01 mol per 1 mol of the metal alkoxide (alkoxy silane+other metal alkoxide in a case of containing the alkoxy silane and other metal alkoxide). After hydrolysis, a basic compound such as an inorganic base or amine is added to control the pH around a neutral pH to promote polycondensation.

Further, other sol-gel catalysts such as metal chelate compounds having Al, Ti, and Zr as the center metal, organic metal compounds such as tin compound, metal salts such as alkali metal salts of organic acids, etc. can also be used together.

The ratio of the sol-gel catalyst in the composition is, preferably, from 0.01 to 50 mass %, more preferably, from 0.1 to 50 mass % and, further the preferably, from 0.5 to 10 mass % based on the alkoxy silane as the starting material for the sol solution.

Then, the solvent used for the sol-gel reaction is to be described. The solvent uniformly mixes each of the ingredients in the sol solution, controlling the solid contents of the composition and, at the same time, making them adaptable to various coating methods thereby improving the dispersion stability and the store stability of the composition. The solvents have no particular restriction so long as they can attain the purpose described above. Preferred examples of the solvent include, for example, water and organic solvents highly miscible with water.

With an aim of controlling the rate of the sol-gel reaction, the metal alkoxide may be stabilized by the addition of an organic compound capable of multi-dentate coordination. Examples of the organic compounds capable of multi-dentate coordination include β-diketone and/or β-keto esters, as well as alkanol amines.

Specific examples of the β-diketones and/or β-keto esters include acetyl acetone, methyl acetoacetate, ethyl acetoacetate, n-propyl acetoacetate, i-propyl acetoacetate, n-butyl acetoacetate, sec-butyl acetoacetate, tert-butyl acetoacetate, 2,4-hexane dione, 2,4-heptane dione, 3,5-heptane dione, 2,4-octane dione, 2,4-nonane dione, 5-methyl-hexane-dione, etc. Among them, ethyl acetoacetate and acetyl acetone are preferred and, acetyl acetone is particularly preferred. The β-diketones and/or β-keto esters may be used each alone or in admixture of two or more of them.

The compounds capable of multi-dentate coordination can also be used with an aim of controlling the reaction rate in a case of using the metal chelate compound as the sol-gel catalyst.

The method of coating the sol-gel reaction composition is to be described below. The sol solution can form a thin film on a transparent film by a coating method such as curtain flow coating, dip coating, spin coating, or roll coating. In this case, hydrolysis may be conducted at the timing in any stage during manufacturing step. For example, a method of previously hydrolyzing and partially condensating a liquid of a necessary composition to prepare an aimed sol solution and coating and drying the same, a method of preparing a solution of a necessary composition, coating and drying the same while hydrolyzing and partially condensating the same, a method of coating and primary drying and subsequently coating additionally a water-containing solution necessary for hydrolysis, thereby causing hydrolysis can be adopted suitably. Further, while various modes can be adopted for the coating method, it is preferably adopted a method of controlling the discharge flow rate so as to provide a necessary coating amount for each of a lower layer coating solution and an upper layer coating solution by a slide geezer having a multi-stage of discharge ports and continuously placing and drying the thus formed multi-layer stream on a support (simultaneous stacked layer coating method) in a case where the importance is attached to the productivity.

The drying temperature after coating is, preferably, from 150 to 350° C., more preferably, from 150 to 250° C., and, further preferably, from 150 to 200° C.

For making the film after coating and drying more dense, energy rays may also be irradiated. While there is no particular restriction on the kind of the irradiation rays, irradiation of UV-rays, electron beams, or microwaves can be used particularly preferably while considering the deformation of the support and the effect to the deformation. The irradiation intensity is from 30 mJ/cm$^2$ to 500 mJ/cm$^2$ and, particularly preferably, from 50 mJ/cm$^2$ to 400 mJ/cm$^2$. A temperature from the room temperature to the deformation temperature of the support can be adopted with no restriction for the irradiation temperature and it is, preferably, from 30° C. to 150° C., and, particularly preferably, from 50° C. to 130° C.

(2) Method of Laminating Organic Material by Coating or Vapor Deposition and then Curing the Same by UV-Rays or Electron Beams A method of forming an organic layer comprising a polymer obtained by crosslinking monomers as the main ingredient is to be described. The monomer used in the method has no particular restriction so long as the monomer contains a group capable of crosslinking by UV-rays or electron beams, and use of a monomer having an acryloyl or methacryloyl group, or ocetane group is preferred. For example, it is preferred to use, as the main ingredient, a polymer obtained by crosslinking monomers having 2 or higher functional acryloyl group or methacryloyl group among epoxy(meth)acrylate, uretane(meth)acrylate, isocyanuric acid (meth)acrylate, pentaerythritol(meth)acrylate, trimethylolpropane (meth)

acrylate, ethylene glycol(meth)acrylate, and polyester (meth) acrylate. Two or more kinds of monomers having di- or higher functional acryloyl or methacryloyl groups may be used in admixture, or mono-functional (meth)acrylates may be used in admixture.

Further, as the monomer having the octane group, it is preferred to use monomers having structures as described by the formulae (3) to (6) in JP-A No. 2002-356607. In this case, the monomers may optionally be mixed.

With the view point of the heat resistance and the solvent resistance required in the application use of displays, it is more preferred to use, as the main ingredient, isocyanuric acid acrylate, epoxy acrylate or urethane acrylate having a high degree of crosslinking and a glass transition temperature of 200° C. or higher. The thickness of the organic layer is not particularly restricted and it is, preferably, from 10 nm to 5,000 nm, more preferably, from 10 nm to 2000 nm and, most preferably from 10 nm to 5,000 nm. In a case where the organic layer is excessively thin, since it is difficult to obtain uniformness for the thickness, structural defects in the inorganic layer can not be covered efficiently by the organic layer and the barrier property is not sometimes improved. On the other hand, in a case where the organic layer is excessively thick, since cracks tends to occur in the organic layer by external forces such as bending, this may sometimes result in a disadvantage of lowering the barrier property. The method for forming the organic layer includes a coating method, a vacuum film deposition method, etc. The vacuum film deposition method has no particular restriction and a film forming method such as vapor deposition or plasma CVD is preferred, and ohmic heating vapor deposition method capable of easily controlling the film deposition speed of the organic material monomer is more preferred. While the monomer crosslinking method has no particular restriction, crosslinking by electron beams or UV-rays is preferred in view of easy attachment in a vacuum vessel and rapid polymerization by the crosslinking reaction.

In the case of forming the film by the coating method, various coating methods used so far, for example, spray coating, spin coating, or bar coating can be used.

(Undercoat Layer)

In the gas barrier film of the invention, for improving the adhesion between the plastic substrate and the layer formed thereon, one or more undercoat layer (adhesion layer) may be formed between them. Before forming the undercoat layer on the plastic substrate, some or other surface treatment may be applied to the plastic substrate. A single layer method of forming a single undercoat layer or a stacked layer coating method of forming two or more undercoat layers may be applied to the plastic substrate.

In the single layer method, good adhesion is often attained by swelling the plastic substrate and cause interface mixing with the material for the undercoat layer. The undercoated polymer used in this case includes, for example, water soluble polymer, cellulose acylate, latex polymer, and water soluble polyester. The water soluble polymer includes gelatin, gelatin derivatives, casein, agar, sodium alginate, starch, polyvinyl alcohol, polyacrylic acid copolymer, maleic acid anhydride copolymer, etc. and the cellulose acylate includes, carboxymethyl cellulose and hydroxymethyl cellulose. The latex polymer includes vinyl chloride-containing copolymer, vinylidene chloride-containing copolymer, acrylic acid ester containing copolymer, vinyl acetate containing copolymer, and butadiene containing copolymer.

In a case of using the stacked layer coating method, a preferred example comprises a mode of forming a layer in good adhesion with a plastic substrate as a first layer (hereinafter simply referred to as a first undercoat layer) and coating thereon a layer in good adhesion with a layer to be formed thereon as a second layer (hereinafter simply referred to as a second undercoat layer).

For the under coating first layer in the stacked coating method, copolymers starting from monomers selected from vinyl chloride, vinylidene chloride, butadiene, methacrylic acid, acrylic acid, itaconic acid and maleic acid anhydride, as well as oligomers or polymers such as polyethylene imine, epoxy resin, grafted gelatin and nitrocellulose can be used (they are detailed, for example, in E. H. Immergut, Polymer Handbook, IV187-131, Interscience Pub. New York, 1966, etc.).

In the undercoat layer, organic or inorganic fine particles can be incorporated as a matting agent to such an extent as not substantially impairing the transparency, etc. of the function layer. As the matting agent of fine inorganic particles, silicon dioxide ($SiO_2$), titanium dioxide ($TiO_2$), calcium carbonate, and magnesium carbonate can be used. As the matting agent of fine organic particles, polymethyl methacrylate, cellulose acetate propionate, polystyrene, those soluble to the processing solution described in U.S. Pat. No. 4,142,894, and polymers described in U.S. Pat. No. 4,396,706 can be used. The average grain size of the fine particle matting agent is, preferably, from 0.01 to 10 µm. More preferably, it is from 0.05 to 5 µm. Further, the content thereof is, preferably, from 0.5 to 600 mg/m$^2$ and, more preferably, from 1 to 400 mg/m$^2$.

The undercoat solution can be coated by a generally well-known coating method, for example, dip coating, air knife coating, curtain coating, roller coating, wire bar coating, gravure coating, slide coating, or an extrusion coating method using the hopper described in U.S. Pat. No. 2,681,294.

(Primer Layer·Inorganic Thin Film Layer)

In the gas barrier film of the invention, a primer layer or an inorganic thin film layer can be formed between the laminate comprising the barrier layer and the organic layer, and the substrate film.

Known primer layer or inorganic thin film layer can be formed. As the primer layer, for example, acrylic resin, epoxy resin, urethane resin, silicone resin, etc. can be used. In the gas barrier film of the invention, an organic/inorganic hybrid layer can also be formed as the primer layer. The inorganic thin film layer includes a vapor deposited inorganic layer and a dense inorganic coating thin film by a sol-gel method. The vapor deposited inorganic layer includes vapor deposition layers of silica, zirconia, and alumina. The vapor deposited inorganic layer can be formed by a vacuum vapor deposition method, a sputtering method, etc.

(Antistatic Layer)

The gas barrier film of the invention preferably has an antistatic layer (conductive layer). The antistatic layer is formed particularly preferably to the rear face of the gas barrier film (surface not formed with the barrier layer and the organic layer).

The antistatic layer provides a function of preventing static charges upon handling the gas barrier film and, specifically, this is attained by providing a layer containing an ion conductive material or fine conductive particles. The ion conductive material is a material showing electroconductivity and containing ions as electricity carrying support and includes, for example, ionic polymeric compounds.

The ionic polymeric compounds include, for example, anionic polymeric compounds as described in each of JP-B Nos. 49-23828, 49-23827, and 47-28937; ionene type polymers having dissociation groups in the main chain as described in JP-B No. 55-734, JP-A No. 50-54672, JP-B Nos. 59-14735, 57-18175, 57-18176, 57-56059, etc.; cationic pendant type polymers having cationic dissociation groups in the side chain as described in each of JP-B Nos. 53-13223, 57-15376, 53-45231, 55-145783, 55-65950, 56-67746, 57-11342, 57-19735, 58-56858, JP-A No. 61-27853, and JP-B No. 62-9346.

Among them, preferred are those conductive materials in the form of fine particles, which are finely dispersed and added to the resin described above and preferred conductive material used for them desirably contain fine conductive particles comprising metal oxides or composite oxides thereof, and ionene conductive polymer particles as described in JP-A No. 9-203810 or quaternary ammonium cation conductive polymer particles having inter-molecular crosslinking. A preferred grain size is within a range from 5 nm to 10 μm and, more preferred range depends on the type of the fine particles to be used.

Examples of metal oxides as the fine conductive particles include preferably $ZnO$, $TiO_2$, $SnO_2$, $Al_2O_3$, $In_2O_3$, $SiO_2$, $MgO$, $BaO$, $MoO_2$, and $V_2O_5$, or composite oxides thereof and, particularly preferably, $ZnO$, $TiO_2$, and $SnO_2$. As examples of containing hetero atoms, addition of Al, In, etc. to ZnO, addition of Nb, Ta, etc. to $TiO_2$, and addition of Sb, Nb, halogen elements, etc. to $SnO_2$ are effective. The addition amount of the hetero atoms is, preferably, within a range from 0.01 to 25 mol% and, particularly preferably, within a range from 0.1 to 15 mol %.

The volumic resistivity of the metal oxide powder having the conductivity is $10^7$ Ωcm or less, particularly, $10^5$ Ωcm or less, and it is preferred that a powder having a specific structure with the primary grain size of from 100 Å to 0.2 μm and the major diameter in the higher dimensional structure of from 30 nm to 6 μm is contained in an amount from 0.01 to 20% by volume to the anti-static layer.

Since the crosslinked cationic conductive polymer as the dispersible particle polymer can provide cationic ingredient at high concentration and high density in the particle, the polymer has a feature of not only having excellent conductivity but also showing no deterioration of the conductivity even at a low relative humidity, providing high film strength because of good adhesion between particles to each other in the course of film formation after coating irrespective of high dispersion in the dispersed state between each of the particles, as well as showing excellent adhesion also with other material (for example, plastic substrate) and excellent in chemical resistance.

The dispersible particle polymer as the crosslinkable cationic conductive polymer used for the antistatic layer generally has a grain size of about 10 nm to 1000 nm and, preferably, a grain size within a range from 0 nm to 300 nm. The dispersible particle polymer used herein is a polymer that appears as a transparent or slightly clouded solution under visual observation but appears as a granular dispersion under electron miscroscopic observation. By the use of a coating solution composition not substantially containing dusts (obstacles) larger than the grain size corresponding to the film thickness of the upper layer for the underlayer coating solution composition, troubles caused by the obstacles in the upper layer can be prevented.

The ratio between the fine particles and the resin is preferably from 0.5 to 4 mass parts of the resin based on 1 mass part of the fine particles with a view point of close adhesion and it is particularly preferably from 1 to 2 mass parts of the resin based on 1 mass part of fine particles in view of the close adhesion after irradiation of UV-rays. Furthermore, organic electroconductive organic compounds can also be used. For example, they include polythiophene, polypyrrole, polyaniline, polyacetylene, polyphosphazene, etc. They are used preferably as a complex with polystyrene sulfonic acid or perchloric acid as an acid donating material.

The resins usable herein include, for example, cellulose derivatives such as cellulose diacetate, cellulose triacetate, cellulose acetate butyrate, cellulose acetate phthalate, or cellulose nitrate. Polyesters such as polyvinyl acetate, polystyrene, polycarbonate, polybutylene terephthalate, or co-polybutylene/tere/isophthalate, polyvinyl alcohol derivatives such as polyvinyl alcohol, polyvinyl formal, polyvinyl acetal, polyvinyl butyral, or polyvinyl benzal, norbornene polymers containing norbornene compounds, acrylic resins such as polymethyl methacrylate, polyethyl methacrylate, polypropyl methacrylate, polybutyl methacrylate, and polymethyl acrylate, or copolymers of acrylic resin with other resin, with no particular restriction to them. Among all, the cellulose derivatives or acrylic resins are preferred and, the acrylic resins are used most preferably.

As the resin used for the resin layer such as the anti-static layer, the thermoplastic resins having a mass average molecular weight of over 400,000 and a glass transition temperature of from 80 to 110° C. described above are preferred in view of the optical characteristics and the surface quality of the coating layer.

The glass transition temperature can be determined according to the method described in JIS K7121. The resin used herein is, preferably, 60 mass % or more and, more preferably, 80 mass % or more for the entire resin used in the lower layer, and an active ray curable resin or a thermosetting resin can be added optionally. The resins are coated as a binder in a state dissolved in the appropriate solvent described above.

As the coating solution composition for coating the antistatic layer, the following solvents are used preferably. As the solvent, hydrocarbons, alcohols, ketones, esters, glycol ethers and other solvents can be used by properly mixing them, with no particular restriction to them.

Among the solvents, solvents of lower boiling point tend to condensate the water content in air by evaporation and tend to intake the water content in the coating solution composition during the solution preparation step and the coating step. Particularly, they are liable to undergo the effect by the increase of external humidity during rainfall, and the effect becomes remarkable in a circumstance at a relative humidity of 65% or higher. The effect particularly increases in a case where it takes a long time for the dissolution of the resin in the solution preparation step, the coating solution composition is exposed to air for long time in the coating step, or in a case where the area of contact between the coating solution composition and air is large.

The hydrocarbons described above include benzene, toluene, xylene, hexane, and cyclohexane. The alcohols include, methanol, ethanol, n-propyl alcohol, isopropyl alcohol, n-butanol, 2-butanol, tert-butanol, pentanol, 2-methyl-2-butanol, and cyclohexanole. The ketones include, acetone, methyl ethyl ketone, methyl isobutyl ketone, and cyclohexanone. The esters include, methyl formate, ethyl formate, methyl acetate, ethyl acetate, isopropyl acetate, amyl acetate, ethyl lactate, and methyl lactate. Glycol ethers (C1-C4) include methyl cellosolve, ethyl cellosolve, propylene glycol monomethyl ether (PGME), propylene glycol monoethyl ether, propylene glycol mono-n-propyl ether, propylene glycol monoisopropyl ether, propylene glycol monobutyl ether, or propylene glycol mono(C1-C4) alkyl ether esters include propylene glycol monomethyl ether acetate and propylene glycol monoethyl ether acetate. Other solvents include, for example, N-methylpyrrolidone. They are not particularly restricted, and solvents formed by properly mixing them can also be used preferably.

The coating solution composition can be coated to a dry film thickness of from 0.1 to 10 µm by a method, for example, of doctor coating, extrusion coating, slide coating, roll coating, gravure coating, wire bar coating, reverse coating, curtain coating, extrusion coating, or an extrusion coating using the hopper described in U.S. Pat. No. 2,681,294. Usually, the composition is coated to provide a dry film thickness, preferably, from 0.1 to 1 µm.

(Surfactant)

A surfactant can be used in the gas barrier film of the invention.

The surfactant is classified, for example, into dispersing agent, coating agent, wetting agent, antistatic agent, etc. depending on the purpose of use and such purposes can be attained by properly using the surfactants to be described later. As the surfactant, any of nonionic and ionic (anionic, cationic, betaine) surfactants can be used. Further, fluoro surfactants are also used preferably as the coating agent or antistatic agent in an organic solvent. There is no particular restriction on the layer in which the surfactant is to be used. In a case of utilizing the gas barrier film of the invention for the optical application, the surfactant can be used, for example, in undercoat layer, intermediate layer, orientation control layer, refractive index control layer, protective layer, contamination proof layer, adhesive layer, back coating layer, and a back layer. The amount of use is not particularly restricted so long as this is an amount necessary for attaining the purpose and, generally, it is, preferably, from 0.0001 to 5 mass % and more preferably, 0.0005 to 2 mass % based on the mass of the layer for which the surfactant is added. The coating amount in this case is, preferably, from 0.02 to 1000 mg and, more preferably, from 0.05 to 200 mg per 1 $m^2$.

Preferred nonionic surfactants are surfactants having polyoxyethylene, polyoxypropylene, polyoxybutylene, polyglycidyl or sorbitan as a nonionic hydrophilic groups and, specifically, include polyoxyethylene alkyl ether, polyoxyethylene alkyl phenyl ether, polyoxyethylene polyoxy propylene glycol, polyhydric alcohol fatty acid partial ester, polyoxyethylene polyhydric alcohol fatty acid partial ester, polyoxyethylene fatty acid ester, polyglycerine fatty acid ester, fatty acid diethanol amide, and triethanolamine fatty acid partial ester.

The anionic surfactant is carboxylate salt, sulfate salt, sulfonate salt, phosphate ester salt and includes, typically, fatty acid salt, alkyl benzene sulfonate salt, alkyl naphthalene sulfonate salt, alkyl sulfonate salt, α-olefin sulfonate salt, dialkyl sulfosuccinate salt, α-sulfonated fatty acid salt, N-methyl-N-oleyl tauline, petroleum sulfonate salt, alkyl sulfate salt, sulfated oils and fats, polyoxyethylene alkyl ether sulfate salt, polyoxyethylene alkyl phenyl ether sulfate salt, polyoxyethylene styrated phenol ether sulfate salt, alkyl phosphate salt, polyoxyethylene alkyl ether phosphate salt, and naphthalene sulfonate salt-form aldehyde condensates.

The cationic surfactant includes, for example, amine salt, quaternary ammonium salts, and pyridium salts, and includes, specifically, primary to tertiary aliphatic amine salts, quaternary ammonium salts (tetraalkyl ammonium salts, trialkyl benzyl ammonium salts, alkyl pyridium salts, alkyl imidazolium salts, etc). Amphoteric surfactant includes, for example, carboxy betaine, and sulfo betaine and includes N-trialkyl-N-carboxymethyl ammonium betaine and N-trialkyl-N-sulfoalkylene ammonium betaine.

The surfactants described above are specifically described in "Application of Surfactant" written by Takao Karikome, published from Miyuki Shobo, in Sep. 1, 1980) the amount of the preferred surfactant used in the invention is not particularly restricted and may be such an amount as capable of obtaining an aimed surfactant characteristic. Specific examples of the surfactant are described below but the surfactant usable in the invention are not restricted to them (—$C_6H_4$— represents herein a phenylene group)

WA-1: $C_{12}H_{25}(CH_2CH_2)_{10}OH$
WA-2: $C_9H_{19}$—$C_6H_4$—$(OCH_2CH_2)_{12}OH$
WA-3: Poly(polymerization degree: 20) oxyethylene sorbitan monolaurate ester
WA-4: Sodium dodecylbenzene sulfonate
WA-5: Sodium tri(isopropyl)naphthalene sulfonate
WA-6: Sodium dodecyl sulfate
WA-7 Sodium salt of α-sulfa succinic acid di(2-ethylhexyl) ester
WA-8 Cetyl trimethyl ammonium chloride
WA-9: $C_{11}H_{22}CONHCH_2CH_2N(+)(CH_3)_2$—$CH_2COO(-)$
WA-10: $C_8F_{17}SO_2N(C_3H_7)(CH_2CH_2O)_{16}H$
WA-11: $C_8F_{17}SO_2N(C_3H_7)CH_2COOK$
WA-12: $C_7F_{15}COONH_4$
WA-13: $C_8F_{17}SO_3K$
WA-14: $C_8F_{17}SO_3N(C_3H_7)(CH_2CH_2O)_4(CH_2)_4S_3Na$
WA-15: $C_8F_{17}SO_3N(C_3H_7)$—$(CH_2)_3$—$N(+)(CH_3)_3.I(-)$
WA-16: $C_8F_{17}SO_3N(C_3H_7)CH_2CH_2CH_2(+)(CH_3)_2$—$CH_2COO(-)$
WA-17: $C_8F_{17}CH_2CH_2O(CH_2CH_2O)_{16}H$
WA-18: $C_8F_{17}CH_2CH_2O(CH_2)_3$—$N(+)(CH_3)_3.I(-)$
WA-19: $H(CF_2)_8CH_2CH_2OCOCH_2CH(SO_3Na)COOCH_2CH_2CH_2CH_2CH_2CF_2)_8H$
WA-20: $H(CF_2)_6CH_2CH_2O(CH_2CH_2O)_{16}H$
WA-21: $H(CF_2)_8CH_2CH_2O(CH_2)_3$—$N(+) (CH_3)_3.I(-)$
WA-22: $H(CF_2)_8CH_2CH_2OCOCH_2CH(SO_3K)COOCH_2CH_2CH_2CH_2C_8F_{17}$
WA-23: $C_9F_{17}$—$C_6H_4SO_2N(C_3H_7)(CH_2CH_2O)_{16}H$
WA-24: $C_9F_{17}$—$C_6H_4CSO_2N(C_3H_7)$—$(CH_2)_3$—$N(+)(CH_3)_3. I(-)$ (Water Absorbent)

In the invention, it is particularly preferred to use a water absorbent as shown below in combination. The water absorbent can be selected from compounds, mainly group II metals, having water absorbing function. They can include, for example, BaO, SrO, CaO, and MgO. Further, they can be selected also from metal elements such as Ti, Mg, Ba, and Ca. The grain size of the absorbent particle is, preferably, 100 nm or less and, more preferably, 50 nm or less. The grain size can be controlled by various known methods.

The inorganic compounds described above may also be formed as an independent layer using a vacuum vapor deposition method in the same manner as for the barrier layer comprising the inorganic materials described above. In a case of forming the layer, the thickness is, preferably, from 1 to 100 nm and, more preferably, from 1 to 10 nm. The position for forming the layer can be selected as, for example, between the substrate film and the laminate (barrier layer and organic layer), at the uppermost layer of the laminate and in the laminates. Further, the inorganic compounds may be added to the organic layer or the barrier layer comprising the inorganic material in the laminate. In a case of addition to the barrier layer, a co-vapor deposition method is used preferably.

(Hard Coat Layer)

In the gas barrier film of the invention, a transparent hard coat layer may be provided. As the transparent hard coat layer, an active ray curable resin or thermosetting resin is used preferably. The active ray curable resin layer means a layer comprising, as a main ingredient, a resin cured by irradiation of active rays such as UV-rays or electron beams, or crosslinking reaction. The active ray curable resin typically includes, for example, a UV-ray curable resin and an electron beam curable resin but may be a resin cured by irradiation of active rays other than the UV-rays or electron beams. The UV-ray curable resin include, for example, UV-ray curable acryl urethane resin, UV-ray curable polyester acrylate resin, UV-ray curable epoxy acrylate resin, UV-ray curable polyol acrylate resin, or UV-curable epoxy resin.

Generally, the UV-ray curable acryl urethane resin can be obtained easily by reacting a polyester polyol with an isocyanate monomer or prepolymer to obtain a reaction product and, further, reacting the product with an acrylate monomer having a hydroxyl group such as 2-hydroxy ethyl acrylate, 2-hydroxy ethyl methacrylate (hereinafter only an acrylate is shown assuming that acrylate includes methacrylate), or 2-hydroxy propyl acrylate, which is described, for example, in JP-A No. 59-151110.

Generally, the UV-ray curable polyester acrylate resin is obtained easily by reacting a polyester polyol with 2-hydroxyethyl acrylate or 2-hydroxy acrylate monomer, which is described, for example, in JP-A No. 59-151112.

Specific examples of the UV-ray curable epoxy acrylate resin include those obtained by using epoxy acrylate as an oligomer, adding a reactive diluent and a photo-reaction initiator thereto and reacting them, which are described, for example, JP-A No. 1-105738. For the photo-reaction initiator, one or more of members can be selected from benzoin derivatives, oxyme ketone derivatives, benzophenone derivatives, and thixanton derivatives and used.

Specific examples of the UV-ray curable polyol acrylate resin include trimethylol propane polyacrylate, ditrimethylol propane tetraacrylate, pentaerythritol triacrylate, pentaerythritol tetraacrylate, dipentaerythritol hexaacrylate, and alkyl modified dipentaerythritol pentaacrylate. The resins described above used together with usually known photosensitizers.

The photo-reaction initiators described above can also be used as the photo-sensitizer. They include, specifically, acetophenone, benzophenone, hydroxybenzophenone, Michler's ketone, α-amyloxym ester, thioxantone, etc. as well as derivatives thereof. Further, in the use of the epoxy acrylate type photo-reaction agent, sensitizers such as n-butylamine, triethylamine or tri-n-butyl phosphine can be used.

The photo-reaction initiator or photo-sensitizer contained in the UV-ray curable resin composition excluding the solvent ingredient that evaporates after coating and drying is particularly preferably from 2.5 to 6 mass % based on the composition. In a case where it is less than 2.5%, curing is hindered by the plastisizer and/or UV-absorbent leaching from the resin film to deteriorate the scratch resistance. On the other hand, in a case where the amount exceeds 6 mass %, since the relative amount of the UV-ray curable resin ingredient decreases, the surface quality of the coating film is sometimes rather worsened because of the deterioration of the scratch resistance and the worsening of the coatability.

The resin monomer includes, for example, usual monomers such as methyl acrylate, ethyl acrylate, butyl acrylate, vinyl acetate, benzyl acrylate, cyclohexyl acrylate, and styrene as a monomer having one unsaturated double bond. Further, the monomer having two or more unsaturated double bonds includes ethylene glycol diacrylate, propylene glycol diacrylate, divinyl benzene, 1,4-cyclohexane diacrylate, 1,4-cyclohexyl dimethyl diacrylate, trimethylol propane acrylate, and pentaerythritol tetraacryl ester described above.

The concentration of the solid content in the coating solution composition for the active ray curable resin layer is preferably from 10 to 95 mass % and an appropriate concentration is selected depending on the coating method.

As a light source for forming the cured film layer from the active ray curable resin by photocuring reaction, any of light sources generating UV-rays can be used. For example, low pressure mercury lamp, medium pressure mercury lamp, high pressure mercury lamp, super high pressure mercury lamp, carbon arc lamp, metal halide lamp, and xenone lamp can be used. While the irradiation conditions are different depending on individual lamps, the amount of irradiation light may be from 20 to 10,000 mJ/cm$^2$ and, preferably, from 50 to 2000 mJ/cm$^2$. They can be used for the near UV-ray region to visible light region by using a sensitizer having an absorption maximum in the region. The UV-rays may be irradiated for once or twice or more.

The solvent for coating the active ray curable resin layer is selected properly from the solvents for the coating resin layer described above, for example, from hydrocarbons, alcohols, ketones, esters, glycol ethers, and other solvents or mixtures of them can be used. Preferably, solvents containing 5 mass % or more, more preferably, 5 to 80 mass % of propylene glycol mono(C1-C4) alkyl ether or propylene glycol mono(C1-C4) alkyl ether ester are used preferably.

As the coating apparatus for UV-ray curable resin composition coating solution, known apparatus such as gravure coater, spinner coater, wire bar coater, roll coater, reverse coater, extrusion coater, and air doctor coater can be used. The coating amount as the wet film thickness is, appropriately, from 0.1 to 200 μm and, preferably, from 0.5 to 100 μm. Coating is conducted at a speed, preferably, of 5 to 200 m/min. In a case where the thickness is large, the solution may be coated divisionally by twice or more to form a transparent hard coat layer. UV-rays are irradiated from a light source after coating and drying the UV-ray curable resin composition. The irradiation time is, preferably, from 0.5 sec to 5 min and, more preferably, from 3 sec to 2 min with a view point of curing efficiency for the UV-ray curable resin and the operation efficiency.

The film thickness upon drying of the obtained hard coat layer is, preferably, from 0.2 to 100 um, more preferably, from 1 to 50 μm and, particularly preferably, from 2 to 45 μm.

For the coated layer, fine organic or inorganic particles described above may be added for providing the sliding property. Further, the matting agent described above can also be utilized. Further, as described above, the active ray curable resin layer may also be formed over the resin layer such as the antistatic layer. The antistatic layer or the transparent hard coat layer can be provided each alone or in lamination. Specifically, they may be formed directly or by way of a subbing layer to either one of the surfaces of an optical film with antistatic means, a polarization plate protective film, or a cellulose acylate film as described, for example, in JP-A Nos. 6-123806, 9-113728, and 9-203810.

(Anti-Reflection Layer)

An anti-reflection layer can be formed to the gas barrier film of the invention.

For the anti-reflection layer, various types have been known such as those comprising a single layer or those comprising multi-layers, and those of a structure in which a high refractive index layer and a low refractive index layer are laminated alternately are common as the multi-layered type.

Examples of the constitution include those laminating two layers of high refractive index layer/low refractive layer orderly from the side of the plastic substrate, or those in which three layers of different refractive indexes are laminated in the order of a medium refractive index layer (a layer having a refractive index higher than that of the transparent substrate or the hard coat layer and lower than that of the high refractive index layer)/high refractive index layer/low refractive index layer and, further, those laminating a number of anti-reflection layers are also proposed. Among them, those formed by laminating high refractive index layer/medium refractive index layer/low refractive index layer orderly on a substrate having a hard coat layer are preferred in view of the durability, optical characteristics, cost, and productivity.

An anti-reflection laminate prepared by laminating a high refractive index layer to the surface of a substrate (optionally with provision of a medium refractive index layer) and a low refractive index layer toward air successively and forming an optical interference layer by setting the optical film thickness for the high refractive index layer and the low refractive index layer each to a certain value relative to the wavelength of a light is particularly preferred as the anti-reflection layer. The refractive index and the film thickness can be obtained by calculation based on the measurement of spectral reflectivity.

The degree of the refractive index is substantially determined depending on the metal or the compound contained in the film and, for example, the refractive index is higher for Ti, lower for Si and further lower for F-containing compound and the refractive index is set based on such combination.

For preparing an anti-refection layer by successively laminating a plurality of layers on a transparent substrate, it is possible to adopt a method of coating a composition containing a compound selected from alkoxides of metals such as titanium or zirconium and hydrolysates thereof, active energy ray reactive compounds, and organic solvents, irradiating active energy rays to form a high refractive index layer, coating further thereon a composition for a low refractive index layer containing a low refractive index material and an organic solvent further thereon to form a low refractive index coating film and then applying active energy to form a low refractive index layer. An intermediate refractive index layer may be formed between the high reflective index layer and the low refractive index layer.

A preferred high refractive index layer can be formed by coating a coating solution containing at least one member selected from metal alkoxides not having active energy ray reactive groups and hydrolysates thereof, an active energy ray reactive metal alkoxide compound, preferably, active energy ray reactive compound, and then irradiating an active energy rays to the coated film thereby controlling to an optional refractive index.

Metals for at least one compound selected from the metal alkoxides and partial hydrolysates thereof and the active energy ray reactive metal alkoxide compounds of the formula (II) to be described later used for the high refractive index layer include, Al, Si, Ti, V, Ni, Cu, Zn, Y, Ga, Ge, Zr, In, Sn, Sb, Sr, La, Ta, Tl, W, Ce and Nd. The metal compound of the active energy ray reactive metal alkoxide compound is particularly useful for changing the refractive index of the layer containing them by irradiation of UV-rays. Preferred metals are Al, Si, Ti, V, Zn, Y, Zr, In, Sn, Sr, Ta, Tl, W and Ce, and particularly preferred metals tending to change the refractive index easily are Ti, Zr, Tl, In (as In—Sn complex) and Sr (as Sr—$TiO_2$ complex). While it has been known that Ti is reactive to light, it has not been known to change the refractive index of the layer containing a Ti compound by means of light.

As the metal alkoxide not having active energy ray reactive groups, those of 1 to 10 carbon atoms are preferred and those of 1 to 4 carbon atoms are more preferred. Hydrolysates of metal alkoxides undergo hydrolysis at the alkoxide groups and react as -metal atom-oxygen atom-metal atom- to form a crosslinked structure and form a cured layer.

Examples of the metal alkoxides not having active energy ray reactive groups include $Al(O—CH_3)_3$, $Al(OC_2H_5)_3$, $Al(O\text{-}i\text{-}C_3H_7)_3$, and $Al(O\text{-}n\text{-}C_4H_9)_3$ as examples for Al alkoxide; $Si(OCH_3)_4$, $Si(OC_2H_5)_4$, $Si(O\text{-}i\text{-}C_3H_7)_4$, and $Si(O\text{-}tert\text{-}C_4H_9)_4$ as examples for Si; $Ti(OCH_3)_4$, $Ti(OC_2H_5)_4$, $Ti(O\text{-}n\text{-}C_3H_7)_4$, $Ti(O\text{-}i\text{-}C_3H_7)_4$, and $Ti(O\text{-}n\text{-}C_4H_9)_4$, dimer to decanomer of $Ti(O\text{-}n\text{-}C_3H_7)_4$, dimer to decanomer of $Ti(O\text{-}i\text{-}C_3H_7)_4$, and dimer to decanomer of $Ti(O\text{-}n\text{-}C_4H_9)_4$ as examples for Ti; $VO(OC_2H5)_3$ as an example for V; $Zn(OC_2H_5)_2$ as an example for Zn; $Y(OC_4H_9)_3$ as an example for Y; dimer to decanomer of $Zr(OCH_3)_4$, $Zr(OC_2H_5)_4$, $Zr(O\text{-}n\text{-}C_3H_7)_4$, $Zr(O\text{-}i\text{-}C_3H_7)_4$, $Zr(O\text{-}n\text{-}C_4H_9)_4$, $Zr(O\text{-}n\text{-}C_4H_9)_4$ as examples for Zr; $In(O\text{-}n\text{-}C_4H_9)_3$ as an example for In; $Sn(O\text{-}n\text{-}C_4H_9)_4$ as an example for Sn; $Ta(OCH_3)_5$, $Ta(O\text{-}n\text{-}C_3H_7)_5$, $Ta(O\text{-}i\text{-}C_3H_7)_5$, and $Ta(O\text{-}n\text{-}C_4H_9)_5$ as examples for Ta; $W(OC_2H_5)_6$ as an example for W; and $Ce(OC_3H_7)_3$ as an example for Ce. They can be used each alone or two or more of may be used in combination. Among them, $Ti(O\text{-}n\text{-}C_3H_7)_4$, $Ti(O\text{-}i\text{-}C_3H_7)_4$, $Ti(O\text{-}n\text{-}C_4H_9)_4$, dimmer to decanomer of $Ti(O\text{-}n\text{-}C_3H_7)_4$, and dimmer to decanomer of $Ti(O\text{-}n\text{-}C_4H_9)_4$; $Zr(O\text{-}i\text{-}C_3H_7)_4$, and $Zr(O\text{-}n\text{-}C_4H_9)_4$,; $Si(OC_2H_5)_4$, and $Si(O\text{-}i\text{-}C_3H_7)_4$ are particularly preferred.

The metal alkoxide may also be used after hydrolysis (partial or complete hydrolysis). Hydrolysates can be obtained by hydrolyzing the metal alkoxide described above for example in an organic solvent under the presence of an acidic catalyst or basic catalyst. For the acidic catalyst, mineral acid such as nitric acid or hydrochloric acid or organic acid such as oxalic acid or acetic acid are preferred, for example, and the basic catalyst includes, for example, ammonia.

In the layer containing the metal alkoxide compound, the metal alkoxide per se is self-condensated and crosslinked to form network bonding. For promoting the reaction, a catalyst or a curing agent can be used and they include organic metal compounds such as metal chelate compounds and organic carboxylate salts, organic silicone compound having amino groups, and photo-acid generators. Particularly preferred among the catalysts or curing agents are aluminum chelate compounds and acid generators by light (light acidgenerator). Examples of the aluminum chelate compound include, for example, ethyl acetoacetate aluminum diisopropylate, aluminum tricetyl acetoacetate, alkyl acetoacetate aluminum diisopropylate, aluminum monoacetyl acetonate bisethyl actoacetate, aluminum trisacetyl acetonate, etc. and examples of other light acid generators include benzyltriphenyl phosphonium hexafluorophosphate, or like other phosphonium salts or salts of triphenyl phosphonium hexafluorophosphate.

For the coating solution composition containing the metal alkoxide not having the active energy ray reactive groups and/or hydrolysates thereof to be used, a chelate compound can be added in reaction with β-diketone for store stability of the coating solution, by which a stable coating solution composition can be obtained.

The active energy ray reactive compounds used preferably for the high refractive index layer are preferably those having two or more polymerizable groups such as polymerizable vinyl group, aryl group, acryloyl group, methacryloyl group, isopropenyl group, and epoxy group and forming a crosslinked structure or network structure by the irradiation of active energy rays. Among the active groups, acryloyl group, methacryloyl group and epoxy group are preferred with a view point of the polymerization rate and the reactivity, which are described, for example, in each of JP-A Nos. 59-151110 and 59-151112. Among them, polyfunctional monomer or oligomer are more preferred.

The active energy ray reactive epoxy resin is also used preferably. As the active energy ray reactive epoxy resin, aromatic epoxy compounds (polyglycidyl ether of polyhydric phenol) are preferred. As the active energy ray reactive compound epoxy resin, monoepoxides can be blended and used in accordance with the desired performance in addition to those having two or more epoxy groups in the molecule. The active energy ray reactive compound epoxy resin is polymerized to form a crosslinked structure or network structure not by radical polymerization but by cationic polymerization. This is a preferred active energy ray reactive resin since it does not suffer from the effect of oxygen in the reaction system different from the case of radical polymerization.

Preferred are aromatic halloing salts described in each of JP-A Nos. 50-151996, and 50-158680, VIA group element aromatic onium salt described in each of JP-A Nos. 50-151997, 52-30899, 59-55420, and 55-125105, oxosulfonium salts described in each of JP-A Nos. 56-8428, 56-149402, and 57-192429, aromatic diazonium salts described in JP-B No. 49-17040, and thiopyrillium salts described in U.S. Pat. No. 4,139,655. Further, they include aluminum complexes or photo-decomposable silicon compound type polymerization initiator, etc. The cationic polymerization initiator described above and a photo-sensitizer such as benzophenone, benzoin isopropyl ether or thioxantone can be used together.

Specific examples of the active energy ray reactive metal alkoxides include vinyl trimethoxy titanium, vinyl tri(β-methoxy-ethoxy) titanium, divinyloxydimethoxy titanium, glycidyl oxyethyltriethoxy titanium, γ-acryloyloxy propyltri-n-propyl titanium, γ-methacryloloxy-n-propyltri-n-propyl titanium, di(γ-acryloyloxy-n-propyl)di-n-propyl titanium, acryloyloxy dimethoxyethyl titanium, vinyltrimethoxy zirconium, divinyloxy methoxy zirconium, acroyloxy ethyl triethoxy zirconium, γ-acryloyloxy-n-propyltri-n-propyl zirconium, γ-methacryloyloxy-n-propyltri-n-propyl zirconium, di(γ-acryloyloxy-n-propyl) di-n-propyl zirconium, acroyloxy dimethoxyethyl zirconium, vinyldimethoxy thallium, vinyldi(β-methoxy-ethoxy)thallium, divinyloxy methoxy thallium, acroyloxy ethyl diethoxy thallium, γ-acryloyloxy-n-propyldi-n-propyl thallium, γ-methacryloyloxy-n-propyldi-n-propyl thallium, di(γ-acryloyloxy-n-propyl)-n-propyl thallium, acryloyloxy methoxyethyl thallium, vinyl trimethoxy silane, vinyltri(β-methoxy-ethoxy)silane, divinyloxydimethoxy silane, β-(3,4-epoxycyclohexyl)ethyl trialkoxy silane, acroyloxy ethyl triethoxy silane, glycidyloxy ethyltriethoxy silane, γ-acroyloxy-n-propyltri-n-propyl silane, γ-methacroyloxy-n-propyltri-n-propyl silane, di(γ-acriloyloxy-n-propyl)di-n-propyl silane, and acroyloxidimethoxy ethyl silane.

The behavior in the photopolymerization by the active energy rays to the active energy ray reactive groups used in the high refractive index layer and to the reactive groups of the active energy ray reactive compound used preferably is not substantially different and identical photo-sensitizer, photo-initiator, etc. can be used for the active energy ray compounds.

As active energy rays, any of energy sources for activating compounds can be used with no restriction. For example, UV-rays, electron beams and y-rays can be mentioned, with UV-rays and electron beams being preferred and UV-rays being particularly preferred in that they can be handled easily and can provide high energy easily. As the light source for the UV-rays that photopolymerizes UV-ray reactive compounds, any of light sources generating UV-rays can be used. For example, low pressure mercury lamp, medium pressure mercury lamp, high pressure mercury lamp, super-high pressure mercury lamp, carbon arc lamp, metal halide lamp, and xenone lamp can be used. Further, ArF excimer laser, KrF excimer laser, excimer lamp, synchrotron radiation light, etc. can also be used. While the irradiation condition varies depending on respective lamps, the amount of irradiation light is 50 mJ/m$^2$ or more, preferably, 100 mJ/cm$^2$ or more and, further preferably, 400 mJ/cm$^2$ or more. UV-rays may be irradiated to each of the layers in the anti-reflection multi-layers, or may be irradiated after lamination. With a view point of productivity, it is preferred that the UV-rays are irradiated after lamination of multiple layers. Further, the irradiation is efficiently conducted under the condition at an oxygen concentration of 0.5% or less, which is preferred in view of the curing rate.

Further, electron beams can also be used. The electron beams can include those having an energy of 50 to 1000 keV, preferably, 100 to 300 keV emitted from various types of electron beam accelerators such as a cockroft-walton type, Van de Graff type, resonance transformer type, insulated core transfer type, linear type, dynamitron type, or high frequency type.

The low refractive index layers is usually incorporated with the following low refractive index material containing fluoro atoms or silicon atoms in order to lower the refractive index of the layer. The low refractive index material includes at least one compound selected from compounds formed of fluoro-containing resin and silicate oligomers, and compounds formed of SiO$_2$ sol and reactive organic silicon compound and, particularly, compounds described in JP-A Nos. 7-126552, 7-188582, 8-48935, 8-0100136, 9-220791, 9-272169, etc. are used preferably.

The fluoro-containing resin usable preferably include polymerization products mainly containing fluoro-containing ethylenically unsaturated monomer ingredients and fluoro-containing epoxy compounds.

The fluoro-containing ethylenically unsaturated monomer includes, for example, fluoro-containing alkenes, fluoro-containing acrylate esters, fluoro-containing methacrylate esters, fluoro-containing vinyl ester, and fluoro-containing vinyl ethers. They include fluoro-containing ethylenically unsaturated monomers such as tetrafluoroethylene, trifluoroethylene, vinylidene fluoride, vinyl fluoride, trifluoropropylene, heptafluoropropylene, hexafluoropropylene, 3,3,4,4,5,5,6,6,6-nonafluoro-1-hexene, 3,3,4,4,5,5,6,6,7,7,8,8,8-tridecafluoro-1-octene, 4-ethoxy-1,1,1-trifluoro-3-butene-2-one, pentadecafluorooctyl acrylate, tetrafluoro-3-(pentafluoroethoxy)propyl acrylate, tetrafluoro-3-trifluoromethoxy propyl acrylate, undecafluorohexyl acrylate, nonafluoropentyl acrylate, octafluoropentyl acrylate, pentafluoropropyl acrylate, 2-heptafluorobutoxyethyl acrylate, 2,2,3,4,4,4-hexafluorobutoxy acrylate, trifluoroethyl acrylate, 2-(1,1,2,2-tetrafluoroethoxy)ethyl acrylate, trifluoroixopropyl methacrylate, (2,2,2-trifluoro-1-methyl)ethyl methacrylate, 3-trifluoromethyl-4,4,4-trifluorobutyl acrylate, 1-methyl-2,2,3,3,3-pentafluoropropyl acrylate, 1-methyl-2,2,3,3,4,4,4-heptafluorobutyl acrylate, 2,2,2-trifluoroethyl acrylate, pentafluoropropyl acrylate, 1,1,1,3,3,3-hexafluoroisopropyl acrylate, 2,2,3,3-tetrafluoropropyl acrylate, 2,2,2-trifluoroethyl methacrylate, 2,2,3,3,4,4,4-heptafluorobutyl acrylate, nonafluoropentyl acrylate, undecafluorohexyl acrylate, tridecafluoroheptyl acrylate, pentadecafluorooctyl acrylate, tridecafluorooctyl acrylate, nonadecafluorodecyl acrylate, heptadecafluorodecyl acrylate, hexafluoroisopropyl acrylate, tetrafluoropropyl acrylate, hexafluorobutyl acrylate (acrylates mentioned above may also be methacrylates or α-fluoroacrylates), vinyltrifluoro acetate, vinyl-2,2,2-trifluoro propionate, vinyl-3,3,2,2-hepta butyrate, 2,2,2-trifluoroethylvinyl ether, 1-(trifluoromethyl)ethenyl acetate, allyltrifluoro acetate, allyl-1,1,2,2-tetrafluoroethyl ether, allyl-1,2,3,3,3-hexafluoropropyl ether, ethyl-4,4,4-trifluoro cronate, isopropyl-2,2,2-trifluoroethyl fumarate, isopropyl-pentafluoropropyl fumarate, isopropyl-2,2,3,3,4,4,4-heptafluorobutyl fumarate, isopropyl-2,2,3,3,4,4,5,5,5-nonapropylpentyl fumarate, isopropyl-2,2,3,3,4,4,5,5,6,6,6-undecafluorohexyl fumarate, isopropyl-tridecafluoroheptyl fumarate, isopropyl-pentadecafluorooctyl fumarate, isopropyl-tridecafluorooctyl fumarate, isopropyl-nonadecafluorodecyl fumarate, isopropyl-heptadecafluorodecyl fumarate, isopropyl-2-trifluoromethyl-3,3,3-trifluoropropyl fumarate, isopropyl-3-trifluoromethyl-4,4,4-trifluorobutyl fumarate, isopropyl-1-methyl-2,2,3,3,3-pentafluoropropyl fumarate, isopropyl-1-methyl-heptafluorooctyl fumarate, tert-butylpentyl fluoropropyl fumarate, and tert-butyl-heptafluorobutyl fumarate. However, the compounds usable in the invention are not restricted to them. Further, mating monomers for the copolymerization may or may not contain fluorine.

The monomer copolymerizable with the fluoro-containing monomer includes, for example, ethylene, propylene, butane, vinyl acetate, vinyl ethyl ether, vinyl ethyl ketone, methyl acrylate, methyl methacrylate, ethyl acrylate, propyl acrylate, butyl acrylate, methyl methacrylate, ethyl methacrylate, propyl methacrylate, butyl methacrylate, methyl-α-fluoro acrylate, ethyl-α-fluoro acrylate, propyl-α-fluoro acrylate, butyl-α-fluoro acrylate, cyclohexyl-α-fluoro acrylate, hexyl-α-fluoro acrylate, benzyl-α-fluoro acrylate, acrylic acid, methacrylic acid, α-fluoro acrylic acid, styrene, and styrene sulfonic acid. The monomer usable in the invention is not restricted to them.

The refractive index of the homopolymer comprising the fluoro-containing ethylenically unsaturated monomers is within a range about from 1.33 to 1.42, and the refractive index of the homopolymer comprising copolymerizable monomers not containing fluorine is 1.44 or more. They can be copolymerized at an optional ratio and used as a fluoro-containing resin having an aimed refractive index. Further, the fluoro-containing resin of the invention and the not fluoro-containing resin can be mixed at an optional ratio and used as a resin having an aimed refractive index, in which the fluoro-content of the low refractive index material is, preferably, 50 mass % or more and, particularly preferably, from 60 to 90 mass % while being different depending on the kind. In the case of the fluoro-containing polymer, since the polymer shows favorable solubility to the organic solvent when the fluoro content is within the range described above, it is easy to fabricate, as well as excellent in adhesion relative to the underlying substrate or layer, and a layer having high transparency and low refractive index can be obtained.

As the polymerization initiator for polymerizing fluoro-containing alkene, acrylate, vinyl ester, vinyl ether, etc. to be used, usual radical polymerization initiators can be used. Specific examples of the polymerization initiator include various kinds of radical polymerization initiators, for example, azo-type radical polymerization initiators such as azobis isobutyronitrile, azobiscyclohexane carbonitrile, and azobisvalleronitrile, organic peroxide radial polymerization initiators such as benzoyl peroxide, tert-butyro hydroperoxide, cumene peroxide, and diacyl peroxide, inorganic radical polymerization initiators such as ammonium persulfate, and potassium persulfate, redox type polymerization initiators such as hydrogen peroxide-ammonium ferrous sulfate and ammonium persulfate - sodium metasulfite. Known radical polymerization such as solution polymerization, bulk polymerization, emulsion polymerization, suspension polymerization, or radiation-induced polymerization can be conducted by using them. In this case, it is preferred that the reaction temperature is from 10 to 100° C. and the reaction time is from 1 to 100 hours. The number average molecular weight of the fluoro-containing resin obtained as described above is, preferably, from 1,000 to 300,000. The fluoro-containing epoxy resin as the fluoro-containing resin can be obtained by reacting, for example, the following epoxy compounds by customary methods.

As the fluoro-containing epoxy compound, mono-, di-, tri-, and further oligo-glycidyl ethers of fluoro-alcohols are preferred. Among them, fluoro-containing alkane terminated with diol glycidyl ether include, for example, 2,2-3,3-tetrafluoro-1,4-butane diol diglycidyl ether, and 2,2,3,3,4,4,5,5-octylfluoro-1,6-hexane dioldiglycidyl ether. In addition, a not fluoro-containing epoxy compound may also be used in such a small amount as not increasing the refractive index so much. While the structure of the fluoro-containing epoxy compound used herein has no restriction, it is preferred to restrict the use of epoxy compounds having benzene rings or alicyclic epoxy compounds which increase the refractive index.

Other preferred low refractive index materials include compounds formed of silicate oligomers. The silicate oligomers used for the compounds formed of the silicate oligomers include, for example, teteraalkoxy silanes such as tetramethoxy silane, tetraethoxy silane, tetrapropioxy silane, and tetrabutoxy silane, tetra-2,2,2-trifluoroethoxy silane, tetra-2-fluoroethoxy silane, tetra-2,2,3,3-tetrafluoro-1-propioxy silane, tetra-1,1,1,3,3,3-hexafluoro-2-propioxy silane, tetra-2,2,3,3,3-pentafluoro-1-propioxy silane, tetra-1,3-difluoro-2-propioxy silane, tetra-2,2,3,3,-4,4,4-heptafluoro-1-butoxy silane, tetra-2,2,3,4,4,4-hexafluoro-1-butoxy silane, tetracyclohexyloxy silane, and tetraphenoxy silane. The silicate oligomer can be obtained by hydrolyzing them.

Cured hydrolysates can be obtained by a method, for example, by blending a solvent with hydrolysates obtained by adding a catalyst and water to the tetraalkoxy silane and then adding a curing catalyst and water as described above. As the solvent, it is preferred to use one or more of methanol and ethanol since this is inexpensive and the obtained film has excellent characteristics and favorable hardness. While isopropanol, n-butanol, isobutanol, octanol, etc. can also be used, the hardness of the obtained film tends to be lowered in this case. The amount of the solvent is from 50 to 400 mass parts and, preferably, from 100 to 250 mass parts based on 100 mass parts of partial hydrolysates. The curing catalyst includes acid, alkali, organic metal, metal alkoxide, etc. and the acid, particularly, acetic acid, maleic acid, oxalid acid, fumaric acid, etc. can be used preferably. The content of $SiO_2$ in the silicate oligomer desiably is from 1 to 100% and, preferably, from 10 to 99%. In a case where the $SiO_2$ content is less than 1%, improvement of the durability is no more recognized and the effect of the invention can not be provided.

While the method of forming the silicon layer from the silicate oligomer is not particularly restricted, it can be obtained, for example, by diluting the silicate oligomer with a solvent not deteriorating the optical performance of the optical film, for example, alcohols (such as methanol, ethanol, isopropanol), ethyl acetate, butyl acetate, cellosolve acetate, methylglycol acetate, methoxybutyl acetate, methyl ethyl ketone, methyl isobutylketone cyclohexanone, methylene chloride, toluene, xylene, mineral spirit, cresol, xylenol, or fural and coating the diluted solution to a substrate by a known apparatus such as a bar coater, roll coater, gravure coater, reverse coater, or lip coater and applying a heat treatment.

Other preferred low refractive index material includes compounds formed of $SiO_2$ sol and reactive organic silicon compound that forms the low refractive index layer as an $SiO_2$ gel film by using a sol solution containing the $SiO_2$ sol and the reactive organic silicon compound. The $SiO_2$ sol is prepared by dissolving a silicon alkoxide to an organic solvent suitable to coating and conducting hydrolysis with addition of a predetermined amount of water. The silicon alkoxide used for forming the SiO$_2$ sol include preferably, for example, tetramethoxy silane, tetraethoxy silane, tetraisopropyloxy silane, tetra-n-propioxy silane, tetra-n-butoxy silane, tetra-sec-butoxy silane, tetra-tert-butoxy silane, tetra-pentaethoxy silane, tetrapentaisopropyloxy silane, tetrapenta-n-propioxy silane, tetrapenta-n-butoxy silane, tetrapenta-sec-butoxy silane, tetrapenta-tert-butoxy silane, methyl trimethoxy silane, methyltriethoxy silane, methyltripropioxy silane, methylbutoxy silane, dimethyldimethoxy silane, dimethylethoxy silane, dimethylmethoxy silane, dimethoxyethyxy silane, dimethylpropyloxy silane, dimethylbutpxy silane, methyldimethoxy silane, methyldiethoxy silane, and hexyltrimethoxy silane.

The SiO$_2$ sol can be formed by dissolving the alkyl silicon alkoxide or silicon alkoxide described above into an appropriate solvent. The solvent used includes, for example, alcohols, ketones, and esters such as methyl ethyl ketone, isopropyl alcohol, methanol, ethanol, methyl isobutyl ketone, ethyl acetate, and butyl acetate, halogenated hydrocarbons, aromatic hydrocarbons such as toluene and xylene, or mixtures thereof. The alkyl silicon alkoxide or the silicon alkoxide is dissolved in the solvent described above at a concentration of 0.1 mass % or more and, preferably, from 0.1 to 10 mass % based on the resultant SiO$_2$ assuming that it is hydrolyzed and condensated to 100%. In a case where the concentration of the SiO$_2$ sol is less than 0.1 mass %, the formed sol film can not provide desired characteristics sufficiently and, on the other hand, in a case where the concentration exceeds 10 mass %, it is difficult to form a transparent uniform film. In this invention, an organic or inorganic binder may also be used together so long as this is within the range of the solid content described above.

Water in a greater amount than required for the hydrolysis is added to the solution and stirring is conducted at a temperature of from 15 to 35° C., preferably, from 22 to 28° C., for 0.5 to 10 hrs and, preferably, 2 to 5 hrs. In the hydrolysis, a catalyst is used preferably, and as the catalyst, an acid, for example, hydrochloric acid, nitric acid, sulfuric acid, or acetic acid is preferred. The acid is added as an aqueous solution, preferably, about from 0.001 to 40.0 mol/L, more preferably, about from 0.005 to 10.0 mol/L, and water in the aqueous solution can be used as the water content for hydrolysis.

The finally obtained gel film is used as a low refractive index layer of the anti-reflection film and it is sometimes necessary to control the refractive index thereof. For example, there can be added a fluoro-organic silicon compound for reducing the refractive index, an organic silicon compound for increasing the refractive index, and a boron organic compound for further increasing the refractive index. Specifically, they include organic silicon compounds such as tetraethoxy silane, tetramethoxy silane, tetrapropioxy silane, tetrabutoxy silane, alkyltriakoxy silane, Colcoat 40 (manufactured by Colcoat Co.), MS51 (manufactured by Mitsubishi Chemical Co.), and Snowtex (manufactured by Nissan Chemical Co.), fluoro compounds such as ZAFURON FC-110, 220, 250 (manufactured by TOAGOSEI Co., Ltd.), Cefral Coat A-402B (manufactured by Central Glass Co. Ltd.), heptadecafluoro decyl trimethoxy silane, tridecafluorooctyl trimethoxy silane, trifluorooctyl trimethoxy silane, and trifluoropropyl trimethoxy silane, and boron compounds such as triethyl borate, trimethyl borate, tripropyl borate, and tributyl borate. The additives may be added upon preparation of the sol, or after formation of the sol. By the use of the additives, they react with silanol groups to cause further uniform reaction during or after the hydrolysis of the alkyl silicon alkoxide or the silicon alkoxide, to obtain a further uniform and transparent sol solution, and the refractive index of the formed gel film can be changed within a certain range of extent.

The active energy-ray active compound mentioned for the high refractive index layer described above may also be added to the low refractive index layer (formed on the high refractive index layer) containing at least one low refractive index material selected from the fluoro-containing resin, compounds formed of the silicate oligomer and the compounds formed of SiO$_2$ sol and the reactive organic silicone compound. Among them, the epoxy type active energy ray reactive compounds are used preferably. The epoxy type active energy ray reactive compound is a compound having two or more epoxy groups in the molecule, which is a compound capable of releasing a cationic polymerization initiation material under the irradiation of the active energy rays as described above. The epoxy type active energy ray reactive compound includes (i) bisphenol A glycidyl ether (the compoun is obtained by the reaction between epichlorohydrin and bisphenol A as a mixture of different polymerization degree); and (ii) compounds having terminal glycidyl ether groups obtained by reacting a compound having two phenolic OH such as bisphenol A with epichlorohydrin, ethylene oxide and/or propylene oxide. The photopolymerization initiator or the photo-sensitizer for cationic polymerization of the epoxy type active energy ray reactive compound is a compound capable of releasing cationic polymereization initiation material under the irradiation of active energy rays and, particularly preferably, a group of compound salts of onium salts releasing a Leis acid having a cationic polymerization initiation function under the irradiation. The active energy ray reactive compounds can also be cured by the application with active energy rays such as UV-rays or electron beams, plasma treatment or application of heat energy in the same manner as described for the high refractive index layer.

(Anti-Dazzling Layer)

In the gas barrier film of the invention, an anti-dazzling layer can also be provided.

The anti-dazzling layer has a structure of containing fine particle material in a layer for providing an anti-dazzling function by scattering light at the surface of the anti-dazzling layer or inside the anti-dazzling layer by the provision of a structure having unevenness at the surface. A preferred anti-dazzling layer has a film thickness of from 0.5 to 5.0 μm and contains one or more kinds of fine particles with an average grain size of from 0.25 to 10 μm, which is a layer containing silicon dioxide particles with an average grain size of 1.1 to 2 times the film thickness and fine silicon dioxide particles with an average grain size of from 0.005 to 0.1 μm in a binder, for example, diacetyl cellulose. The "particle" includes inorganic particles and organic particles. The inorganic particles include those of silicon dioxide, titanium oxide, aluminum oxide, zinc oxide, tin oxide, calcium carbonate, barium sulfate, talc, kaolinite, and calcium sulfate. The organic particles usable herein include, those of poly(meth)acrylate resin, silicone resin, polystyrene resin, polycarbonate resin, acryl styrene resin, benzo quanamine resin, melamine resin, polyolefinic resin, polyester resin, polyamide resin, polyimide resin, and polyfluoroethylene resin.

Among them, silicon dioxide such as silica is used particularly preferably for desirably attaining the anti-dazzling property. Among the silicon dioxide particles, super fine hydrous silicic acid powder prepared by wet process is preferred in the synthesis amorphous silica since it has a great effect of lowering the luster. The wet process is a method of reacting sodium silicate, mineral acid and salts in an aqueous solution and examples of the product include, for example, Cylisia manufactured by Fuji Cylisia Co. and Nipsil E manufactured by Nippon Silica Co.

In the anti-dazzling layer, use of an active ray curable resin as a binder is particularly preferred and the active ray curable resin layer containing the silicon dioxide particles and the fine silicon dioxide particles can be formed by irradiation of active rays after coating. An anti-dazzling layer using the active ray curable resin as the binder is more preferred in that the physical strength at the surface of a polarization plate can be enhanced.

The active ray curable resin usable herein means a resin that is cured by way of crosslinking reaction or the like by the irradiation of active rays such as UV-rays or electron beams.

The active ray curable resin includes UV-ray curable resins and electron beam curable resins as typical examples and they may be a resin cured by irradiation of active rays other than the UV-rays and the electron beams. Examples; of the UV-ray curable resin include UV-ray curable polyester acrylate resin, UV-ray curable acryl urethane resin, UV-ray curable acrylate ester resins, UV-ray curable methacrylate ester resins, UV-ray curable polyester acrylate resins, and UV-ray curable polyol acrylate resins.

The UV-ray curable polyol acrylate resin usable in the invention include photopolymerizable monomers and oligomers such as trimethylol propane triacrylate, ditrimethylol propane tetraacrylate, pentaerythritol triacrylate, pentaerythritol tetraacrylate, dipentaerythritol pentaacrylate, dipentaerythritol hexaacrylate, and alkyl modified dipentaerythritol pentaerythritol. The polyol acrylate resins have a feature of high crosslinkability and high curability, high hardness, less cure-shrinkage, less odoring property and low toxicity, and also of relatively high safety.

In the UV-ray curable polyol acrylate resin, other UV-ray curable resin, for example, UV-ray curable epoxy resin may also be contained and used within a range not deteriorating the effect thereof. The cured coating film formed by coating the acrylate resin to a large thickness increases curling by cure-shrinkage to sometimes result in troubles in view of handling operation. The epoxy resin generally shows less cure shrinkage and also less curling in the cured coating film compared with the acrylate resin. The UV-ray curable epoxy resin referred to herein is a compound containing two or more epoxy groups in the molecule, which is an epoxy resin containing a cationic polymerization initiator and takes place crosslinking reaction by the irradiation of UV-rays.

Examples of the usable electron beam curable resin include, preferably, those having acrylate functional groups, for example, polyester resin, polyether resin, acryl resin, epoxy resin, urethane resin, alkyd resin, spiroacetal resin, polybutadiene resin, and polythiol polyene resin of relatively low molecular weight.

Among them, the UV-ray curable resins are used preferably. The active ray curable resin can be cured by the irradiation of active rays such as electron beam or UV-rays. For example, in a case of electron beam curing, electron beams having an energy of from 50 to 1,000 keV, preferably, from 100 to 300 keV emitted from various types of electron beam accelerators such as a cockroft-walton type, Van de Graff type, resonance transformer type, insulating core transfer type, linear type, dynamitron type and high frequency type and, in a case of UV-ray curing, UV-rays emitted from light of super high pressure mercury lamp, high pressure mercury lamp, low pressure mercury lamp, carbon arc, xenone arc, metal halide lamp, etc. are utilized.

The film thickness is, preferably, from 0.5 to 5.0 μm and, particularly preferably, from 2.0 to 4.0 μm.

Instead of the active radiation rays used for curing layers including the anti-dazzling layer or the anti-reflection layer, a method of using plasma treatment or heating as means for giving active energy is also preferred. As the plasma treatment, a method described in JP-A No. 2000-327310 can be used preferably. Further, as the heat treatment for providing active energy, heat treatment is effectively applied after coating and drying of the anti-reflection layer or the anti-dazzling layer. It is heated at 70° C. or higher for 30 sec to 10 min and, more preferably, 30 sec to 5 min. It is preferred that the transmittance to visible light is not lowered by the provision of the anti-dazzling layer and the haze value is preferably 3% or more. Further, the transmittance in this case is, preferably, 90% or more at 550 nm. The surface layer of the anti-dazzling layer has a critical surface tension, preferably, of $20 \times 10^{-6}$ N/cm or less. In a case where the critical surface tension is greater than $20 \times 10^{-6}$ N/cm, contaminations deposited on the surface layer are less removed. Fluoro-containing type fluoro materials are preferred in view of preventing contamination.

The fluoro-containing material includes vinylidene fluoride copolymer, fluoroolefin/hydrocarbon olefin copolymer, fluoro-containing epoxy resin, fluoro-containing epoxy acrylate, fluoro-containing silicone, fluoro-containing alkoxy silane and, further TEFLON AF1600 (manufactured by DuPont Co., n=1.30), CYTOP (manufactured by Asahi Glass Co.: n=1.34), 17FM (manufactured by Mitsubishi Rayon Co., refractive index n=1.35), and LR201 (manufactured by Nissan Chemical Industry Co.: n=1.38) which dissolve in the organic solvent and are easy to handle. They can be used each alone or in combination of plural of them.

Further, also the fluoro-containing material includes fluoro-containing methacrylate such as 2-(perfluorodecyl) ethyl methacrylate, 2-(perfluoro-7-methyloctyl)ethyl methacrylate, 3-(perfluoro-7-methyloctyl)-2-hydroxypropyl methacrylate, 2- (perfluoro-9-methyldecyl)ethyl methacrylate, 3-(perfluoro-8-methyldecyl)-2-hydroxypropyl methacrylate, fluoro-containing acrylate such as 3-perfluorooctyl-2-hydroxypropyl acrylate, 2-(perfluoro-decyl)ethyl acrylate, and 2-(perfluoro-9-methyldecyl)ethyl acrylate, epoxides such as 3-perfluorodecyl-1,2-epoxy propane and 3-(perfluoro-9-methyldecyl)-1,2-epoxy propane, and radiation-curable fluoro-containing monomer, oligomer, or prepolymer such as epoxy acrylate. They can be used each alone or a plurality kinds of them may be used in admixture.

(Anti-Curl Layer)

In the gas barrier film of the invention, an anti-curl layer can be formed. The anti-curl layer provides a function of tending to uproll with the anti-curl layer applied surface being inside. With the formation of the anti-curl layer, in a case where some or other surface fabrication is applied to one surface of the film and surface fabrication of different degree and type is applied on both surfaces, it can prevent the surface from curling with the surface being inside.

The anti-curl layer can be formed to the substrate, for example, on the side opposite to the anti-dazzling layer or anti-reflection layer. Further, it is also effective to provide the anti-curl layer, for example, on the side opposite to the surface coated with the easy adhesive layer.

The anti-curl layer can be formed, for example, by solvent coating or coating a coating solution containing a solvent and cellulose triacetate, cellulose diacetate, cellulose acetate propionate or the like. The solvent coating method is conducted, for example, by coating a composition containing a solvent that dissolves or swells cellulose acylate film used as a protective film for polarization plate. Accordingly, the coating solution of the layer having the function of preventing curl preferably contains ketone or ester type organic solvent. Preferred examples of the ketone type organic solvent include, for example, acetone, methyl ethyl ketone, methyl isobutyl ketone, cyclohexanone, ethyl lactate, acetyl acetone, diacetone alcohol, isophorone, ethyl-n-butyl ketone, diisopropyl ketone, diethyl ketone, di-n-propyl ketone, methyl cyclohexanone, methyl-n-butyl ketone, methyl-n-propyl ketone, methyl-n-hexyl ketone, and methyl-n-heptyl ketone. Preferred examples of the ester type organic solvent includes methyl acetate, ethyl acetate, butyl acetate, methyl lactate, and ethyl lactate. However, the solvent used herein sometimes contain a mixture of dissolving solvent and/or swelling solvent, as well as a solvent not dissolving the film. Coating is conducted by using a composition formed by mixing them at an appropriate ratio and with a coating amount depending on the degree of curl of the transparent resin film and the kind of the resin. In addition, curl preventing function can be provided also by applying a transparent hardening fabrication or anti-static fabrication.

Gas barrier film of the invention, a layer having a curl-preventing function is preferably formed on the side of the substrate opposite to the side having the anti-dazzling layer or the anti-reflection layer. Further, the film thus prepared preferably has a degree of curl from −10 to +10 at 23° C. and 60% relative humidity.

The degree of curl is measured by the following method. After leaving the film sample under a circumstance at 80° C. and 90% relative humidity for 48 hours, the film was cut to 50 mm in the lateral direction and 2 mm in the longitudinal direction. Further, the film piece was moisture-controlled for 24 hours under a circumstance at 23° C.±2° C. and 55% relative humidity, and a value of curl of the film was measured by using a scale for radius curvature. The curl value is represented by 1/R, in which R represents the radius of curvature with the unit on the basis of m. Referring to the curl value, those with less deformation of the film are preferred and the direction of deformation may be either in the (+)direction or (−) direction. It is preferred that the absolute curl value is smaller. Specifically, in a case where the absolute curl value for the film is 10 or greater, deformation warp is large under high temperature and high humidity (for example, leaving the film at 80° C. and 90% relative humidity for 48 hours) and it can not endure the use upon preparation of a polarization plate or the like. In a case where the curl value of the film is 10 or less, deformation such as warp is small under high temperature and high humidity (for example, leaving the film at 80° C. and 90% relative humidity for 48 hours) and it can be used in a case of preparing a polarization plate or the like by using the film.

(Easy Adhesion Layer)

In the gas barrier film of the invention, an easy adhesion layer may also be coated. The easy adhesion layer is a layer having a function of enhancing adhesion between adjacent layers to each other. For example, the easy adhesion layer can be formed for facilitating adhesion between the protective film for polarization plate and a layer adjacent therewith, typically, a polarization film.

Examples of the easy adhesion layer used preferably include a layer containing a polymeric compound having a —COOM group (M represents hydrogen atom or cation). A more preferred embodiment includes a layer containing a polymeric compound having the —COOM group on the side of a film substrate and forming a layer containing, as a main ingredient, a hydrophilic polymeric compound on the side of a polarization film adjacent therewith. The polymeric compound having the —COOM group referred to herein includes, for example, a styrene-maleic acid copolymer having —COOM group, a vinyl acetate-maleic acid copolymer and a vinyl acetate-maleic acid-maleic acid anhydride copolymer having the —COOM group, and the vinyl acetate-maleic acid copolymer having the —COOM group is used particularly preferred. The polymeric compounds described above may be used each alone or in combination of two or more of them, and the mass average molecular weight is about from 500 to 500,000. As particularly preferred examples of the polymeric compound having the —COOM group, those described in each of JP-A Nos. 6-094915 and 7-333436 are used preferably.

Further, the hydrophilic polymeric compound includes, preferably, hydrophilic cellulose derivatives (for example, methyl cellulose, carboxymethyl cellulose, and hydroxy cellulose), polyvinyl alcohol derivatives (for example, polyvinyl alcohol, vinyl acetate-vinyl alcohol copolymer, polyvinyl acetal, polyvinyl formal, and polyvinyl benzal), natural polymeric compounds (for example, gelatin, casein, and gum arabic), hydrophilic polyester derivatives (for example, partially sulfonated polyethylene terephthalate), hydrophilic polyvinyl derivatives (for example, poly-N-vinyl pyrrolidone, polyacryl amide, polyvinyl indazole, polyvinyl pyrazole) and they may be used each alone or in combination of two or more of them.

It is necessary that the easy adhesion layer has hydrophilicity to some extent and the angle of contact with water is at 23° C. and 60% relative humidity is preferably 50° or less.

(Embossing)

The gas barrier film of the invention can be applied with embossing. A specific embossing method includes a method of passing a film between an emboss roll and a hard smooth surface roll at a temperature of Tg or higher. Further, for controlling "creaking value" to 10 g to 500 g, the surface roughness (Ra) is, preferably, about 0.01 to 5 μm.

(Image Display Device)

While the application use of the gas barrier film of the invention is not particularly restricted, since the film is excellent in optical characteristics and physical characteristics, it can be used suitably, for example, as a substrate for a transparent electrode of an image display device. "Image display device" referred to herein means, for example, a circular polarization plate, liquid crystal display device, tough panel, and organic EL device.

<Circular Polarization Plate>

A λ/4 plate and a polarization plate can be laminated to a gas barrier film of the invention to prepare a circular polarization plate. In this case, they are laminated such that an angle of 45° is formed between the phase retardation axis of the λ/4 plate and an absorption axis of the polarization plate. A polarization plate stretched in the direction of 45° relative to the longitudinal direction (MD) is preferably used and, the polarization plate described for example, in JP-A No. 2002-865554 can be used suitably.

<Liquid Crystal Display Device>

A reflection type liquid crystal display device has a structure having lower substrate, reflection electrode, lower orientation film, liquid crystal layer, upper orientation film, transparent electrode, upper substrate, λ/4 plate, and polarization film orderly from below. The gas barrier film of the invention can be used as the transparent electrode and the upper substrate described above. In a case of color display, a color filter layer is further formed preferably between the reflection electrode and the lower orientation film or between the upper orientation film and the transparent electrode.

A transmission type liquid crystal display device has a structure having back light, polarization plate, λ/4 plate, lower transparent electrode, lower orientation film, liquid crystal layer, upper orientation film, upper transparent electrode, upper substrate, λ/4 plate, and polarization plate orderly from below. The substrate of the invention can be used as the upper transparent electrode and the upper substrate described above. In a case of color display, a color filter layer is further formed preferably between the lower transparent electrode and the lower orientation film or between the upper orientation film and the transparent electrode.

The type of the liquid crystal cell is not particularly restricted and it is, preferably, TN (Twisted Nematic) type, STN (Super Twisted Nematic) type, HAN (Hybarid Aligned Nematic) type, VA (Vertically alignment) type, ECB (Electrically Controlled Birefringence) type, OCB (Optically Compensatory Bend) type, and CPA (Continuous Pinwheel Alignment) type.

<Touch Panel>

The invention can be applied to touch panels described in JP-A Nos. 5-127822, and 2002-48913, etc.

<Organic EL Device>

In a case of using the gas barrier film of the invention to EL such as organic EL device, it is preferably used in conjunction with the contents described in each of JP-A Nos. 11-335661, 11-335368, 2001-192651, 2001-192652, 2001-192653, 2001-335776, 2001-247859, 2001-181616, 2001-181617, 2002-181816, 2002-181617, and 2002-056976, as well as with the techniques described in each of JP-A Nos. 2001-148291, 2001-221916, and 2001-231443.

The gas barrier film of the invention can be used preferably as a substrate film and/or protective film in a case of forming an organic EL device.

<TFT Display Device>

The film of the invention can be used as a substrate for the thin film transistor (TFT) display device. The method of manufacturing a TFT array includes, for example, a method described in JP-W No. 10-512104. Further, the substrate may also have a color filter for color indication. While the color filter can be prepared by using any method and, it is preferred to adopt photolithography means.

EXAMPLE

The present invention will be further specifically explained with reference to the following examples of the present invention. The materials, amounts, ratios, types and procedures of treatments and so forth shown in the following examples can be suitably changed unless such changes depart from the gist of the present invention. Accordingly, the scope of the present invention should not be construed as limited to the following specific examples.

Method of measuring characteristic values in the example is shown below.

(Surface Smoothness)

The surface smoothness of the plastic substrate used for the gas barrier film of the invention was evaluated by using a micromap equipment, "Micromap SX520-SD200", manufactured by RYOKA SYSTEM Co. with reference to "average surface roughness: Sa" and/or "maximum height: St" as the index. The range for measurement was for 500 μm×500 μm to 1000 μm×1000 μm.

(Creaking Value)

Creaking value was measured by the following procedures using a creak measurement apparatus shown in FIG. 1.

(1) A film sample was cut out into a rectangular shape of: 180 mm in the TD direction (transversal direction)×50 mm in the MD direction (film forming direction), which was bonded as a first film sample 22 on a smooth plate with the surface (gas barrier layer forming surface) being upward. The plate was attached to a sample table 23 which was attached horizontally to a moving stage 25 of a tensile tester.

(2) The same film sample as in (1) was cut out into a rectangular shape of: 80 mm in TD direction×18 mm in MD direction, which was bonded as a second film sample to a smooth plate of the same size and having a weight of 500 g such that the rear face (surface not formed with the gas barrier film) was exposed. Further, a thread was attached at the center for the 18 mm side of the plate 21 of 500 g weight bonded with the second sample film.

(3) After stacking such that the rear face of the second sample film was in contact with the surface of the first sample film, the thread attached to the plate 21 of 500 g bonded with the second sample film was secured to a load cell 26 by way of a tackle 24 over a transfer stage 25 of the tensile tester.

(4) The transfer stage 25 was lowered at a rate of 200 mm/min. The maximum load detected by the load cell 26 was defined as "creaking value".

(Absence or Presence of Scratches)

Absence or presence of scratches was judged with naked eyes.

(Glass Transition Temperature (Tg))

Tg for each of optical film samples was measured using a differential scanning calorimeter (DSC6200, manufactured by Seiko Co.) in nitrogen under the condition at a temperature elevation rate of 10° C./min.

(Linear Heat Expansion Coefficient)

The film was cut out into 5 mm×19 mm and a linear heat expansion coefficient was measured by TMA8310 (Thermo Plus series, manufactured by Rigaku Denki Corporation) with an inter-chuck distance of 15 mm and at a tensile load of 66 mN.

(Measurement for Gas Barrier Property)

Gas barrier property was measured under the condition at a 38° C. and 90% relative humidity in accordance with the MOCON method (Oxygen; MOCON OX-TRAN 2/20L, steam: MOCON PERMATRAN-W3/31).

(Measurement for Thickness Fluctuation)

Measurement was conducted by using an electronic micrometer manufactured by Anritsu Corp. at a rate of 600 mm/min and, after recording on a chart sheet at a scale reduction ratio of 1/20, and at a chart speed of 30 mm/min, it was measured by a scale and half-adjusted at the first place of the decimal point.

(Haze)

A sample sized 40 mm×80 mm was measured at 25° C. and 60% relative humidity using a haze meter (HGM-2DP, SUGA TEST INSTRUMENTS) in accordance with JIS K-6714.

(Transmittance)

Transmittance of a 20 mm×70 mm sample was measured at 25° C. and 60% relative humidity by a visible light (615 nm) using a transmittance tester (AKA photoelectronic calorimeter, manufactured by KOTAKI Seisakusho).

(Retardation Re)

A 70 mm×100 mm sample was moisture-controlled at 25° C. and 60% relative humidity for 2 hours and Re was calculated in accordance with the following equation based on an external insertion value for the retardation value measured by an automatic birefringence meter (KOBRA21DH, manufactured by Oji Scientific Instrument Co. when measured from the vertical direction at 632.8 nm:

$$Re=|nMD-nTD| \times d$$

A wavelength other than 632.8 nm was also used.
(Retardation Rth)

A 30 mm×40 mm sample was moisture-controlled at 25° C. and 60% relative humidity for 2 hours and Rth was calculated in accordance with the following equation based on an external insertion value for the retardation value measured for the value measured from the vertical direction and the same value measured in the manner while tilting the film surface at 632.8 mm by an ellipsometer (M150, manufactured by Nippon Bunko Co.)

$$Rth=\{(nMD+nTD)/2-nTH\} \times d$$

(Tear Strength)

A 50 mm×64 mm sample was humidity-controlled at 23° C. and 65% relative humidity for 2 hours and the load requiring for tearing was measured by using a light load tearing strength tester (manufactured by Toyo Seiki Seisakusho) in accordance with ISO 6383/2-1983 and the results was averaged in MD and TD directions and evaluation was conducted.
(Flex Resistance Strength)

A 120 mm×120 mm sample was humidity-controlled at 23° C. and 65% relative humidity for 2 hours and the cycle of reciprocations to reach disconnection was measured by bending in accordance with ISO8776-1988.
(Tensile Strength)

A 15 mm×250 mm sample was moisture-controlled at 23° C. and 65% relative humidity for 2 hours, and the modulus of elasticity was calculated based on the stress and elongation at the initial stage of tension in accordance with ISO1184-1983, for a initial sample length of 100 mm and, a tensile speed of 200±5 mm/min using a tensilon tension tester (RTA-100, manufactured by Orientec Co.). Tensile strength, stress at break, extension strength and elongation at break were also evaluated simultaneously.
(Alkali Hydrolysis)

A 100 mm×100 mm sample was saponified for 2 min with an aqueous solution of 2 mol/L at 60° C. by an automatic alkali saponification treatment apparatus (manufactured by Shinto Scientific Co.) and washed with water for 4 min. It was neutralized with 0.01 mol/L diluted nitric acid at 30° C. for 4 min and then washed with water for 4 min. It was dried at 100° C. for 3 min and spontaneously dried for one hour and evaluated according to the following visual standards and haze value before and after the saponification.
A: whitening is not observed at all
B: whitening is observed slightly
C: whitening is observed considerably
D: whitening is observed remarkably
(Curl Value)

A 35 mm×3 mm sample was moisture-controlled at relative humidity of 25%, 55%, and 85% for 24 hours in a curl moisture control vessel (HEIDON (No. YG53-168), manufactured by Shinto Scientific Co.) for 24 hours and the radius of curvature was measured by a curl plate. For the curl in the wet state, the sample was stood still in water at a water temperature of 25° C. for 30 min and then the curl value thereof was measured.
(Wet Heat Resistance)

A 35 mm×25 mm sample was aged at 85° C. and 90% relative humidity for 200, 500, and 1,000 hours respectively and two sheets of the samples were bonded to each other with an adhesive, moisture-controlled. The state of the samples was observed visually and the change of color was measured by a platinous rainbow (PR-1G, manufactured by Tabai Espec Corp.) and the result was judged by the following standard.
A: no particular abnormality was recognized
B: decomposition odor or change of shape by decomposition was recognized
(Water Content)

A 7 mm×35 mm sample was measured by a water content tester and a sample drying apparatus (CA-03, VA-05, both manufactured by Mitsubishi Chemical Co.) by a Karl Fischer method. The water content (g) was calculated being divided by a sample mass (g).
(Residual Amount of Solvent)

A base residual amount of the solvent in a 7 mm×35 mm sample was measured by gas chromatography (GC-18A, manufactured by Shimazu Seisakusho).
(Heat Shrinkage)

A 30 mm×120 mm sample was aged at 90° C. and 5% relative humidity for 24 and 120 hours, and holes each of 6 mmφ were opened at 100 mm distance on both ends and the original size (L1) for the distance was measured to a minimum scale of 1/1,000 mm by using an automatic pin gage, (manufactured by Shinto Scientific Co.). Further, it was heat-treated at 90° C. and 5% relative humidity for 24 hours and 120 hours to measure the size for the punch gap (L2). The heat shrinkage was determined according to:

$$\{(L1-L2)/L1\} \times 100.$$

(High Humidity Size Evaluation)

A 30 mm×120 mm sample was aged at 40° C. and 95% relative humidity and 60° C. and 90% relative humidity respectively for 24 hours, and holes each of 6 mmφ were opened at 100 mm distance on both ends and the original size (L1) for the distance was measured to a minimum scale of 1/1,000 mm by using an automatic pin gage (manufactured by Shinto Scientific Co.). Further, it was heat-treated at 90° C. and 5% relative humidity for 24 hours to measure the size for the punch gap (L3). The change coefficient of size was determined according to:

$$\{(L1-L2)/L1\} \times 100.$$

(Film Planarity)

A sample was inspected for the entire width×1.5 m by a reflection light and a transmission light while changing the angle to evaluate the planarity. For the surface shape, the film was inspected in a dark room by a slide scope, and also evaluated by a base surface shape projector.
A: Film surface was smooth
B: Film surface was smooth but little obstacles were observed
C: Slight unevenness was observed on the film surface and presence of obstacles were observed distinctly
D: Unevenness was found on the film and a number of obstacles were observed
(Obstacle Inspection)

The sample was applied for the entire width×1 m by a reflection light and, after inspecting obstacles in the film with naked eyes, obstacles (lints) were confirmed by polarization microscope and evaluated.
(Modulus of Elasticity)

Using a universal tensile tester STM T50BP manufactured by Toyo Baldwin Co., stress at 0.5% elongation was measured in an atmosphere at 23° C. and 70% relative humidity and at a tensile speed of 10%/min, to determine the modulus of elasticity.
(Measurement for Brilliant Spot Obstacles)

Two polarization plates were arranged in a cross-nicol state to cut off transmission light and each of the samples is placed between the two polarization plates. For the polarization plate, a protective plate made of glass was used. Light was irradiated on one side and the number of brilliant points with the diameter of 0.01 mm or more per 1 $cm^2$ was counted by an optical microscope (SOX) from the opposite side.

(Stability of Solution)

A dope after filtration and concentration was sampled and observed while being stood still at 30° C. and evaluated by the following four stages of A, B, C, and D.

A: It showed transparency and liquid uniformness even with lapse of 20 days
B: While it possessed transparency and liquid uniformness as far as 10 days, slight clouding was observed at 20th day
C: While the liquid was transparent and uniform upon completion of the liquid preparation, it was gelled to a not uniform solution after lapse of one day
D: Swelling and dissolution were not observed for the liquid, which was in a state of a not transparent and not uniform solution (Film Surface Property)

The film was observed visually and the surface property was evaluated by the following four stages of A, B, C, and D.

A: Film surface was smooth
B: Film surface was smooth with little obstacles being observed
C: Slight unevenness was observed on the film surface and presence of obstacles is observed distinctly
D: Unevenness was observed for the film and a number of obstacles were found (Wet Heat Resistance of Film)

1 g of a sample was folded, placed in a 15 mL volume of glass bottle and, after moisture control under the condition at a temperature of 90° C. and 100% relative humidity, the bottle was closed tightly. It was aged at 90° C. and taken out after 10 days. The state of the film was confirmed visually and evaluated by the following four stages of A, B, C, and D.

A: No particular abnormality was recognized
B: Slight decomposition odor was recognized
C: Considerable decomposition odor was recognized
D: Decomposition odor and change of shape by decomposition were recognized (Peeling Load)

A solution of polyarylate P-1 was cast on a stainless steel plate (SUS plate) kept at a temperature of 15° C. and, after evaporating a solvent with lapse of time to form a film of polyarylate P-1 on an SUS plate, the load upon peeling the film from the SUS plate at a rate of 200 mm/sec was measured by a load cell. In this case, the residual amount of the solvent in the film was determined by calculation based on the mass of the film upon peeling and the mass after drying the film at 120° C. for 3 hours.

(Stepped Unevenness by Peeling)

Presence or absence of the stepped unevenness by peeling was judged by uniform coating one surface of the peeled film thoroughly with no unevenness, for example, with a black ink, visually observing a reflection image for the transmission light on the surface opposite to the coated surface while varying the angle and depending whether linear streaks or unevenness was observed or not. It was evaluated by the following four stages of A to D.

A: Stepped unevenness by peeling was not observed at all
B: Stepped unevenness by peeling was slightly observed but with no actual troubles
C: Stepped unevenness by peeling was slightly observed at a level where troubles were actually present
D: Stepped unevenness by peeling was distinctly observed over the entire surface at a level of causing troubles Synthesis Example Synthesis of Polymer for Producing Plastic Film BPFL (fluorene bisphenol) manufactured by JFE Chemicals was re-crystallized twice with acetonitrile, and vacuum-dried under heating at 70° C. for three hours to obtain a compound at an HPLC purity of 99.9% or higher. It contained 8.6 mass % of acetonitrile.

253.03 g (660 mmol) of the obtained compound containing acetonitrile, 9.171 g (33 mmol) of tetrabutyl ammonium chloride, 2805 ml of dichloromethane, and 2475 ml of water were charged in a reaction vessel having a stirring device and stirred under a nitrogen gas stream in a water bath at 300 rpm. After 30 min, 167.03 g (660 mmol) of 2,6-naphthalene dicarboxylic acid chloride was charged in the form of a powder as it was and flushed away with 330 ml of dichloromethane. After 10 min, a solution formed by diluting 693 ml of an aqueous solution of 2 mol/L sodium hydroxide with 132 ml of water was dropped for one hour by using a dropping device and flushed away with 165 ml of water after completion of the dropping. Then, after continuous stirring for three hours, 1 L of dichloromethane was added and an organic phase was separated. Further, a solution of 6.6 ml of 12 mol/L of aqueous hydrochloric acid solution diluted with 2.5 L of water was added to wash the organic phase. Further, it was washed twice each time with 2.5 L of water and, after adding 1 L of dichloromethane to the separated organic phase for dilution, they were charged in 25 L of methanol under violent stirring for one hour. Obtained white precipitates were collected by filtration in methanol, heated and dried at 40° C. for 12 hours, dried at 70° C. for 3 hours under a reduced pressure, to obtain 302 g of polyarylate P-1.

As a result of measuring the molecular weight of the obtained P-1 by GPC (THF solvent), the mass average molecular weight was 170,000. Further, the glass transition temperature measured by DSC was 369° C.

Example 1

Preparation and Evaluation of Gas Barrier Film

A plastic film of the invention, and a gas barrier film of the invention using the plastic film as a substrate on which a gas barrier layer is formed were manufactured in accordance with the following procedures.

(1) Preparation of Substrate Film
(1-1) Solution for Preparing Substrate film S-1

The composition of the solution for preparing the substrate film S-1 is as shown below.

| Dichloromethane | 80 mass parts |
| Polyarylate P-1 | 20 mass parts |

(1-2) Preparation of Solution for Manufacturing Substrate Film S-1

In a 500 L stainless steel dissolution tank having a stirring blade, a polyarylate P-1 powder (flake) was gradually added while thoroughly stirring the solvent and a solution was prepared such that the entire amount was 300 kg. A solution with water content of 0.2 mass % or less was used. The polyarylate P-1 powder was charged in a dispersion tank and dispersed by dissolver type eccentric stirring shaft and central shaft having anchor blades under the condition of stirring at first at the peripheral speed of 5 m/sec (shearing stress: $5 \times 10^4$ kgf/m/$sec^2$) and at a peripheral speed of 1 m/sec (shearing stress:

$1\times10^4$ kgf/m/sec$^2$) for 30 min. The temperature at the start of the dispersion was 25° C. and it finally reached a temperature of 34° C. After completing the dispersion, high speed stirring was stopped and the flake was further stirred for 100 min at the peripheral speed of the anchor blade of 0.5 m/sec to swell the polyarylate P-1 flake. The inside of the tank was pressurized at 0.12 MPa with a nitrogen gas till the completion of swelling. The oxygen concentration in the tank was less than 2 vol % in this case to keep a state free from the problem in view of explosion protection. Further, it was confirmed that the water content in the dope should was to be 0.5 mass % or less and this was 0.3 mass % in this experiment.

(1-3) Dissolution and Filtration

The swollen solution was heated to 50° C. from the tank to the pipeline with jacket and, further, heated up to 90° C. under a pressure of 2 MPa and was dissolved completely. The heating time was 15 min. Then, the temperature was lowered to 36° C., and the solution was passed through a filter material with a nominal pore size of 8 μm to obtain a dope. In this case, primary pressure for filtration was set to 1.5 MPa and the second pressure was set to 1.2 MPa. For the filter, the housing and the pipeline exposed to high temperature, those made of Hastelloy alloy excellent in corrosion resistance and having a jacket for allowing a heat medium for temperature keeping and heating to pass therethrough.

(1-4) Concentration and Filtration

The dope before concentration obtained as described above was flushed in a tank at 80° C. and under a normal pressure, and evaporated solvent was collected and separated by a condenser. The solid concentration of the dope after flushing was 28.8 mass %. The condensed solvent was sent to a recovery step for re-use as a solvent in the preparation step (recovery is conducted by a distillation step and dewatering step). The flush tank had an anchor blade for the central shaft and conducted defoaming by stirring at a peripheral speed of 0.5 m/sec. The temperature of the dope in the tank was 25° C. and the average staying time in the tank was 50 min. The shear viscosity of the dope collected and measured at 25° C. was 130 (Pa·s) at a sharing speed of 10 (sec$^{-1}$)

Then, defoaming was conducted to the dope by irradiation of weak supersonic waves. Then, the dope was passed in a state under a pressure of 5 MPa at first through sintered fiber metal filters with a nominal pore size of 10 μm and then through sintered fiber filters of 10 μm size. Respective primary pressures were 1.5 MPa and 1.2 MPa, and respective secondary pressures were 1.0 MPa and 0.8 MPa. The dope after filtration was controlled to a temperature of 36° C. and stored in a 500 L stock tank made of stainless steel. The stock tank had anchor blades for the central axis and always conducted stirring at a peripheral speed of 0.3 m/sec. Upon preparing the dope from the dope before concentration, corrosion or like other problem did not occur at all to the portion in contact with the dope solution contact.

(1-5) Casting

Successively, the dope in the stock tank was delivered under feed back control by an inverter motor such that the pressure on the primary side of a high precision gear pump was 0.8 MPa by using a primary booster gear pump. The high precision gear pump had a performance of 99.2% of volumic efficiency and 0.5% or less of fluctuation in the discharge amount. Further, the discharge pressure was 1.5 MPa. As a casting die, a device having 1.8 m width and provided with a feed block adjusted for co-casting such that a film of a three-layered structure can be molded with respective layers laminated on both surfaces in addition to the main stream was used. In the following descriptions, a layer formed of the main stream is referred to as an intermediate layer, a layer on the side of a support surface is referred to as a support surface and the surface on the opposite side is referred to as an air surface. For the delivery channel of the dope, three channels were used for the intermediate layer, the support surface and the air surface. For the dope on the side of the support and the dope on the side of the air surface as the outer most layer, the dope having the composition described in (1-1) was used under dilution with a methylene chloride solvent by connecting a static mixer and a Sulzer mixer by an inline provided to the pipeline. The dilution was conducted for the dope on the side of the support to 97% concentration based on the original dope and for the dope on the side of the air surface to 95% concentration based on the original dope and such that the solution was adjusted so as to contain 1 mass % of silicon dioxide particles (particle size: 0.3 μm) relative to the polyarylate P-1. Further, the dope on the side of the support was cast after passage through a filtration filter at an accuracy of 0.5 μm or less.

Casting was conducted while controlling the dope flow rate at the respective die protrusion ports such that the thickness for the air surface, the intermediate layer, and the support surface were 4 μm, 92 μm and 4 μm respectively and the total thickness was 100 μm for the casting width of 1500 mm in the completed sample of the polyarylate P-1 film. For controlling the temperature of the dope to 36° C., a jacket was provided to the casting die to control the inlet temperature of the heat conduction medium supplied in the jacket to 36° C. All of the die, the feed block and the pipeline were kept at 36° C. during the operation step. The die used was a coat hanger type die, which was provided with thickness adjusting bolts each at 20 mm pitch, and had an automatic thickness control mechanism by a heat bolt. The heat bolt had a performance capable of setting a profile in accordance with the liquid delivery amount of high precision gear pump by a predetermined program and also capable of feedback control by a control program based on the profile of an IR thickness gage disposed in the film formation step. It was controlled such that the difference of thickness was 1 μm or less between optional two points spaced by 50 mm in a film excluding 20 mm of the casting edge portion and the greatest difference for the minimum value of the thickness in the lateral direction was 3 μm/m or less. The accuracy for the average thickness of each of the layers was controlled to ±2% or less for both of the outer layer and ±1% or less for the main stream, and the entire thickness was controlled to ±1.5%.

Further, a depressurizing chamber was provided on the primary side of the die. The degree of depressurization in the depressurization chamber is adapted such that a difference of pressure of from 1 Pa to 5000 Pa can be applied before and after the casting bead and can be controlled in accordance with the casting speed. In this case, the pressure difference was set such that the bead length was from 2 mm to 50 mm. Further, it was provided with a mechanism capable of setting the temperature for the chamber to higher than the condensing temperature of a gas at the periphery of the casting portion. Labyrinths were provided before and after the bead. Further, openings were formed on both ends. Further, for controlling the disturbance of the flow on both edges of the bead therefrom, a chamber provided with an edge suction device was used.

(1-6) Casting Die

In this case, the material for the die is precipitation-hardened stainless steel with a heat expansion coefficient of $2\times10^{-5}$ (° C.$^{-1}$) or less. A material having the corrosion resistance substantially equal with SUS 316 in a compulsory corrosion test using an aqueous solution of electrolyte was used.

Further, a material having such a corrosion resistance as not suffering from pitting (aperturing) at the gas-liquid boundary even when dipped in each of solutions of dichloromethane, methanol and water for three month was used. Further, those with laps of one month or more after casting was machined to make the surface shape of the solution of polyarylate P-1 constant. The finishing accuracy for the liquid contact surface of the casting die and the feed block was 1 µm or less as the surface roughness and the straightness was 1 µm/or less in any of the directions. Clearance of the slit could be controlled automatically as far as 0.5 mm to 3.5 mm. It was practiced at 1.5 mm in this embodiment. For the corner of the liquid contact portion at a top end of the die lip, it was fabricated such that R was 50 µm or less for the entire width. The shear rate in the die was within a range from 1 (1/sec) to 5000 (1/sec).

A casting die having a hardened film formed at the top end of the lip was used. The method of form the hard film includes ceramic coating, hard chromium plating, and nitridation treatment. In a case of using ceramics as the hardened film, those capable of being ground, with less porosity, not fragile, excellent in corrosion resistance and with no close adhesion with the die are preferred. Specifically, the ceramics include tungsten carbide (WC), $Al_2O_3$, TiN, $Cr_2O_3$, etc. WC is particularly preferred. In this invention, WC coating formed by the flame spray method was used.

Further, a solvent solubilizing the dope was supplied to slit ends of the die at 0.5 ml/min on one side to gas-liquid boundary for bead end and the slit to prevent the flowing dope from drying and solidifying topically. The rate of pulsation of the pump supplying the solution was 5% or less. Further, the pressure at the back of the bead was lowered to 150 Pa by the pressure reduction chamber. Further, for making the temperature of the pressure reduction chamber constant, a jacked was attached. A heat conduction medium controlled to 35° C. was supplied in the jacket. An edge suction blow rate controllable within a range from 1 L/min to 10 L/min was used and the blow rate was properly controlled within a range from 30 L/min to 40 L/min in this example.

(1-7) Metal Support

As the metal support, a stainless steel endless band having 2.1 m width and 70 m length was used. A band with a thickness of 1.5 mm and polished such that the surface roughness was 0.05 µm or less was used. The material was made of SUS 316 and had sufficient corrosion resistance and strength. The unevenness in the thickness for the entire band was 0.5% or less. A band of a type driven by two drums was used in which the tension of the band was controlled to $1.5 \times 10^{-4}$ kg/m and the relative difference of the speed between the band and the drum was 0.01 m/min or less. Further, the fluctuation of the band driving speed was 0.5% or less. Further, meandering in the direction of the width during one rotation was controlled by detecting the both end positions of the band so as to restrict to 1.5 mm or less. Further, the positional fluctuation in the vertical direction upon drum rotation for the support surface just below the casting die was set to 200 µm or less. The support was placed in a casing having an air blow vibration suppression means. On the substrate, three layered of dopes were co-cast from a position above the support.

As the drum having a facility of circulating a heat conduction medium (coolant) at the inside was used in the casting portion so as to cool the support. Further, a heat conduction medium can be passed through the other drum for supplying the heat for drying. The temperatures of the respective heat conduction media were at 5° C. (on the side of the casting die) and at 36° C. The surface temperature at the central portion of the support just before casting was 15° C. The temperature difference between both ends was 6° C. or less. The drum can be used also directly as a casting support and, in this case, it was rotated at an accuracy of rotational fluctuation of 0.2 mm or less. Also in the drum, the surface average roughness was 0.01 µm or less and it had sufficient hardness and durability by chromium plating. In any of the drum and the band, surface defects should not be present and a support with no pinholes of 30 µm or more at all and with pinholes of from 10 µm to 30 µm by the number of 1 $N/m^2$ or less and with pinholes of 10 µm or less by the number of 2 $N/m^2$ was used.

(1-8) Casting and Drying

The temperature of a casting chamber provided with the casting die, the support, etc. was kept at 35° C. The dope cast on the band was dried at first by sending a drying blow as a parallel flow. The total heat conduction coefficient from the drying blow to the dope upon drying was 24 $kcal/m^2 \cdot hr \cdot ° C$. The temperature of the drying blow was set to 135° C. at the upstream above the band and at 140° C. at the down stream above the band. Further, the temperature below the band was set to 65° C. The saturation temperature for the respective gases was each around −8° C. The oxygen concentration in the drying atmosphere above the support was kept at 5% by volume. For keeping the oxygen concentration to 5% by volume, air was replaced with a nitrogen gas. Further, for condensing and recovering the solvent in the casting chamber, a condenser was provided and the exit temperature thereof was set to −10° C.

For 5 sec after casting, the static pressure fluctuation at the vicinity of the casting die was suppressed to ±1 Pa by a blow shutting device such that the drying blow does not directly hit on the dope. The dope was peeled as a film from the casting support at the instance the solvent ratio therein reached 50 mass % on the dry bases. The peeling tension in this case was 10 kgf/m and the peeling speed (peeling roll draw) relative to the support speed was set such that the film could be peeled properly within a range from 100.1% to 110%. Further, the surface temperature of the peeled film was 15° C. The drying speed on the support was 60 mass % dry base solvent/min in average. The solvent gas evolved by drying was introduced to a condenser, liquefied at −10° C., and re-used as a solvent for recharging. The drying blow removed with the solvent was heated again and re-used as the drying blow. In this case, it was re-used while controlling the water content contained in the solvent to 0.5% or less.

The peeled film was conveyed in a transfer portion where a plurality of rollers were provided. The transfer portion had three rollers and the temperature of the transfer portion was kept at 40° C. A tension of 16 N to 160 N was applied to the film during conveyance on the rollers in the transfer portion.

(1-9) Tenter Conveyance and Drying

The peeled film was conveyed in the drying zone of a tenter while being fixed at both ends by the tenter having clips and dried by a drying blow. A heat conduction medium at 20° C. was supplied to the clips for cooling. The tenter was driven by a chain and the fluctuation of the speed of the sprocket was 0.5% or less. Further, inside of the tenter was divided into three zones and the temperature of the drying blow in each of the zones was set to 90° C., 100° C., and 110° C. from the side of the upstream. The gas composition of the drying blow had a concentration of a gas saturated at −10° C. The average drying speed in the tenter was 120 mass % (solvent on dry weight base)/min. The residual amount of the solvent in the film at the exit of the tenter was controlled to 10 mass % or less and the condition for the drying zone was controlled such that the amount was 7 mass % in this experiment. In the tenter, stretching was conducted also in the transversal direction during conveyance. The amount of enlarging the width was 103% assuming the width as 100% upon conveyance to the tenter.

The stretching ratio from the peeling roller to the tenter inlet (tenter driving draw) was set to 102%. The stretching ratio in the tenter was such that the difference of the substantial stretching ratio at the portion spaced apart by 10 mm or more from the tenter engaging portion was 10% or less, and the difference of the stretching ratio for optional two points spaces apart by 20 mm was 5% or less. At the base end, the ratio of the length secured by the tenter was set to 90%. Further, conveyance was conducted while cooling such that the temperature of the tenter clip did not exceed 50° C. The solvent evaporated in the tenter portion was condensed and liquefied at a temperature of −10° C. and recovered. A condenser was provided for recovery by condensation and the exit temperature thereof was set to −8° C. The water contained in the solvent was controlled to 0.5 mass % or less and re-used.

Then, both edges were cut out within 30 sec from the tenter exit. Edges for 50 mm on both sides were cut by an NT type cutter and cut edges was sent pneumatically by a cutter blower to a crasher and pulverized into chips of about 80 mm² in average (chips could be re-used as the starting material together with polyarylate P-1 flakes in the charging step as the starting material for preparation again). The concentration of oxygen in the drying atmosphere in the tenter portion was kept at 5% by volume. For keeping the concentration of oxygen to 5% by volume, air was replaced with a nitrogen gas. Before high temperature drying in the roller conveyance zone to be described later, the film was preliminary heated in a preliminary drying zone to which a drying blow at 100° C. was supplied.

(1-10) Subsequent Drying

The polyarylate P-1 film after the edge cutting obtained by the method described above was dried at a high temperature in the roller conveyance zone. The roller conveyance zone was divided into four compartments and drying blow was fed at 100° C., 120° C., 145° C., and 170° C. from the upstream. In this case, the tension of the roller conveyance for the film was set to 100N/width and the film was dried for about 60 min till the residual amount of the solvent was finally reduced to 0.05 mass %. The lap angle of the roller used was 90° and 180°. The roller was made of a material such as aluminum or carbon steam, on which a hard chromium plating was applied. For rollers, those having the flat surface shape and those matted by blasting were used. Deflection of the rollers due to the rotation was 50 μm or less for each of them. Further, the distortion of the roller at a tension of 100 N/width was selected so as to be 0.5 mm or less.

A compulsory charge elimination device (charge elimination bar) was provided in the step such that the charged voltage on the film during conveyance was always within a range from −3 kV to 3 kV. Further, an ion blow charge elimination device was provided in addition to the charge elimination bar in the take-up unit such that the static charge was from −1.5 kV to 1.5 kV. The solvent gas contained in the drying blow was recovered and removed by adsorption using an adsorbent. The adsorbent was activated carbon and desorption was conducted by using dry nitrogen. The recovered solvent was controlled to the water content of 0.3 mass % or less and re-used as the solvent for charging. Since the drying blow contains a plasticizer, UV absorbent and other high boiling matters in addition to the solvent gas, they were removed by a cooler and a pre-adsorber for cooling and removing them and used again by circulation.

Then, the adsorption/desorption conditions were set such that VOC in the outdoor discharge gases was finally 10 ppm or less. Further, among the entire evaporated solvent, the amount of the solvent recovered by the condensing method was 90 mass % and most of the remaining portion was recovered by adsorptive recovery. The dried film was conveyed to a first moisture control chamber. A drying blow at 105° C. was fed to a transfer portion between the roller conveyance zone and the first moisture control chamber. Air at a temperature of 50° C. and with a dew point of 20° C. was fed to the first moisture control chamber. Further, the film was conveyed to a second moisture control chamber for suppressing the occurrence of curl in the film.

(1-11) Post Treatment and Take-Up

The polyarylate P-1 film after drying was cooled to 30° C. or lower, applied with edge cutting on both ends and, further, knurling was applied on both ends of the film. In this case, edge cutting was conducted by applying a laser light so that edge dusts were not formed. Further, knurling was applied by embossing on one side, the knurling width was 10 mm and a pressing pressure was set such that the maximum height was higher by 12 μm in average than the average thickness.

Then, the obtained film was conveyed to the take-up chamber. The take-up chamber was kept at a chamber temperature of 25° C. and at a humidity of 60%. The width of the thus obtained polyarylate P-1 film (100 μm thickness) was 1475 mm. The diameter of the take-up core was 169 mm, and the tension pattern was set such that the tension at the beginning of take-up was 360 N/width and the tension at the end of the take-up was 250 N/width. The entire take-up length was 300 m. Further, the pressing pressure of the press roll on the take-up roll was set to 50 N/width. The film upon take-up had a temperature of 25° C., a water content of 0.5 mass % and the residual amount of the solvent of 0.1 mass % or less. Further, the taken-up film was free of slacking during take-up, and creasing and deviation during take-up. The appearance of the roll was also favorable. By way of the steps described above, the substrate film S-1 of the invention was prepared.

When a portion of the substrate film S-1 of the invention was stored in a storage rack at 25° C. and at 55% relative humidity for one month and, as a result of applying various types of inspections in the same manner as described above, no significant changes were recognized for the appearance and the characteristics. Further, adhesion was not recognized also inside the roll. Further, after forming the film S-1, peeling residues of the cast film formed of the dope, etc. were not found at all on the endless belt as the metal support.

(1-12) Evaluation and Result

In the obtained substrate film S-1, it was evaluated that the solution stability was A, film planarity was also A, the film surface property was also A and the strength upon film tearing test was 14 g. The film flexion resistance test reached 69 times, the wet heat resistance was A and all of the properties were excellent. Further, the peeling load was 8 g/cm and peeling resistance was scarcely observed. The stepped unevenness by peeling was evaluated as rank A. The thickness of the substrate film S-1 was 100 μm±1.5 μm over the entire region. In this case, evaluation was further conducted for the top portion, the intermediate portion and the last portion in the longitudinal direction respectively for both ends and the central portion in the lateral direction and it was confirmed for the data thereof that the error was 0.2% or less. Further, the linear heat expansion coefficient of the film was 65 ppm/° C. Further, the longitudinal/lateral average heat shrinkage (80° C., 90% relative humidity, 48 hours) was −0.1% and a film causing less heat shrinkage was obtained.

Further, the substrate film S-1 had a haze of 0.3%, a degree of transparence (transparency) of 90.4%, Re of 34 nm, Rth of 560 nm, a modular of elasticity in the longitudinal direction of 2.1 GPa, in the lateral direction of 2.2 GPa, a tensile strength in the longitudinal direction of 142 MPa, in the lateral direction of 141 MPa, an elongation rate in the longitudinal direction of 20% and in the lateral direction of 21%, a creaking value (static friction coefficient) of 0.45, a creaking value of 50 g, an alkali hydrolyzability ranked at A, a curl value of −0.4 at 25% relative humidity and 0.0 at a wet state. Further, the water content was 0.4 mass %, the residual amount of the solvent was 0.05 mass %, and the heat shrinkage in the longitudinal direction was −0.01% and in the lateral direction was −0.01%. Obstacles were less than 5 N/m as lints. Further, the number of brilliance points sized 0.02 mm to 0.05 mm was less than 10 N/3m, 0.05 to 0.1 mm was less than 5 N/3m, and with no points for the size of 0.1 mm or more. They had excellent characteristics for the optical application use.

(Preparation of Substrate Film S-2)

A comparative plastic substrate S-2 of 100 pm thickness was obtained in the same manner as in the preparation method for the substrate film S-1 of the invention described above except for changing the three-layered co-casting described in (1-5) above to a mono-layered casting only for the intermediate layer.

(Preparation of Substrate Film S-3)

A substrate film S-3 of 100 μm thickness was obtained in the same manner as in the preparation method for the substrate film S-1 of the invention described above except for not casting a one layer for a support surface in the three-layered co-casting as described in (1-5) above.

(Preparation of Substrate Film S-4)

A substrate film S-4 of 100 μm thickness was obtained in the same manner as in the preparation method for the substrate film S-1 of the invention described above except for not casting a one layer for an air surface in the three-layered co-casting as described in (1-5) above.

(Preparation of Comparative Substrate Film S-5)

An undercoat layer and a back layer were formed on PEN as a substrate film (DuPont-Teijin, Q65A) in the same manner as in the method of preparing the sample 110 in Example 1 of JP-A No. 2000-105445 to obtain a substrate film S-5. That is, after drying 100 mass parts of polyethylene-2,6-naphthalate polymer (manufactured by DuPont-Teijin, Q65A), and 2 mass parts of a UV-lay absorbent (manufactured by Ciba Specialty Chemicals Co., Tinuvin P. 326) and melting them at 300° C., they were extruded from a T die, applied with longitudinal stretching by 3.3 times at 140° C. and, successively, applied with lateral stretching by 3.3 times at 130° C. and further applied with heat setting at 250° C. for 6 sec, to obtain a PEN film of 90 μm thickness. In the PEN film, a blue die, a magenta die, and a yellow die (I-1, I-4, I-6, I-24, I-26, I-27, and II-5 described in the laid open technical report: published technical No. 94-6023) each in an appropriate amount. Further, it was wound around a stainless steal winding core of 20 cm diameter and applied with thermal hysteresis at 110° C. for 48 hours, to form a film with less curing nature and this was used as a comparative substrate film S-5.

(Coating of Undercoat Layer)

After applying corona discharging treatment, UV irradiation treatment and, further, glow discharging treatment to both surfaces of each of the substrate films, an undercoat solution comprising 0.1 g/m² of gelatin, 0.01 g/m² of sodium α-sulfodi-2-ethylhexyl succinate, 0.04 g/m² of salicylic acid, 0.2 g/m² of p-chlorophenol, 0.012 g/m² of $(CH_2=CHSO_2CH_2CH_2NHCO)_2CH_2O$, and 0.02 g/m² of polyamide-epichlorohydrin polycondensates was coated (10 mL per m², using bar coater), to form an undercoat layer. Drying was conducted at 115° C. for 6 min (all of rollers and conveying devices in the drying zone were at 115° C.).

(Coating of Antistatic Layer and Sliding Layer)

An anti static layer and a sliding layer each of the following compositions were coated as a back layer on the other surface of the substrate film after undercoating.

As the antistatic layer, 0.2 g/m² of a dispersion of fine particle powder of a tin oxide-antimony oxide composite with an average grain size of 0.005 μm (specific resistively: 5 Ω·cm, secondary agglomerated particle size: about 0.08 μm), 0.05 g/m² of gelatin, 0.02 g/m² of $(CH_2=CHSO_2CH_2CH_2NHCO)_2CH_2$, 0.005 g/m² of polyoxyethylene-p-nonylphenol (polymerization degree: 10), and 0.22 g/m² of resorcin was coated.

Further, a mixture of diacetyl cellulose (25 mg/m²) $C_6H_{13}CH(OH)C_{10}H_{20}COOC_{40}H_{81}$ (6 mg/M²)/$C_{50}H_{101}O(CH_2CH_2O)_{16}H$(9 mg/m₂) was coated. The mixture was prepared by melting at 105° C. in xylene/propylene glycol monomethyl ether (1/1) and pouring and adding in propylene glycol monomethyl ether (10 times by amount) at normal temperature and then added as a dispersion in acetone (average particle size: 0.01 μm). Silicon oxide particles (0.3 μm) were added as a matting agent so as to be 15 mg/m². Drying was conducted at 115° C. for 6 min (temperature was set to 115° C. for all of rollers and transporting devices in the drying zone).

(Formation of Barrier Layer)

A gas barrier film B-1 of the invention and comparative gas barrier films B-2 to B-5 were obtained by conducting the treatment in the following steps using the substrate film S-1 of the invention and comparative substrate films S-2 to S-5 prepared by the method described above.

A roll-to-roll system sputtering apparatus (1) as shown in FIG. 1 was used. The apparatus has a vacuum vessel (2) in which a drum (3) is located at a central portion thereof for cooling a plastic film (6) by contact at the surface. A delivery roll (4) and a take-up roll (5) for winding the plastic film (6) are arranged in the vacuum vessel (2). The plastic film (6) wound around the delivery roll (4) is wound by way of a guide roll (7) to the drum (3) and, further, the plastic film (6) is wound by way of the guide roll (8) to the take-up roll (5). In a vacuum exhaustion system, the inside of the vacuum vessel (2) is always exhausted by a vacuum pump (10) from exhaust ports (9). As the film formation system, a target (not illustrated) is mounted on a cathode (12) connected to a DC system discharge power source (11) that can supply pulsed power. The discharge power source (11) is connected to a controller (13) and, further, the controller (13) is connected to the gas flow rate control unit (14) for supplying the gas while controlling the amount of the reaction gas introduced by way of a pipeline (15) to the vacuum vessel (2). Further, it is adapted such that a discharge gas at a predetermined flow rate is supplied to the vacuum vessel (2) (not illustrated). Specific conditions are shown below.

Si was set as a target, and a pulse application type DC power source was provided as the discharging power source (11). Each substrate films of 100 μm thickness was provided as the plastic film (6), which was put on the delivery roll (4) and passed as far as the take-up roll (5). After completing the preparation of the substrate to the sputtering apparatus (1), a door for the vacuum vessel (2) was closed and the vacuum pump (10) was actuated and vacuum suction and drum cooling were started. When the pressure reached $4×10^{−4}$ Pa and the drum temperature was cooled to 5° C., running of the plastic film (6) was started. Argon was introduced as the discharging gas and the discharging power source (11) was turned-ON to generate plasmas above the Si target with a discharging power of 5 KW and a film-forming pressure of 0.3 Pa, and pre-sputtering was conducted for 3 min. Subsequently, oxygen was introduced as a reaction gas and the amount of argon and oxygen gas was gradually decreased to lower the film-forming pressure to 0.1 Pa after the discharging was stabilized. After confirming the stabilization of discharging at 0.1 Pa, formation of a silicon oxide film was conducted for a predetermined time. After completing the film formation, inside of the vacuum vessel (2) was returned to the atmospheric pressure and a film with depositing of silicon oxide was taken out.

(Formation of Organic Layer)

Then, after adding 1 mass % of a radical initiator (Ilugaqure 651, manufactured by Ciba Speciality Chemicals Co.) to a solution formed by mixing tetraethylene glycol deacrylate, caprolacton acrylate, triproplylene glycol monoacrylate at a mass ratio of 7:1.2:1.4 and dissolving them in a solvent and coating and drying the same, it was cured by UV-irradiation to form an organic layer of about 1 μm thickness on a resin substrate.

(Lamination of Barrier Layer and Organic Layer)

By forming the barrier layer and forming the organic layer repetitively, a gas barrier film in which barrier layers and organic layers were laminated alternately each by three layers was prepared.

(Test and Evaluation)

After handling the gas barrier films B-1, B-3, and B-4 of the invention and comparative gas barrier films B-2 and B-5 by a small-width handling apparatus at a constant tension (0.25N/mm) to form them in roll shape, the gas barrier property was evaluated. Table 2 shows the result together with the layer constitution, smoothness (maximum height: St, average surface roughness: Sa), and a glass transition temperature (Tg) of the substrate film, creaking value of the gas barrier films and absence or presence of scratches.

value was large and scratches were caused during take-up after forming the gas barrier layer, but the gas barrier property was obtained although it was somewhat lowered. However, since the comparative gas barrier film B-2 lacked in the smoothness for the substrate film, the gas barrier film contained a number of defects and, further, since it had no sliding layer, the creaking value was large and scratches were caused during take-up after forming the gas barrier layer, to worsen the gas barrier property.

(High Temperature Treating Test)

The gas barrier films B-1 and B-5 were treated at under high temperature and high vacuum conditions at 250° C. and at 0.01 Pa for one hour. The gas barrier films were referred to as B-11 and B-15.

In the same manner as described above, each of the gas barrier films B-11 and B-15 was evaluated for the gas barrier property. The result is shown in Table 3.

TABLE 3

| Gas barrier film | Plastic film (substrate film) | | Evaluation for gas barrier film | |
|---|---|---|---|---|
| | Type | Tg (° C.) | Oxygen permeability (ml/m$^2$/day/atm) | Steam permeability (g/m$^2$/day) |
| B-11 (invention) | P-1 | 369 | Less than 0.005, note 1) | Less than 0.005, note 1) |
| B-15 (Comparative Example) | PEN | 150 | Measurement impossible, note 2) | Measurement impossible, note 2) |

Note 1)
less than 0.005 means the detection limit of measuring apparatus
Note 2)
measurement impossible because of substrate deformation

TABLE 2

| Gas barrier film | Plastic film (substrate film) | | | | | | | Evaluation for gas barrier film | | | |
|---|---|---|---|---|---|---|---|---|---|---|---|
| | Type | Tg (° C.) | Support surface layer | Intermediate layer | Air surface layer | Average surface roughness (Sa: nm) | Maximum height (St: nm) | Creaking value (g) | scratch | Oxygen permeation rate (ml/m$^2$/day/atm) | Steam permeability (g/m$^2$/day) |
| B-1 (Invention) | S-1 | 369 | Presence | Presence | Presence | 1 | 90 | 50 | No | Less than 0.005 note) | Less than 0.005 note) |
| B-2 (Comparative Example) | S-2 | 369 | No | Presence | No | 3 | 300 | 550 | Presence | 0.07 | 0.07 |
| B-3 (Invention) | S-3 | 369 | No | Presence | Presence | 3 | 300 | 40 | No | 0.01 | 0.015 |
| B-4 (Invention) | S-4 | 369 | Presence | Presence | No | 1 | 90 | 600 | Presence | 0.02 | 0.02 |
| B-5 (Comparative Example) | S-5 | 150 | Presence | Presence | Presence | 0.9 | 80 | 45 | No | Less than 0.005 note) | Less than 0.005 note) |

Note:
less than 0.005 means the detection limit of measuring apparatus

In view of Table 2, since the gas barrier film B-1 of the invention and the comparative gas barrier film B-5 were excellent in the surface roughness of the substrate film and the creaking value after forming the gas barrier layer was small and excellent, the gas barrier layer was free of defects and showed favorable gas barrier property. In the gas barrier film B-3 of the invention, since the smoothness of the substrate film was somewhat poor, the gas barrier property was obtained although it was somewhat lower. Since the gas barrier film B-4 of the invention had no sliding layer, the creaking Since the gas barrier film B-11 of the invention had Tg of 250° C. or higher, the surface property did not change and the gas barrier property also remained favorable even after conducting high temperature treatment at 250° C. On the contrary, B-15 had low Tg for the substrate film, deformed greatly by the high temperature treatment and also the gas barrier property thereof was worsened.

Example 2

Preparation and Evaluation of Organic EL Device (Preparation of Organic EL Device)

Using the gas barrier films B-1, B-4, and B-11, B-15 described in Table 2 and Table 3, organic EL devices EL-1, EL-4 and EL-11, EL-15 were prepared by the following method.

Each of the gas barrier films was introduced in the vacuum chamber, and a transparent electrode comprising a thin IXO film of 0.2 μm thickness was formed using an IXO target by DC magnetron sputtering. Aluminum lead wires were connected from the transparent electrode (IXO) to form a laminate structure.

After spin coating an aqueous dispersion of polyethylene dioxythiophene polystyrene sulfonic acid (Baytron P, manufactured by BAYER AG: solid content: 1.3 mass %) on the surface of the transparent electrode, it was vacuum-dried at 150° C. for 2 hours to form a hole transporting organic thin film layer of 100 nm thickness. This is referred to as substrate X.

On the other hand, a coating solution for a light emitting organic thin film layer having the following composition was coated on one surface of a provisional support comprising polyether sulfone (Sumilite FS-1300, manufactured by Sumitomo Bakelite Co) of 188 μm thickness by using a spin coater and dried at a room temperature thereby forming a light emitting organic thin film layer of 13 nm thickness on the provisional support. This was referred to as a transfer material Y.

| | |
|---|---|
| Polyvinyl carbazole (Mw = 63000, manufactured by Aldrich): | 40 mass parts |
| Tris(2-phenypyridine)iridium complex (ortho metallized complex): | 1 mass part |
| Dichloroethane: | 3200 mass parts |

The transfer material Y was stacked at the side of the light emitting organic thin film layer on the upper surface of the organic thin film layer of the substrate X and heated and pressed at 160° C. and 0.3 MPa and at 0.05 m/min by using a pair of heat rollers and then the provisional support was peeled, thereby forming a light emitting organic thin film layer on the upper surface of the substrate X. This is referred to as a substrate XY.

Further, a patterned mask for vapor deposition (mask with light emission area of 5 mm×5 mm) was placed on one surface of a polyimide film (UPILEX-50S, manufactured by Ube Kosan Co.) of 50 μm thickness cut into 25 mm square, and Al was vapor deposited in a reduced pressure atmosphere of about 0.1 mPa to form an electrode of 0.3 μm thickness. $Al_2O_3$ was vapor deposited in the same pattern as the Al layer using an $Al_2O_3$ target by a DC magnetron sputtering to a film thickness of 3 nm. Aluminum lead wires were connected from the Al electrode to form a laminate structure. A coating solution for use in an electron transporting organic thin film layer having the following composition was coated on the obtained laminate structure by using a spin coater coating machine and vacuum-dried at 80° C. for 2 hours to form an electron transporting organic thin layer of 15 nm thickness on LiF. This is referred to as substrate Z.

| | |
|---|---|
| Polyvinyl butyral 2000 L (Mw = 2000, manufactured by Denki Kagaku Industry Co): | 10 mass parts |
| Electron transporting compound having the following structure: | 20 mass parts |

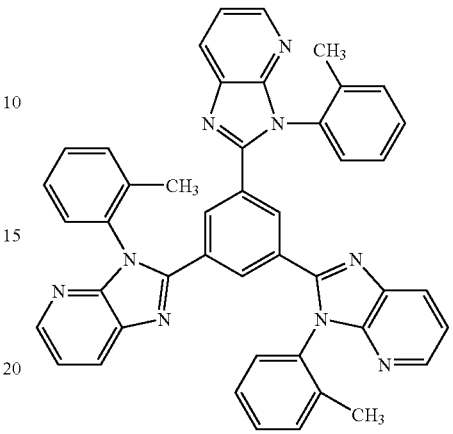

| | |
|---|---|
| 1-butanol: | 3500 mass parts |

The substrate XY and the substrate Z were used and stacked such that electrodes were opposed to each other with the light emitting organic thin film layer being interposed between them and heated and pressed at 160° C., 0.3 MPa, and at 0.05 m/min by using a pair of heat rollers to obtain an organic EL device.

(Evaluation of Organic EL Device)

When a DC current was applied to the thus prepared organic EL devises EL-1, EL-4 and EL-11, EL-15 respectively by using a Source Measure Unit 2400 model (manufactured by Toyo Technical Co) to emit light, each of the devices emitted light favorably.

Then, after preparing the organic EL devices EL-1, EL-4 and EL-11, EL-15, they were left at 25° C. and at 75% relative humidity for one month and were caused to emit light also in the same manner. While each of the organic EL devices EL-1 and EL-11 of the invention emitted favorably, defects increased and no satisfactory emission was observed in organic EL devices EL-2 and EL-15 of the comparative examples.

The gas barrier film of the invention has excellent gas barrier property and also has excellent production adaptability, durability, and heat resistance together. Accordingly, the gas barrier film of the invention can be utilized suitably as image display devices such as for liquid crystal devices, flat panel displays, electroluminescence (EL) devices, fluorescence display tubes, and light emitting diodes. Further, the gas barrier film of the invention can also be used as substrates which can replace the glass substrates for display system for which existent glass substrates have been used. Furthermore, the gas barrier film of the invention can also be utilized for the application use such as solar sells and touch panels. Further, since the image display device, particularly, the organic EL devices of the invention is reduced in the weight and has excellent durability, it can be utilized in various fields.

The present disclosure relates to the subject matter contained in Japanese Patent Application No. 085902/2005 filed on Mar. 24, 2005, which is expressly incorporated herein by reference in its entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier film having at least one barrier layer comprising an inorganic material on a substrate comprising a plastic film, wherein:

the plastic film comprises a multi-layer structure consisting of two layers, wherein the structure is obtained by co-casting film formation or sequential-casting film formation of two layers of polyarylate having a glass transition temperature of 250° C. or higher and having a chemical structure represented by the formula (1):

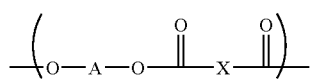

Formula (1)

wherein X represents a linking group having a naphthalene or biphenyl structure represented by the following chemical structure and A represents a linking group represented by the formula (2):

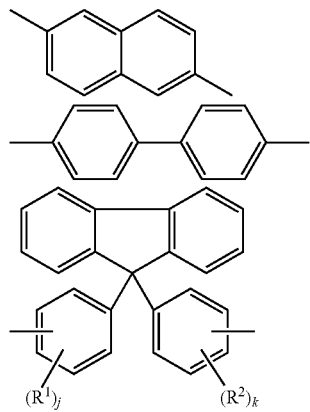

Formula (2)

wherein $R^1$ and $R^2$ each represents independently an alkyl group or aryl group, j and k each represents independently an integer of from 0 to 4, $R^1$ may be identical or different with each other when j is 2 or greater and $R^2$ may be identical or different with each other when k is 2 or greater, wherein a thickness of the plastic film is from 40 to 200 μm.

2. A gas barrier film having at least one barrier layer comprising an inorganic material and at least one organic layer alternately on a substrate comprising a plastic film, wherein:

the plastic film comprises a multi-layer structure consisting of two layers, wherein the structure is obtained by co-casting film formation or sequential-casting film formation of two layers of polyarylate having a glass transition temperature of 250° C. or higher and having a chemical structure represented by he formula (1):

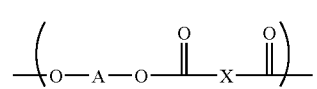

Formula (1)

wherein X represents a linking group having a naphthalene or biphenyl structure represented by the following chemical structure and A represents a linking group represented by the formula (2):

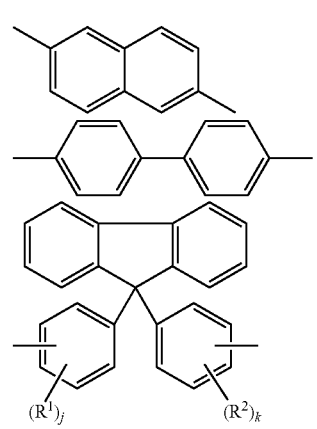

Formula (2)

wherein $R^1$ and $R^2$ each represents independently an alkyl group or aryl group, j and k each represents independently an integer of from 0 to 4, $R^1$ may be identical or different with each other when j is 2 or greater and $R^2$ may be identical or different with each other when k is 2 or greater, wherein a thickness of the plastic film is from 40 to 200 μm.

3. An organic electroluminescence device comprising the gas barrier film according to claim 1 as a substrate.

4. An image display device comprising the gas barrier film according to claim 1.

5. The gas barrier film according to claim 1, wherein a layer constituting at least one of the surfaces of the plastic film is a surface smoothed layer having a thickness of from 1 to 50 μm in which a protrusion with a height of 0.2 μm or more is not present on the surface of the layer.

6. The gas barrier film according to claim 1, wherein a layer constituting at least one of the surfaces of the plastic film is a sliding layer having a thickness of from 1 to 50 μm.

7. An organic electroluminescence device comprising the gas barrier film according to claim 2 as a substrate.

8. An image display device comprising the gas barrier film according to claim 2.

9. The gas barrier film according to claim 2, wherein a layer constituting at least one of the surfaces of the plastic film is a surface smoothed layer having a thickness of from 1 to 50 μm in which a protrusion with a height of 0.2 μm or more is not present on the surface of the layer.

10. The gas barrier film according to claim 2, wherein a layer constituting at least one of the surfaces of the plastic film is a sliding layer having a thickness of from 1 to 50 μm.

11. The gas barrier film according to claim 1, wherein the inorganic material is selected from the group consisting of oxides, nitrides and oxynitrides containing one or more of Si, Al, In, Sn, Zn, Ti, Cu, Ce and Ta.

12. The gas barrier film according to claim 2, wherein the inorganic material is selected from the group consisting of oxides, nitrides and oxynitrides containing one or more of Si, Al, In, Sn, Zn, Ti, Cu, Ce and Ta.

13. The gas barrier film according to claim 11, wherein the inorganic material is selected from the group consisting of silicon oxide, aluminum oxide and silicon nitride.

14. The gas barrier film according to claim 12, wherein the inorganic material is selected from the group consisting of silicon oxide, aluminum oxide and silicon nitride.

15. The gas barrier film according to claim 1, wherein the thickness of the plastic film is from 50 to 150 μm.

16. The gas barrier film according to claim 2, wherein the thickness of the plastic film is from 50 to 150 μm.

* * * * *